United States Patent
Nakagawa et al.

(10) Patent No.: US 9,822,212 B2
(45) Date of Patent: Nov. 21, 2017

(54) POLYISOCYANATE COMPOSITION, SOLAR CELL MEMBER COVERING MATERIAL, SOLAR CELL MEMBER WITH COVER LAYER, MICROCAPSULE, AND BINDER FOR INK

(71) Applicant: MITSUI CHEMICALS, INC., Tokyo (JP)

(72) Inventors: Toshihiko Nakagawa, Ichihara (JP); Takashi Kanno, Ichihara (JP); Satoshi Yamasaki, Chiba (JP); Yoshihiro Matsumoto, Shizuoka (JP); Takashi Uchida, Chiba (JP); Hideaki Ootsuka, Chiba (JP); Shinji Tachibana, Ichihara (JP); Tatsuya Shibata, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 14/416,525

(22) PCT Filed: Jul. 30, 2013

(86) PCT No.: PCT/JP2013/070608
§ 371 (c)(1),
(2) Date: Jan. 22, 2015

(87) PCT Pub. No.: WO2014/021317
PCT Pub. Date: Feb. 6, 2014

(65) Prior Publication Data
US 2015/0183922 A1    Jul. 2, 2015

(30) Foreign Application Priority Data
Jul. 31, 2012  (JP) .................................. 2012-169691

(51) Int. Cl.
*C08G 18/75* (2006.01)
*H01L 31/048* (2014.01)
(Continued)

(52) U.S. Cl.
CPC ....... *C08G 18/757* (2013.01); *C08G 18/3206* (2013.01); *C08G 18/6279* (2013.01);
(Continued)

(58) Field of Classification Search
None
See application file for complete search history.

(56) References Cited

U.S. PATENT DOCUMENTS 3,636,409 A * 1/1972 Stephens, Jr. ........... C23F 13/04
114/221 R
3,730,927 A * 5/1973 Schloss .................. C08G 18/10
521/137
(Continued)

FOREIGN PATENT DOCUMENTS

EP    2204395    7/2010
JP    55-29083   8/1980
(Continued)

OTHER PUBLICATIONS

International Search Report dated Nov. 12, 2013 filed in PCT/JP2013/070608.

*Primary Examiner* — Jeffrey Washville
(74) *Attorney, Agent, or Firm* — Rankin, Hill & Clark LLP

(57) ABSTRACT

A polyisocyanate composition is produced by reaction of bis(isocyanatomethyl) cyclohexane with trimethylolpropane, and contains a trimethylolpropane-monomolecular-body obtained by reaction of three molecules of bis(isocyanatomethyl) cyclohexane with one molecule of trimethylolpropane, and a trimethylolpropane-bimolecular- (Continued)

body obtained by reaction of five molecules of bis(isocyanatomethyl) cyclohexane with two molecules of trimethylolpropane; and the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

7 Claims, 3 Drawing Sheets

(51) Int. Cl.

| | | |
|---|---|---|
| C08L 27/18 | (2006.01) | |
| C09D 175/04 | (2006.01) | |
| C08G 18/62 | (2006.01) | |
| C08G 18/80 | (2006.01) | |
| C09D 11/102 | (2014.01) | |
| H01L 31/049 | (2014.01) | |
| C08G 18/32 | (2006.01) | |
| C08L 33/12 | (2006.01) | |
| C08L 1/28 | (2006.01) | |
| C08L 3/02 | (2006.01) | |

(52) U.S. Cl.
CPC ....... *C08G 18/752* (2013.01); *C08G 18/8025* (2013.01); *C08L 27/18* (2013.01); *C08L 33/12* (2013.01); *C09D 11/102* (2013.01); *C09D 175/04* (2013.01); *H01L 31/049* (2014.12); *H01L 31/0481* (2013.01); *C08L 1/286* (2013.01); *C08L 3/02* (2013.01); *C08L 2203/204* (2013.01); *Y02E 10/50* (2013.01); *Y10T 428/2998* (2015.01)

(56) References Cited

U.S. PATENT DOCUMENTS

| | | |
|---|---|---|
| 4,443,597 A * | 4/1984 | Kamatani ............ C07D 273/00 544/67 |
| 5,140,089 A | 8/1992 | Muhlfeld et al. |
| 5,523,467 A | 6/1996 | Okazaki et al. |
| 2010/0216905 A1* | 8/2010 | Kuwamura ............. B29C 41/18 521/170 |
| 2010/0227985 A1 | 9/2010 | Nishiguchi |
| 2010/0305294 A1 | 12/2010 | Utsumi |
| 2012/0012164 A1 | 1/2012 | Sugiura et al. |
| 2013/0324631 A1 | 12/2013 | Kuwamura |
| 2014/0024797 A1 | 1/2014 | Ootsuki |
| 2014/0290743 A1 | 10/2014 | Ozaki |
| 2014/0318617 A1 | 10/2014 | Nakagawa et al. |
| 2015/0122330 A1 | 5/2015 | Ozaki |
| 2015/0291758 A1 | 10/2015 | Kuwamura |

FOREIGN PATENT DOCUMENTS

| | | |
|---|---|---|
| JP | 7-70273 | 3/1995 |
| JP | 7-309827 | 11/1995 |
| JP | 9-175043 | 7/1997 |
| JP | 9-226254 | 9/1997 |
| JP | 10-45700 | 2/1998 |
| JP | 11-45700 | 2/1999 |
| JP | 11-240936 | 9/1999 |
| JP | 2003-212835 | 7/2003 |
| JP | 2004-244349 | 9/2004 |
| JP | 2010-121011 | 6/2010 |
| JP | 2010-238815 | 10/2010 |
| JP | 2010-265364 | 11/2010 |
| JP | 2010-275470 | 12/2010 |
| JP | 2011-6382 | 1/2011 |
| JP | 2012-41411 | 3/2012 |
| JP | 2012-126760 | 7/2012 |
| KR | 20100083140 A | 7/2010 |
| WO | 2013065851 A1 | 5/2013 |

* cited by examiner

1

POLYISOCYANATE COMPOSITION, SOLAR CELL MEMBER COVERING MATERIAL, SOLAR CELL MEMBER WITH COVER LAYER, MICROCAPSULE, AND BINDER FOR INK

TECHNICAL FIELD

The present invention relates to a polyisocyanate composition, a solar cell member covering material, a solar cell member with a cover layer, a microcapsule, and a binder for ink. In particular, the present invention relates to a polyisocyanate composition; a solar cell member covering material obtained by using the polyisocyanate composition as a curing agent; a solar cell member with a cover layer, wherein various solar cell members are covered with a cover layer formed by using the solar cell member covering material; a microcapsule obtained by using the polyisocyanate composition; and a binder for ink obtained by using the polyisocyanate composition.

BACKGROUND ART

Polyurethane resins are produced usually by reaction between a polyisocyanate component and a polyol component, and are widely used in various industrial fields as, for example, elastomers, lenses, synthetic leather, slush powders, elastic molds (spandex), RIM products, paints, adhesives, sealing materials, and foams.

For example, Patent Document 1 below has proposed a curable composition produced by reaction of a trimethylolpropane adduct of hydrogenated xylylene diisocyanate (hydrogenated XDI) as a polyisocyanate component, and an acrylic polyol.

Such a curable composition is used in various applications including adhesives, paints, and primers for construction, civil engineering, and automobiles.

CITATION LIST

Patent Document

Patent document 1 Japanese Unexamined Patent Publication No. 2012-41411 (Example 4)

SUMMARY OF THE INVENTION

Problem to be Solved by the Invention

In production of such a polyurethane resin, it is desired that the ingredient components are selected so that desired physical properties suitable for the applications are further improved.

An object of the present invention is to provide a polyisocyanate composition that allows for improvement in desired physical properties in various applications; a solar cell member covering material produced by using the polyisocyanate composition as a curing agent; a solar cell member with a cover layer, wherein various solar cell members are covered with a cover layer formed by using the solar cell member covering material; and furthermore, a microcapsule and a binder for ink obtained by using the polyisocyanate composition.

Means for Solving the Problem

A polyisocyanate composition of the present invention is produced by reaction of bis(isocyanatomethyl) cyclohexane with trimethylolpropane,
wherein the polyisocyanate composition contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and
the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

In the polyisocyanate composition of the present invention, it is preferable that the bis(isocyanatomethyl) cyclohexane has a 1,4-bis(isocyanatomethyl) cyclohexane content of 5 mol % or more.

In the polyisocyanate composition of the present invention, it is preferable that the 1,4-bis(isocyanatomethyl) cyclohexane contains 80 mol % or more and 93 mol % or less of trans 1,4-bis(isocyanatomethyl) cyclohexane.

In the polyisocyanate composition of the present invention, it is preferable that the reaction molar ratio of bis(isocyanatomethyl) cyclohexane relative to trimethylolpropane (bis(isocyanatomethyl) cyclohexane/trimethylolpropane) is 4 or more and 23 or less.

In the polyisocyanate composition of the present invention, it is preferable that the average number of the isocyanate groups is 3 or more and 4.5 or less.

It is preferable that the polyisocyanate composition of the present invention is used as a curing agent for a covering material that covers a solar cell member.

A solar cell member covering material of the present invention is a solar cell member covering material that covers a solar cell member,
wherein the solar cell member covering material contains a curing agent containing a polyisocyanate composition and a base resin containing an alcoholic active hydrogen group-containing compound;
the polyisocyanate composition is produced by reaction of bis(isocyanatomethyl) cyclohexane with trimethylolpropane;
the polyisocyanate composition contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and
the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

In the solar cell member covering material of the present invention, it is preferable that the alcoholic active hydrogen group-containing compound is an acrylic polyol produced by copolymerizing a monomer component containing hydroxyl group-containing (meth)acrylate and a copolymerizable vinyl monomer that is copolymerizable with hydroxyl group-containing (meth)acrylate; and the copolymerizable vinyl monomer contains 10 mass % or more and 50 mass % or less of aromatic vinyl relative to the monomer component.

In the solar cell member covering material of the present invention, it is preferable that the monomer component further contains methyl (meth)acrylate and alkyl (meth)acrylate of C2 to C8 alkyl, and 20 muss % or more and 90 mass % or less of the alkyl (meth)acrylate of C2 to C8 alkyl is contained relative to the total amount of the methyl (meth)acrylate and alkyl (meth)acrylate of C2 to C8 alkyl.

A solar cell member with a cover layer of the present invention includes a solar cell member and a cover layer formed from a solar cell member covering material and covers the solar cell member, wherein the solar cell member covering material contains a curing agent containing a polyisocyanate composition, and a base resin containing an alcoholic active hydrogen group-containing compound;

the polyisocyanate composition is produced by reaction of bis(isocyanatomethyl) cyclohexane with trimethylolpropane;

the polyisocyanate composition contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

A microcapsule of the present invention is a microcapsule in which a core material component is encapsulated with a film formed by reaction of a polyisocyanate component with an active hydrogen-containing component, wherein the polyisocyanate component contains a polyisocyanate composition;

the polyisocyanate composition is produced by reaction of bis(isocyanatomethyl) cyclohexane with trimethylolpropane, the polyisocyanate composition contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

A binder for ink of the present invention is prepared from a base resin containing a polyurethane resin having an active hydrogen group, and a curing agent containing a polyisocyanate composition, wherein the polyisocyanate composition is produced by reaction of bis(isocyanatomethyl) cyclohexane with trimethylolpropane, the polyisocyanate composition contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

Effects of the Invention

A polyisocyanate composition of the present invention is produced by reaction of bis(isocyanatomethyl) cyclohexane with trimethylolpropane; contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane; and the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less.

Thus, by using the polyisocyanate composition of the present invention as a polyisocyanate component in synthesis of various resins such as a polyurethane resin, desired physical properties suitable for various applications can be improved.

In the solar cell member covering material and solar cell member with a cover layer of the present invention, the polyisocyanate composition of the present invention is used as a curing agent. When the polyisocyanate composition of the present invention is used as a curing agent, relatively long pot life can be ensured, and a solar cell member covering material having excellent antiblocking properties and adherence can be obtained. Thus, the solar cell member covering material and solar cell member with a cover layer of the present invention have excellent antiblocking properties and adherence.

Furthermore, the microcapsule and binder for ink of the present invention are produced by using the polyisocyanate composition of the present invention, and therefore they have various excellent physical properties.

EMBODIMENT OF THE INVENTION

<Polyisocyanate Composition>

Figure 1:
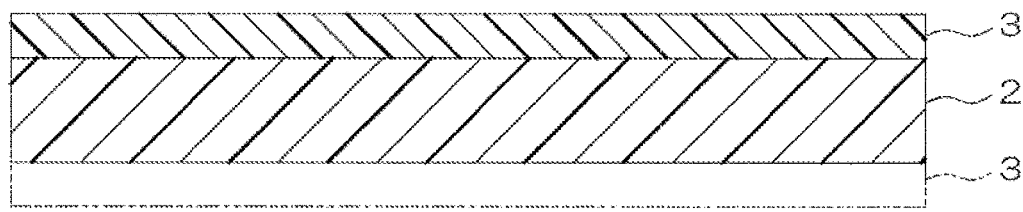
FIG. 1 is a schematic diagram illustrating an embodiment of a solar cell member with a cover layer of the present invention.

A polyisocyanate composition of the present invention is produced by reaction of bis(isocyanatomethyl) cyclohexane with trimethylolpropane.

Bis(isocyanatomethyl) cyclohexane includes structural isomers of 1,4-bis(isocyanatomethyl) cyclohexane and 1,3-bis(isocyanatomethyl) cyclohexane.

Furthermore, 1,4-bis(isocyanatomethyl) cyclohexane includes stereoisomers of cis-1,4-bis(isocyanatomethyl) cyclohexane (hereinafter referred to as cis 1,4-isomer) and trans-1,4-bis(isocyanatomethyl) cyclohexane (hereinafter referred to as trans 1,4-isomer).

Furthermore, 1,3-bis(isocyanatomethyl) cyclohexane includes stereoisomers of cis-1,3-bis(isocyanatomethyl)

cyclohexane (hereinafter referred to as cis 1,3-isomer) and trans-1,3-bis(isocyanatomethyl) cyclohexane (hereinafter referred to as trans 1,3-isomer).

These bis(isocyanatomethyl) cyclohexanes may be used singly or in combination of two or more.

The bis(isocyanatomethyl) cyclohexane preferably contains 1,4-bis(isocyanatomethyl) cyclohexane.

The bis(isocyanatomethyl) cyclohexane contains 1,4-bis (isocyanatomethyl) cyclohexane of, for example, 3 mol % or more, preferably 5 mol % or more, more preferably 10 mol % or more, and for example, 100 mol % or less, preferably 98 mol % or less, more preferably 95 mol % or less. The remaining portion other than 1,4-bis(isocyanatomethyl) cyclohexane is 1,3-bis(isocyanatomethyl) cyclohexane.

When the bis(isocyanatomethyl) cyclohexane contains 1,4-bis(isocyanatomethyl) cyclohexane in the above-described range, various physical properties can be improved.

The 1,4-bis(isocyanatomethyl) cyclohexane preferably contains a trans isomer, that is, a trans 1,4-isomer.

The 1,4-bis(isocyanatomethyl) cyclohexane contains the trans isomer of, for example, 50 mol % or more, preferably 70 mol % or more, more preferably 80 mol % or more, even more preferably 83 mol % or more, and for example, 98 mol % or less, preferably 93 mol % or less, more preferably 90 mol % or less. The remaining portion other than the trans 1,4-isomer is cis 1,4-isomer.

When the 1,4-bis(isocyanatomethyl) cyclohexane contains the trans isomer in the above-described range, various physical properties can be improved.

1,4-bis(isocyanatomethyl) cyclohexane can be produced, for example, by cold/hot two-stage process (direct method) or salt-forming process described in Japanese Unexamined Patent Publication No. 117-309827 or by the non-phosgene method described in Japanese Unexamined Patent Publication No. 2004-244349 and Japanese Unexamined Patent Publication No. 2003-212835, with using the amine produced by the method described in Japanese Unexamined Patent Publication No. 2011-6382.

When 1,3-bis(isocyanatomethyl) cyclohexane is used as the bis(isocyanatomethyl) cyclohexane, the 1,3-bis(isocyanatomethyl) cyclohexane preferably contains trans isomer, that is, trans 1,3-isomer.

The 1,3-bis(isocyanatomethyl) cyclohexane contains the trans isomer of, for example, 5 mol % or more, preferably 10 mol % or more, more preferably 20 mol % or more, and for example, 95 mol % or less, preferably 80 mol % or less, more preferably 60 mol % or less. The remaining portion other than the trans 1,3-isomer is cis 1,3-isomer.

When the 1,3-bis(isocyanatomethyl) cyclohexane contains the trans isomer in the above-described range, various physical properties can be improved.

The bis(isocyanatomethyl) cyclohexane can be prepared as a modified bis(isocyanatomethyl) cyclohexane to an extent that does not hinder the excellent effects of the present invention.

Examples of the modified bis(isocyanatomethyl) cyclohexane include multimers (dimers (e.g., a uretdione-modified product, etc.), trimers (e.g., an isocyanurate-modified product, an iminooxadiazinedione-modified product, etc.), etc.), biuret-modified products (e.g., a biuret-modified product generated by reaction of bis(isocyanatomethyl) cyclohexane with water, etc.), allophanate-modified products (e.g., an allophanate-modified product generated by reaction of bis(isocyanatomethyl) cyclohexane with monol or a low-molecular-weight polyol (described later), etc.), polyol modified products (e.g., a polyol modified product generated by reaction of bis(isocyanatomethyl) cyclohexane with a low-molecular-weight polyol (described later) or a high-molecular weight polyol (described later), etc.), oxadiazinetrione-modified products (e.g., an oxadiazinetrione generated by reaction of bis(isocyanatomethyl) cyclohexane with carbon dioxide, etc.), and carbodiimide-modified products (a carbodiimide-modified product generated by decarboxylation condensation reaction of bis(isocyanatomethyl) cyclohexane, etc.) of bis(isocyanatomethyl) cyclohexane.

The trimethylolpropane is a trihydric alcohol also called 2-(hydroxymethyl)-2-ethyl-1,3-propanediol, and commercially available products thereof can be obtained.

The polyisocyanate composition of the present invention contains a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane.

The trimethylolpropane-monomolecular-body is a trifunctional compound having three free isocyanate groups, each of the three hydroxy groups in one trimethylolpropane being bonded (urethane bond) to bis(isocyanatomethyl) cyclohexane.

The trimethylolpropane-bimolecular-body is a quadfunctional compound having four free isocyanate groups: in two trimethylolpropanes, two of the three hydroxy groups of each of the trimethylolpropane are bonded (urethane bond) to two bis(isocyanatomethyl) cyclohexanes having free isocyanate groups; and the remaining one hydroxy group of the each of the trimethylolpropane is bonded (urethane bond) to each other through one bis(isocyanatomethyl) cyclohexane.

That is, in reaction of bis(isocyanatomethyl) cyclohexane with trimethylolpropane, by adjusting their reaction molar ratio, and reaction conditions, the polyisocyanate composition containing the trimethylolpropane-monomolecular-body and trimethylolpropane-bimolecular-body can be obtained.

The equivalent ratio (NCO/OH) of the isocyanate group (NCO) in the bis(isocyanatomethyl) cyclohexane relative to the hydroxy group (OH) in trimethylolpropane in this reaction is, for example, 2.5 or more, preferably 2.7 or more, more preferably 2.9 or more, and for example, 16.7 or less, preferably 15.3 or less, more preferably 14 or less.

The reaction molar ratio of bis(isocyanatomethyl) cyclohexane relative to trimethylolpropane (bis(isocyanatomethyl) cyclohexane/trimethylolpropane) in this reaction is, for example, 3.7 or more, preferably 4 or more, more preferably 4.3 or more, and for example, 25 or less, preferably, 23 or less, more preferably 21 or less.

When the reaction molar ratio of bis(isocyanatomethyl) cyclohexane relative to trimethylolpropane is in the above-described range, various physical properties can be improved.

Furthermore, in this reaction, bis(isocyanatomethyl) cyclohexane and trimethylolpropane can be introduced at once, or bis(isocyanatomethyl) cyclohexane and/or trimethylolpropane can be allowed to react dividedly. Preferably, trimethylolpropane is allowed to react dividedly.

To be specific, for example, first, a portion of trimethylolpropane is introduced into the reaction vessel, and bis (isocyanatomethyl) cyclohexane is added thereto: after the trimethylolpropane and bis(isocyanatomethyl) cyclohexane are allowed to react, the remaining portion of the trimethylolpropane is further added for reaction.

In this method, the above-described components are allowed to react at a reaction temperature of, for example, 60° C. or more, preferably 70° C. or more, and for example, 110° C. or less, preferably 90° C. or less, until reaching a predetermined isocyanate group concentration.

Furthermore, in this method, the above-described components are allowed to react, as necessary, in the presence of an organic solvent by blending the organic solvent thereto.

Examples of organic solvents include ketones such as acetone, methyl ethyl ketone, methylisobutylketone, and cyclohexanone; nitriles such as acetonitrile; alkyl esters such as methyl acetate, ethyl acetate, butyl acetate, and isobutyl acetate; aliphatic hydrocarbons such as n-hexane, n-heptane, and octane; alicyclic hydrocarbons such as cyclohexane and methylcyclohexane; aromatic hydrocarbons such as toluene, xylene, and ethylbenzene; glycol ether esters such as methyl cellosolve acetate, ethyl cellosolve acetate, methyl carbitol acetate, ethyl carbitol acetate, ethylene glycol ethylether acetate, propylene glycol methylether acetate, 3-methyl-3-methoxybutyl acetate, and ethyl-3-ethoxypropionate; ethers such as diethylether, tetrahydrofuran, and dioxane; halogenated aliphatic hydrocarbons such as methyl chloride, methylene chloride, chloroform, carbon tetrachloride, methyl bromide, methylene iodide, and dichloroethane; polar aprotic solvents such as N-methyl pyrrolidone, dimethylformamide, N,N'-dimethylacetamide, dimethyl sulfoxide, and hexamethyl phosphoramide.

These organic solvents may be used singly or in combination of two or more.

The mixing ratio of the organic solvent is suitably set in accordance with purpose and use.

In this method, as necessary, unreacted bis(isocyanatomethyl) cyclohexane can be removed after the above-described reaction. The unreacted bis(isocyanatomethyl) cyclohexane can be removed, for example, by distillation such as thin film distillation, or by extraction such as liquid-liquid extraction. In view of removing bis(isocyanatomethyl) cyclohexane efficiently, preferably, thin film distillation is used.

In thin film distillation, for example, a polyisocyanate composition having unreacted bis(isocyanatomethyl) cyclohexane mixed therein is distilled with a known thin film distillation device under a degree of vacuum (degree of decompression) of 20 to 200 Pa and a temperature of 100 to 200° C.

In liquid-liquid extraction, a polyisocyanate composition having unreacted bis(isocyanatomethyl) cyclohexane mixed therein is allowed to make contact with a known extractant. In this fashion, unreacted polyisocyanate in the polyisocyanate composition is separated.

As necessary, the obtained polyisocyanate composition can be diluted with an organic solvent.

Examples of the organic solvent include the above-described organic solvents, and preferably alkyl esters are used.

In such a case, the solid content concentration of the polyisocyanate composition is, for example, 50 mass % or more, preferably 70 mass % or more, and for example, below 100 mass %, preferably, 90 mass % or less.

The thus obtained polyisocyanate composition contains, as described above, the trimethylolpropane-monomolecular-body and trimethylolpropane-bimolecular-body.

In the polyisocyanate composition, molar ratio of trimethylolpropane-monomolecular-body relative to trimethylolpropane-bimolecular-body (trimethylolpropane-monomolecular-body/trimethylolpropane-bimolecular-body) contained is, for example, 1.4 or more, preferably 1.5 or more, more preferably 1.7 or more, and for example, 4.7 or less, preferably 4.5 or less, more preferably 4.3 or less.

When the molar ratio of trimethylolpropane-monomolecular-body relative to trimethylolpropane-bimolecular-body is in the above-described range, various physical properties can be improved.

In contrast, when the molar ratio of trimethylolpropane-monomolecular-body relative to trimethylolpropane-bimolecular-body is below the above-described lower limit, various physical properties may be poor.

Meanwhile, when the molar ratio of trimethylolpropane-monomolecular-body relative to trimethylolpropane-bimolecular-body is more than the above-described upper limit, various physical properties may be poor.

The molar ratio of trimethylolpropane-monomolecular-body relative to trimethylolpropane-bimolecular-body (trimethylolpropane-monomolecular-body/trimethylolpropane-bimolecular-boly) in the polyisocyanate composition can be determined by gel permeation chromatography.

To be specific, a gel permeation chromatogram is obtained with the device and conditions in Examples to be described later; a peak (in other words, the highest peak in the chromatogram) for the molecular weight (polyethylene oxide standard calibration) of 450 to 800 in the chromatogram is assigned as the peak of trimethylolpropane-monomolecular-body; and a peak for the molecular weight (polyethylene oxide standard calibration) of 950 to 1500 (in other words, the second highest peak in the chromatogram) is assigned as the peak of trimethylolpropane-bimolecular-body. Then, the peak area of each of the peaks is determined, and the ratio of the peak area of trimethylolpropane-monomolecular-body relative to the peak area of trimethylolpropane-bimolecular-body is calculated. The result of the calculation is provided as the molar ratio of trimethylolpropane-monomolecular-body relative to trimethylolpropane-bimolecular-body contained.

The polyisocyanate composition may contain multimolecular trimethylolpropane obtained by reaction of three molecules or more of trimethylolpropane with bis(isocyanatomethyl) cyclohexane, other than the trimethylolpropane-monomolecular-body and trimethylolpropane-bimolecular-body. In this case, the peak of multimolecular trimethylolpropane is observed at a high molecular weight side than the trimethylolpropane-bimolecular-body in the above-described chromatogram.

Figure 3:
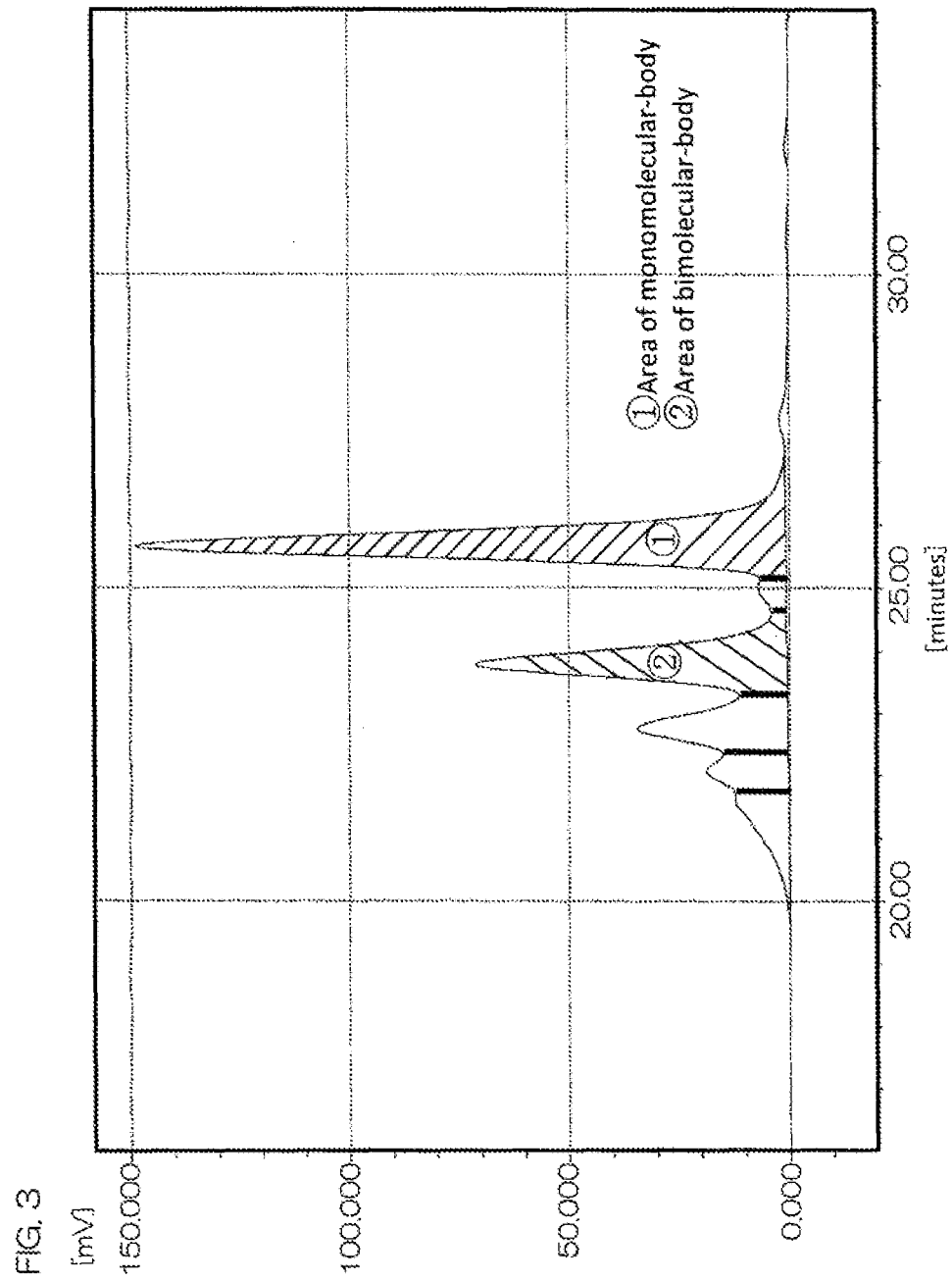
FIG. 3 is an example of gel permeation chromatogram of a polyisocyanate composition.

FIG. 3 shows an example of gel permeation chromatogram of a polyisocyanate composition (chromatogram of the polyisocyanate composition of Example 1 to be described later).

The polyisocyanate composition has an average number of the isocyanate groups of, for example, 3.0 or more, preferably 3.2 or more, more preferably 3.3 or more, and for example, 4.6 or less, preferably 4.5 or less, more preferably 4.0 or less.

When the average number of the isocyanate groups of the polyisocyanate composition is in the above-described range, various physical properties can be improved.

The average number of the isocyanate groups of the polyisocyanate composition can be calculated by the formula below based on the values of the area in the gel permeation chromatography, the theoretical molecular weight, and the number of the isocyanate groups.

Average number of isocyanate groups = [Chemical Formula 1]

$$\sum_{k=1}^{n}(A/B \times C) \Big/ \sum_{k=1}^{n}(A/B)$$

(where A represents the value of the area at Kth peak, B represents theoretical molecular weight of the compound corresponding to Kth peak, and C represents the number of isocyanate groups for the compound corresponding to Kth peak. Furthermore, k represents an ordinal number for the peak counted from the low-molecular-weight side, and n represents an ordinal number of the peak at the most high-molecular weight side observed in the gel permeation chromatograph.) The polyisocyanate composition has an isocyanate group concentration of, for example, 9.5 mass % or more, preferably 10.0 mass % or more, and for example, 12.8 mass % or less, preferably 12.5 mass % or less, when the solid content concentration is, for example, 75 mass %.

When the polyisocyanate composition has an isocyanate group concentration in the above-described range, various physical properties can be improved.

The isocyanate group concentration of the polyisocyanate composition can be measured, for example, by the n-dibutylamine method in conformity with JIS K-1556 (2006).

The polyisocyanate composition has a viscosity at 25° C. (measurement device: E-type viscometer TV-30 manufactured by TOKI Sangyo Co., Ltd., rotor: 1° 34'×R24, rotation speed: selected from the range of 0.1 to 10 rpm so that the measurement range is 20 to 80%) of, for example, 700 mPa·s or more, preferably 900 mPa·s or more, and for example, 5000 mPa·s or less, preferably 4800 mPa·s or less.

When the viscosity of the polyisocyanate composition is in the above-described range, various physical properties can be improved.

By using the polyisocyanate composition of the present invention as an ingredient component of polyurethane resins or polyurea resins, desired physical properties suitable for various applications can be improved.

The polyurethane resin and polyurea resin obtained by using the polyisocyanate composition of the present invention as an ingredient component can be used in a wide range of applications including, for example, covering materials (e.g., solar cell member covering material, etc.), microcapsules, binders, and furthermore, elastomers (solvent-based resin, aqueous resin, powders, thermosetting elastomers, thermoplastic elastomers, spray molding resin, elastic fiber, films, sheets, etc.), lens (eyeglass lens), artificial and synthetic leather, slush powder, elastic molds (spandex), RIM products, paints, adhesives, sealing materials, and foams.

In the following, various applications are described in detail.

<Solar Cell Member Covering Material>

Recently, solar cells are gaining attention as clean power generating devices that can convert sunlight energy to electric energy. Solar cells are sealed with, for example, a sealing layer, and are used as a solar cell module (hereinafter, simply referred to as solar cell).

Such solar cells generally include, to be specific, a back sheet that protects the back side, a support layer laminated on the back sheet, solar cells that are supported on the support layer, a sealing layer that seals in the solar cells on the support layer, and a glass plate disposed on the sealing layer.

For the back sheet of the solar cells, weather resistance for using the solar cell at outdoors for a long period of time and moisture resistance for protection of electric circuit of solar cells are required, and therefore covering the back sheet with a cover layer having excellent weather resistance and moisture resistance has been proposed.

As a back sheet of a solar cell, to be specific, Japanese Unexamined Patent Publication No. 2010-238815 (Example 1) has proposed a solar cell module protection sheet including, for example, a base sheet, and an acrylic urethane resin layer provided on one side or both sides of the base sheet; and also has proposed that such an acrylic urethane resin layer is formed from acrylic polyol (base resin) and isocyanurate of hexamethylenediisocyanate (cross-linking agent).

However, the above-described solar cell module protection sheet is disadvantageous in that pot life is short when acrylic polyol (base resin) and isocyanurate of hexamethylenediisocyanate (cross-linking agent) are mixed, and workability at the time of production is poor.

Furthermore, in the above-described solar cell module protection sheet, blocking may be caused when the sheets are piled up and stored, or the acrylic urethane resin layer may be peeled off from the base sheet.

In contrast, when the polyisocyanate composition of the present invention is used as the curing agent, relatively long pot life can be ensured, and furthermore, a solar cell member covering material having excellent antiblocking properties and adherence can be obtained.

To be more specific, the solar cell member covering material can be prepared as a two-component coating composition containing a curing agent containing the above-described polyisocyanate composition, and a base resin containing an alcoholic active hydrogen group-containing compound.

Preferably, the curing agent consists of the above-described polyisocyanate composition.

The curing agent may contain other polyisocyanates (polyisocyanate excluding the above-described polyisocyanate composition) to the extent that does not hinder excellent effects of the present invention.

Examples of other polyisocyanates include polyisocyanates monomer and polyisocyanate derivatives.

Examples of the polyisocyanate monomer include polyisocyanates such as aromatic polyisocyanates, aralkyl polyisocyanates, and aliphatic polyisocyanates.

Examples of aromatic polyisocyanates include aromatic diisocyanates such as tolylene diisocyanate (2,4- or 2,6-tolylene diisocyanate or a mixture thereof) (TDI), phenylenediisocyanate (m-, p-phenylenediisocyanate or a mixture thereof), 4,4'-diphenyl diisocyanate, 1,5-naphthalene diisocyanate (NDI), diphenylmethanediisocyanate (4,4'-, 2,4'- or 2,2'-diphenylmethanediisocyanate or a mixture thereof) (MDI), 4,4'-toluidine diisocyanate (TODI), and 4,4'-diphenylether diisocyanate.

Examples of the aralkyl polyisocyanate include aralkyl diisocyanates such as xylylene diisocyanate (1,3- or 1,4-xylylene diisocyanate or a mixture thereof) (XDI), tetramethylxylylene diisocyanate (1,3- or 1,4-tetramethylxylylene diisocyanate or a mixture thereof) (TMXDI), and ω,ω'-diisocyanate-1,4-diethylbenzene.

Examples of the aliphatic polyisocyanate include aliphatic diisocyanates such as trimethylene diisocyanate, 1,2-propylene diisocyanate, butylene diisocyanates (tetramethylene diisocyanate, 1,2-butylene diisocyanate, 2,3-butylene diisocyanate, 1,3-butylene diisocyanate), 1,5-pentamethylene diisocyanate (PDI), 1,6-hexamethylene diisocyanate (HDI), 2,4,4- or 2,2,4-trimethylhexamethylene diisocyanate, and 2,6-diisocyanatemethylcaproate.

Aliphatic polyisocyanates include alicyclic polyisocyanates. Examples of alicyclic polyisocyanate include alicyclic diisocyanates such as 1,3-cyclopentene diisocyanate, 1,3-cyclopentene diisocyanate, cyclohexanediisocyanate (1,4-cyclohexanediisocyanate, 1,3-cyclohexanediisocyanate), 3-isocyanatomethyl-3,5,5-trimethylcyclohexyl isocyanate (isophorone diisocyanate) (IPDI), methylenebis(cyclohexyl isocyanate)(4,4'-, 2,4'- or 2,2'-methylenebis(cyclohexyl isocyanate, their trans-trans-product, their trans-cis-product, their Cis-Cis-product, or a mixture thereof)) ($H_{12}$MDI), methylcyclohexanediisocyanate (methyl-2,4 cyclohexanediisocyanate, methyl-2,6-(cyclohexanediisocyanate), norbornanediisocyanate (various isomers or a mixture thereof) (NBDI), and bis(isocyanatomethyl) cyclohexane (1,3- or 1,4-bis(isocyanatomethyl) cyclohexane or a mixture thereof)($H_6$XDI).

These polyisocyanate monomers may be used singly or in combination of two or more.

Examples of the polyisocyanate derivative include a multimer (e.g., dimer, trimer (e.g., isocyanurate-modified product, iminooxadiazinedione-modified product), pentamer, septamer, etc.), an allophanate-modified product (e.g., allophanate-modified product generated by reaction of the above-described polyisocyanate monomer with a low-molecular-weight polyol to be described later, etc.), a polyol modified product (e.g., polyol modified product generated by reaction of the polyisocyanate monomer with a low-molecular-weight polyol to be described later (alcohol adduct) (excluding the above-described polyisocyanate composition)), a biuret-modified product (e.g., biuret-modified product generated by reaction of the above-described polyisocyanate monomer with water or amines, etc.), a urea-modified product (e.g., urea-modified product generated by reaction of the above-described polyisocyanate monomer with diamine, etc.), an oxadiazinetrione-modified product (e.g., oxadiazinetrione generated by reaction of the above-described polyisocyanate monomer with carbon dioxide, etc.), a carbodiimide-modified product (carbodiimide-modified product generated by decarboxylation condensation reaction of the above-described polyisocyanate monomer, etc.), a urethodione-modified product, and a uretonimine-modified product of the above-described polyisocyanate monomer.

Furthermore, as the polyisocyanate derivative, polymethylene polyphenyl polyisocyanates (crude MDI, polymeric MDI) are also used.

These polyisocyanate derivatives may be used singly or in combination of two or more.

When other polyisocyanates are contained in the curing agent, the other polyisocyanates are contained by more than 0 mass %, and for example, 50 mass % or less, preferably 30 mass % or less.

The alcoholic active hydrogen group-containing compound is a compound having an alcoholic active hydrogen group in its molecule.

The alcoholic active hydrogen group includes an alcoholic hydroxy group (OH group), and a thioalcoholic mercapto group (SH group).

Examples of the compound containing an alcoholic hydroxy group include polyol, and examples of the compound containing a thioalcoholic mercapto group include polythiol.

Examples of the polyol include a low-molecular-weight polyol and a high-molecular weight polyol.

The low-molecular-weight polyol is a compound having two or more hydroxyl groups and having a number average molecular weight of below 300, preferably below 400; and examples thereof include dihydric alcohols such as ethylene glycol, propylene glycol, 1,3-propanediol, 1,4-butyleneglycol, 1,3-butyleneglycol, 1,2-butyleneglycol, 1,5-pentanediol, 1,6-hexanediol, neopentyl glycol, 3-methyl-1,5-pentanediol, 2,2,2-trimethylpentanediol, 3,3-dimethylolheptane, alkane (C7 to 20) diol, 1,3- or 1,4-cyclohexanedimethanol and a mixture thereof, 1,3- or 1,4-cyclohexanediol and a mixture thereof, hydrogenated bisphenol A, 1,4-dihydroxy-2-butene, 2,6-dimethyl-1-octene-3,8-diol, bisphenol A, diethylene glycol, triethylene glycol, and dipropylene glycol; trihydric alcohols such as glycerin, trimethylolpropane, and triisopropanolamine; tetrahydric alcohols such as tetramethylolmethane (pentaerythritol), and diglycerin; pentahydric alcohols such as xylitol; hexahydric alcohols such as sorbitol, mannitol, allitol, iditol, dulcitol, altritol, inositol, and dipentaerythritol; heptahydric alcohols such as perseitol; and octahydric alcohols such as sucrose.

Examples of the low-molecular-weight polyol include tertiary amino group-containing diol such as N-methyldiethanolamine.

These low-molecular-weight polyols may be used singly or in combination of two or more.

The high-molecular weight polyol is a compound having two or more hydroxyl groups and having a number average molecular weight of 300 or more, preferably 400 or more, even more preferably 500 or more; and examples thereof include polyether polyol, polyester polyol, polycarbonate polyol, polyurethane polyol, epoxy polyol, vegetable oil polyol, polyolefin polyol, acrylic polyol, silicone polyol, fluorine polyol, and vinyl monomer-modified polyol.

Examples of the polyether polyol include polyoxyalkylene polyol and polytetramethylene ether polyol.

The polyoxyalkylene polyol is an addition polymer of alkylene oxide obtained by using, for example, the above-described low molecular weight polyol, aromatic polyamine, or aliphatic polyamine as an initiator.

Examples of the alkylene oxide include propylene oxide, ethylene oxide, butylene oxide, and styrene oxide. These alkylene oxides may be used singly or in combination of two or more. Of these examples, preferably, propylene oxide and ethylene oxide are used. The polyoxyalkylene polyol include a random and/or block copolymer of alkylene oxide such as, for example, propylene oxide and ethylene oxide.

Examples of the polytetramethylene ether polyol include a ring-opening polymerization product obtained by cationic polymerization of tetrahydrofuran, and amorphous (noncrystalline) polytetramethylene ether glycol obtained by copolymerizing alkylated tetrahydrofuran or the above-mentioned dihydric alcohol with a polymerization unit of tetrahydrofuran.

The amorphous (noncrystalline) means that it is liquid under normal temperature (25° C.).

The amorphous polytetramethylene ether glycol can be obtained as, for example, a copolymer of tetrahydrofuran and alkylated tetrahydrofuran (e.g., 3-methyltetrahydrofuran, etc.) (tetrahydrofuran/alkylated tetrahydrofuran (molar ratio)=15/85 to 85/15, number average molecular weight 500 to 4000, preferably 800 to 2500), and a copolymer of tetrahydrofuran and branched glycol (e.g., neopentyl glycol, etc.) (tetrahydrofuran/branched glycol (molar ratio) 15/85 to 85/15, number average molecular weight 500 to 4000, preferably 800 to 2500).

Examples of the polyester polyol include a polycondensation product obtained by allowing the above-described low-molecular-weight polyol and polybasic acid to react under known conditions.

Examples of the polybasic acid include oxalic acid, malonic acid, succinic acid, methylsuccinic acid, glutaric acid, adipic acid, 1,1-dimethyl-1,3-dicarboxypropane, 3-methyl-3-ethylglutaric acid, azelaic acid, sebacic acid, and other saturated aliphatic dicarboxylic acids (C 11 to 13); maleic acid, fumaric acid, itaconic acid, and other unsaturated aliphatic dicarboxylic acids; orthophthalic acid, isophthalic acid, terephthalic acid, toluenedicarboxylic acid, naphthalenedicarboxylic acid, and other aromatic dicarboxylic acids; hexahydrophthalic acid and other alicyclic dicarboxylic acids; dimer acid, hydrogenated dimer acid, het acid, and other carboxylic acids, and acid anhydrides derived from these carboxylic acids such as oxalic anhydride, succinic anhydride, maleic anhydride, phthalic anhydride, 2-alkyl (C 12 to C 18) succinic anhydride, tetrahydrophthalic anhydride, trimellitic anhydride, and hallides derived from carboxylic acids thereof such as oxalyl dichloride, adipoyl dichloride, and sebacoyl dichloride.

Examples of the polyester polyol include plant derived polyester polyols, to be specific, vegetable oil polyester polyols obtained by condensation reaction of hydroxycarboxylic acid such as hydroxyl group-containing vegetable oil fatty acid (e.g., castor oil fatty acid containing ricinoleic acid, hydrogenated castor oil fatty acid containing 12-hydroxystearic acid, etc.) using the above-described low-molecular-weight polyol as an initiator under known conditions.

Examples of the polyester polyol include polycaprolactone polyol, and polyvalerolactone polyol obtained by ring-opening polymerization of lactones such as ε-caprolactone, γ-valerolactone, etc. or lactides such as L-lactide, D-lactide using the above-described low-molecular-weight polyols (preferably, dihydric alcohol) as an initiator, and further lactone-based polyester polyols obtained by copolymerizing such a polycaprolactone polyol or polyvalerolactone polyol with the above-described dihydric alcohol.

Examples of the polycarbonate polyol include ring-opening polymerization product of ethylene carbonate using the above-described low-molecular-weight polyols (preferably, dihydric alcohol) as an initiator, and amorphous polycarbonate polyols obtained by copolymerization of dihydric alcohols such as 1,4-butanediol, 1,5-pentanediol, 3-methyl-1,5-pentanediol, and 1,6-hexanediol with ring-opening polymerization product.

Polyurethane polyols can be obtained as polyester polyurethane polyol, polyether polyurethane polyol, polycarbonate polyurethane polyol, or polyester polyether polyurethane polyol, by allowing polyester polyol, polyetherpolyol and/or polycarbonate polyol obtained as described above to react with polyisocyanate at an equivalent ratio (OH/NCO) of hydroxyl group (OH) to isocyanate group (NCO) of more than 1.

Examples of the epoxy polyol include epoxy polyols obtained by reaction of the above-described low-molecular-weight polyols with polyfunctional halohydrin such as epichlorohydrin, β-methylepichlorohydrin, etc.

Examples of vegetable oil polyols include hydroxyl group-containing vegetable oils such as castor oil, palm oil, etc. Examples thereof include ester-modified castor oil polyol obtained by reaction of castor oil polyol or castor oil fatty acid with polypropylene polyol.

Examples of polyolefin polyols include polybutadiene polyol, and a partially saponified ethylene-vinyl acetate copolymer.

Examples of the acrylic polyol (acrylic polyol containing no fluorine atoms) include a copolymer obtained by copolymerizing a monomer component containing hydroxyl group-containing acrylate, and a copolymerizable vinyl monomer that is copolymerizable with hydroxyl group-containing acrylate.

Examples of the hydroxyl group-containing acrylate include 2-hydroxyethyl (meth)acrylate, hydroxypropyl (meth)acrylate, hydroxybutyl (meth)acrylate, 2,2-dihydroxymethylbutyl (meth)acrylate, polyhydroxyalkylmaleate, and polyhydroxyalkylfumarate. Preferably, 2-hydroxyethyl (meth)acrylate is used.

Examples of the copolymerizable vinyl monomer include alkyl (meth)acrylate containing an alkyl group with 1 to 12 carbon atoms (alkyl (meth)acrylate having 1 to 12 carbon atoms) such as methyl (meth)acrylate, ethyl (meth)acrylate, propyl (meth)acrylate, isopropyl (meth)acrylate, butyl (meth)acrylate, isobutyl (meth)acrylate, s-butyl (meth)acrylate, t-butyl (meth)acrylate, pentyl (meth)acrylate, isopentyl (meth)acrylate, hexyl (meth)acrylate, isononyl (meth)acrylate, 2-ethylhexyl (meth)acrylate, and cyclohexylacrylate; carboxylic acid vinyl esters such as vinyl acetate, vinyl propionate, vinyl butyrate, vinyl isobutyrate, vinyl pivalate, vinyl caproate, vinyl versatate, vinyl laurate, vinyl stearate, vinyl cyclohexyl carboxylate, vinyl benzoate, and para-t-butylbenzoic acid vinyl; alkylvinylethers such as methylvinyl ether, ethylvinyl ether, butylvinyl ether, and cyclohexylvinyl ether; non-fluorine olefins such as ethylene, propylene, n-butene, and isobutene; aromatic vinyls such as styrene, vinyltoluene, and α-methylstyrene; vinyl cyanides such as (meth)acrylonitrile; unsaturated carboxylic acids such as (meth)acrylic acid, fumaric acid, maleic acid, itaconic acid, vinylacetic acid, crotonic acid, cinnamic acid, 3-allyloxypropionic acid, itaconic acid monoester, maleic acid monoester, maleic acid anhydride, fumaric acid monoester, vinyl phthalate, and pyromellitic acid vinyl ester; vinyl monomers containing a carboxyl group such as 3-(2-aryloxyethoxycarbonyl) propionic acid, 3-(2-aryloxybutoxycarbonyl) propionic acid, 3-(2-vinyloxyethoxycarbonyl) propionic acid, and 3-(2-vinyloxybutoxycarbonyl) propionic acid or their alkylesters; alkanepolyol poly (meth) acrylate such as ethylene glycol di(meth)acrylate, butyleneglycol di(meth)acrylate, hexanediol di(meth)acrylate, oligoethylene glycol di(meth)acrylate, trimethylolpropane di(meth)acrylate, and trimethylolpropane tri(meth)acrylate; vinyl monomers containing an isocyanate group such as 3-(2-isocyanate-2-propyl)-α-methylstyrene; nitrogen-containing vinyl monomers such as pentamethylpiperidyl (meth)acrylate and 2-[2'-hydroxy-5'-(methacryloyloxyethyl) phenyl]-2H-benzotriazole; aminovinyl ethers such as $CH_2=CH-O-(CH_2)_x-NH_2$ (x=0 to 10); allylamines such as $CH_2=CH-O-CO(CH_2)_x-NH_2$ (x=1 to 10); amino group-containing vinyl monomers such as aminomethylstyrene, vinylamine, acrylamide, vinylacetamide, and vinylformamide; silicone vinyl monomers of (meth)acrylates such as $CH_2=CHCO_2(CH_2)_3Si(OCH_3)_3$, $CH_2=CHCO_2((CH_2)_3Si(OC_2H_5)_3$, $CH_2=C(CH_3)CO_2(CH_2)_3Si(OCH_3)_3$, $CH_2=C(CH_3)CO_2(CH_2)-Si(OC_2H_5)_3$, $CH_2=CHCO_2(CH_2)_3SiCH_3(OC_2H_5)_2$, $CH_2=C(CH_3)CO_2(CH_2)_3SiC_2H_5(OCH_3)_2$, $CH_2=C(CH_3)CO_2(CH_2)_3Si(CH_3)_2(OC_2H_5)$, $CH_2=C(CH_3)CO_2(CH_2)_3Si(CH_3)_2OH$, $CH_2=CH(CH_2)_3Si(OCOCH_3)_3$, $CH_2=C(CH_3)CO_2(CH_2)_3SiC_2H_5(OCOCH_3)_2$, $CH_2=C(CH_3)CO_2(CH_2)_3SiCH_3(N(CH_3)COCH_3)_2$, $CH_2=CHCO_2(CH_2)_3SiCH_3[ON(CH_3)C_2H_5]_2$, and $CH_2=C(CH_3)CO_2(CH_2)_3SiC_6H_5[ON(CH_3)C_2H_5]_2$; silicone vinyl monomers of vinylsilanes such as $CH_2=CHSi[ON=C(CH_3)(C_2H_5)]_3$, $CH_2=CHSi(OCH_3)_3$, $CH_2=CHSi(OC_2H_5)_3$, $CH_2=CHSiCH_3(OCH_3)_2$, $CH_2=CHSi(OCOCH_3)_3$, $CH_2=CHSi(CH_3)_2(OC_2H_5)$, $CH_2=CHSi(CH_3)_2SiCH_3((OCH_3)_2$, $CH_2=CHSiC_2H_5(OCOCH_3)_3$, $CH_2=CHSiCH_3[ON(CH_3)C_2H_5]_2$, vinyltrichlorosilane, or their partial hydrolysis products; and silicone vinyl monomers of vinyl ethers such us trimethoxysilylethylvinyl ether, triethoxysilylethylvinyl ether, trimethoxysilylbutylvinyl ether, methyldimethoxysilylethylvinyl ether, trimethoxysilylpropylvinyl ether, and triethoxysilylpropylvinyl ether.

Examples of the copolymerizable vinyl monomer also include a hydroxyl group-containing vinyl monomer.

Examples of the hydroxyl group-containing vinyl monomer include hydroxyl group-containing vinyl ethers such as 2-hydroxyethylvinyl ether, 3-hydroxypropylvinyl ether, 2-hydroxypropylvinyl ether, 2-hydroxy-2-methylpropylvinyl ether, 4-hydroxybutylvinyl ether, 4-hydroxy-2-methylbutyl vinyl ether, 5-hydroxypentylvinyl ether, and 6-hydroxyhexylvinyl ether; and hydroxyl group allyl ether such as 2-hydroxyethylallylether, 4-hydroxybutylallylether, and glycerol monoallylether.

Examples of the copolymerizable vinyl monomer also include a copolymerizable vinyl monomer containing a glycidyl group.

Examples of the copolymerizable vinyl monomer containing a glycidyl group include glycidylacrylate, glycidylmethaacrylate, 4-hydroxybutylacrylateglycidylether, and allylglycidylether.

These copolymerizable vinyl monomers may be used singly or in combination of two or more.

For the copolymerizable vinyl monomer, preferably, aromatic vinyl is used, and more preferably, styrene is used.

When the copolymerizable vinyl monomer contains aromatic vinyl (preferably, styrene), the aromatic vinyl content relative to the total amount of the monomer component is, for example, 10 mass % or more, preferably 15 mass % or more, and for example, 50 mass % or less, preferably 40 mass % or less.

When the aromatic vinyl content is in the above-described range, weather resistance and adherence can be improved, and for example, even after weather resistance test, adherence between the cover layer (described later) composed of the solar cell member covering material and the solar cell member (described later) can be kept excellently, and furthermore, the cover layer has excellent resistance to discoloration.

The monomer component preferably further contains, in addition to the above-described aromatic vinyl, alkyl (meth)acrylate of C1 to C12 alkyl, more preferably, alkyl (meth)acrylate of C1 to C8 alkyl, even more preferably, methyl (meth)acrylate and alkyl (meth)acrylate of C2 to C8 alkyl.

When both of the methyl (meth)acrylate and alkyl (meth)acrylate of C2 to C8 alkyl are used in combination, the methyl (meth)acrylate content is, for example, 5 mass % or more, preferably 10 mass % or more, and for example, 90 mass % or less, preferably 80 mass % or less relative to the total amount of the methyl (meth)acrylate and alkyl (meth)acrylate of C2 to C8 alkyl. The alkyl (meth)acrylate of C2 to C8 alkyl is contained in an amount of, for example, 10 mass % or more, preferably 20 mass % or more, and for example, 95 mass % or less, preferably, 90 mass % or less.

When the methyl (meth)acrylate and alkyl (meth)acrylate of C2 to C8 alkyl are used in combination at the above-described percentage, weather resistance and adherence can be improved, and for example, even after weather resistance test, adherence between the cover layer (described later) composed of the solar cell member covering material and the solar cell member (described later) can be kept excellently, and furthermore, the cover layer has excellent resistance to discoloration.

The acrylic polyol can be obtained by copolymerizing a monomer component containing these hydroxyl group-containing acrylate and a copolymerizable vinyl monomer in the presence of a suitable solvent and a polymerization initiator.

Examples of the silicone polyol include acrylic polyol in which as the copolymerizable vinyl monomer, for example, a silicone compound containing a vinyl group such as γ-methacryloxypropyltrimethoxysilane is blended in the above-described copolymerization of acrylic polyol.

Fluorine polyol is acrylic polyol containing a fluorine atom, and for example, at the time of the above-described copolymerization of acrylic polyol, for the copolymerizable vinyl monomer, acrylic polyol to which a fluorine compound having a vinyl group is blended is used.

Examples of the fluorine compound having a vinyl group include vinylidene fluoride (VdF), tetrafluoroethylene (TFE), hexafluoropropylene (HFP), chlorotrifluoroethylene (CTFE), vinyl fluoride (VF), and perfluoro (alkylvinylether).

Fluorine polyol can be obtained by copolymerization of, for example, a fluorine compound having a vinyl group such as TFE, a copolymerizable vinyl monomer, and a hydroxyl group-containing vinyl monomer. To be specific, examples include a copolymer of TFE/isobutylene/hydroxybutylvinyl ether/other monomer, a copolymer of TFE/vinyl versatate/hydroxybutylvinyl ether/other monomer, and a copolymer of TFE/VdF/hydroxybutylvinyl ether/other monomer, and preferably, a copolymer of TFE/isobutylene/hydroxybutylvinyl ether/other monomer, and a copolymer of TFE/vinyl versatate/hydroxybutylvinyl ether/other monomer are used.

The vinyl monomer-modified polyol can be obtained by allowing the above-described high-molecular weight polyol to react with a vinyl monomer.

These high-molecular weight polyols may be used singly or in combination of two or more.

These polyols may be used singly or in combination of two or more.

The polyol has a hydroxyl number of, for example, 10 mgKOH/g or more, preferably 20 mgKOH/g or more, and for example, 250 mgKOH/g or less, preferably 200 mgKOH/g or less.

The hydroxyl number can be determined in conformity with acetylation method or phthalic anhydride method of method A or method B of JIS K-1557-1 (2007).

Examples of the polythiol include aliphatic polythiol, aromatic polythiol, heterocyclic ring-containing polythiol, aliphatic polythiol containing a sulfur atom other than the mercapto group, aromatic polythiol containing a sulfur atom other than the mercapto group, and a heterocyclic ring-containing polythiol containing a sulfur atom other than the mercapto group.

Examples of the aliphatic polythiol include methane dithiol, 1,2-ethane dithiol, 1,1-propane dithiol, 1,2-propane dithiol, 1,3-propane dithiol, 2,2-propane dithiol, 1,6-hexane dithiol, 1,2,3-propane trithiol, 1,1-cyclohexane dithiol, 1,2-cyclohexane dithiol, 2,2-dimethylpropane-1,3-dithiol, 3,4-dimethoxybutane-1,2-dithiol, 1-methylcyclohexane-2,3-dithiol, bicyclo[2,2,1]hepta-exo-cis-2,3-dithiol, 1,1-bis(mercaptomethyl) cyclohexane, thiomalic acid bis(2-mercaptoethylester), 2,3-dimercapto succinic acid (2-mercaptoethylester), 2,3-dimercapto-1-propanol(2-mercaptoacetate), 2,3-dimercapto-1-propanol (3-mercaptopropionate), diethylene glycol bis(2-mercaptoacetate), diethylene glycol bis(3-mercaptopropionate), 1,2-dimercaptopropylmethylether, 2,3-dimercaptopropylmethylether, 2,2-bis(mercaptomethyl)-1,3-propane dithiol, bis(2-mercaptoethyl) ether, ethylene glycol bis(2-mercaptoacetate), ethylene glycol bis(3-mercaptopropionate), trimethylolpropane bis(2-mercaptoacetate), trimethylolpropane bis(3-mercaptopropionate), pentaerythritoltetrakis(2-mercaptoacetate), and pentaerythritoltetrakis(3-mercaptopropionate).

Examples of the aromatic polythiol include 1,2-dimercaptobenzene, 1,3-dimercaptobenzene, 1,4-dimercaptobenzene, 1,2-bis(mercaptomethyl) benzene, 1,3-bis(mercaptomethyl) benzene, 1,4-bis(mercaptomethyl) benzene, 1,2-bis(mercaptoethyl) benzene, 1,3-bis(mercaptoethyl) benzene, 1,4-bis(mercaptoethyl) benzene, 1,2-bis(mercaptomethyleneoxy) benzene, 1,3-bis(mercaptomethyleneoxy) benzene, 1,4-bis (mercaptomethyleneoxy) benzene, 1,2-bis(mercaptoethyleneoxy) benzene, 1,3-bis(mercaptoethyleneoxy) benzene, 1,4-bis(mercaptoethyleneoxy) benzene, 1,2,3-trimercaptobenzene, 1,2,4-trimercaptobenzene, 1,3,5-trimercaptobenzene, 1,2,3-tris(mercaptomethyl) benzene, 1,2,4-tris(mercaptomethyl) benzene, 1,3,5-tris(mercaptomethyl) benzene, 1,2,3-iris (mercaptoethyl) benzene, 1,2,4-iris (mercaptoethyl) benzene, 1,3,5-tris(mercaptoethyl) benzene, 1,2,3-tris (mercaptomethyleneoxy) benzene, 1,2,4-tris(mercaptomethyleneoxy) benzene, 1,3,5-tris(mercaptomethyleneoxy) benzene, 1,2,3-tris(mercaptoethyleneoxy) benzene, 1,2,4-tris(mercaptoethyleneoxy) benzene, 1,3,5-tris(mercaptoethyleneoxy) benzene, 1,2,3,4-tetramercaptobenzene, 1,2,3,5-tetramercaptobenzene, 1,2,4,5-tetramercaptobenzene, 1,2,3,4-tetrakis(mercaptomethyl) benzene, 1,2,4,5-tetrakis (mercaptomethyl) benzene, 1,2,3,4-tetrakis(mercaptoethyl) benzene, 1,2,3,5-tetrakis(mercaptoethyl) benzene, 1,2,4,5-tetrakis(mercaptoethyl) benzene, 1,2,3,4-tetrakis(mercaptomethyleneoxy) benzene, 1,2,3,5-tetrakis(mercaptomethyleneoxy) benzene, 1,2,4,5-tetrakis(mercaptoethyleneoxy) benzene, 1,2,3,4-tetrakis(mercaptoethyleneoxy) benzene, 1,2,3,5-tetrakis(mercaptoethyleneoxy) benzene, 1,2,4,5-tetrakis(mercaptoethyleneoxy) benzene, 2,2'-dimercaptobiphenyl, 4,4'-dimercaptobiphenyl, 4,4'-dimercaptobiphenyl, 2,5-toluene dithiol, 3,4-toluene dithiol, 1,4-naphthalene dithiol, 1,5-naphthalene dithiol, 2,6-naphthalene dithiol, 2,7-naphthalene dithiol, 2,4-dimethylbenzene-1,3-dithiol, 4,5-dimethylbenzene-1,3-dithiol, 9,10-anthracenedimethanethiol, 1,3-di(p-methoxyphenyl)propane-2,2-dithiol, 1,3-diphenylpropane-2,2-dithiol, phenylmethane-1,1-dithiol, and 2,4-di (p-mercaptophenyl)pentane.

Examples of the heterocyclic ring-containing polythiol include 2-methylamino-4,6-dithiol-sym-triazine, 2-ethylamino-4,6-dithiol-sym-triazine, 2-amino-4,6-dithiol-sym-triazine, 2-molpholino-4,6-dithiol-sym-triazine, 2-cyclohexylamino-4,6-dithiol-sym-triazine, 2-methoxy-4,6-dithiol-sym-triazine, 2-phenoxy-4,6-dithiol-sym-triazine, 2-thiobenzeneoxy-4,6-dithiol-sym-triazine, and 2-thiobutyloxy-4,6-dithiol-sym-triazine.

Examples of the aliphatic polythiol containing a sulfur atom other than the mercapto group include bis(mercaptomethyl)sulfide, bis(mercaptoethyl)sulfide, bis(mercaptopropyl)sulfide, bis(mercaptomethylthio)methane, bis(2-mercaptoethylthio)methane, bis(3-mercaptopropylthio) methane, 1,2-bis(mercaptomethylthio)ethane, 1,2-bis(2-mercaptoethylthio)ethane, 1,2-bis(3-mercaptopropyl) ethane, 1,3-bis(mercaptomethylthio)propane, 1,3-bis(2-mercaptoethylthio)propane, 1,3-bis(3-mercaptopropylthio) propane, 1,2,3-tris(mercaptomethylthio)propane, 1,2,3-tris (2-mercaptoethylthio)propane, 1,2,3-tris(3-mercaptopropylthio)propane, tetrakis (mercaptomethylthiomethyl)methane, tetrakis(2-mercaptoethylthiomethyl)methane, tetrakis(3-mercaptopropylthiomethyl)methane, bis(2,3-dimercaptopropyl)sulfide, 2,5-dimercapto-1,4-dithiane, 2,5-dimercaptomethyl-1,4-dithiane, bis(mercaptomethyl) disulfide, bis(mercaptoethyl)disulfide, bis(mercaptopropyl) disulfide, and the like, and thioglycolic acid and mercaptopropionic acid esters of the above-mentioned compounds, hydroxymethylsulfide bis(2-mercapto acetate), hydroxymethylsulfide bis(3-mercaptopropionate), hydroxyethylsulfide bis(2-mercapto acetate), hydroxyethylsulfide bis(3-mercaptopropionate), hydroxypropylsulfide bis(2-mercaptoacetate), hydroxypropylsulfide bis(3-mercaptopropionate), hydroxymethyldisulfide bis(2-mercaptoacetate), hydroxymethyldisulfide bis(3-mercaptopropionate), hydroxyethyldisulfide bis(2-mercapto acetate), hydroxyethyldisulfide bis(3-mercaptopropionate), hydroxypropyldisulfide bis(2-mercaptoacetate), hydroxypropyldisulfide bis(3-mercaptopropionate), 2-mercaptoethylether bis(2-mercaptoacetate), 2-mercaptoethylether bis(3-mercaptopropionate), 1,2-bis[(2-mercaptoethyl)thio]-3-mercaptopropane, 1,4-dithiane-2,5-diol bis(2-mercapto acetate), 1,4-dithiane-2,5-diol bis(3-mercaptopropionate), thiodiglycolic acid bis(2-mercaptoethylester), thiodipropionic acid bis(2-mercaptoethylester), 4,4-thiodibutyric acid bis(2-mercaptoethylester), dithiodiglycolic acid bis(2-mercaptoethylester), dithiodipropionic acid bis(2-mercaptoethylester), 4,4-dithiodibutyric acid bis(2-mercaptoethylester), thioglycolic bis(2,3-dimercaptopropylester), thiodipropionic acid bis(2,3-dimercaptopropylester), dithioglycolic acid bis(2,3-dimercaptopropylester), and dithiodipropionic acid bis(2,3-dimercaptopropylester).

Examples of the aromatic polythiol containing a sulfur atom other than the mercapto group include 1,2-bis(mercaptomethylthio, 1,3-bis(mercaptomethylthio) benzene, 1,4-bis (mercaptomethylthio) benzene, 1,2-bis(mercaptoethylthio) benzene, 1,3-bis(mercaptoethylthio) benzene, 1,4-bis(mercaptoethylthio) benzene, 1,2,3-tris(mercaptomethylthio) benzene, 1,2,4-tris(mercaptomethylthio) benzene, 1,3,5-tris (mercaptomethylthio) benzene, 1,2,3-tris(mercaptoethylthio) benzene, 1,2,4-tris(mercaptoethylthio) benzene, 1,3,5-tris(mercaptoethylthio) benzene, 1,2,3,4-tetrakis (mercaptomethylthio) benzene, 1,2,3,5-tetrakis (mercaptomethylthio) benzene, 1,2,4,5-tetrakis (mercaptomethylthio) benzene, 1,2,3,4-tetrakis (mercaptomethylthio) benzene, 1,2,3,5-tetrakis (mercaptoethylthio) benzene, 1,2,4,5-tetrakis (mercaptoethylthio) benzene, and the like, and nuclear alkylated products of the above-mentioned compounds.

Examples of the heterocyclic ring-containing polythiol containing a sulfur atom other than the mercapto group include 3,4-thiophene dithiol, 2,5-dimercapto-1,3,4-thiadiazole, and the like, and thioglycolic acid esters and mercaptopropionic acid esters of the above-mentioned compounds.

Further examples of the polythiol include halogen substituted compound of these polythiols, such as chlorine-substituted compound and bromine-substituted compound of the polythiol components.

These polythiols may be used singly or in combination of two or more.

The alcoholic active hydrogen group-containing compound may be used singly or in combination of two or more.

For the alcoholic active hydrogen group-containing compound, preferably polyol, more preferably a high-molecular weight polyol, even more preferably an acrylic polyol (including fluorine polyol) is used.

When acrylic polyol (including fluorine polyol) is used for the alcoholic active hydrogen group-containing compound, improvement in antiblocking properties, light resistance, and weather resistance can be achieved in the solar cell member covering material and its curing agent, and furthermore, in the solar cell member with a cover layer.

Furthermore, for the alcoholic active hydrogen group-containing compound, particularly preferably, acrylic polyol (acrylic polyol containing no fluorine atoms) excluding fluorine polyol is used.

When the acrylic polyol containing no fluorine atoms is used for the alcoholic active hydrogen group-containing compound, improvement in antiblocking properties, light resistance, weather resistance of the solar cell member covering material and its curing agent, and furthermore, of the solar cell member with a cover layer can be improved particularly excellently, and adherence of the solar cell sealing material (e.g., ethylene-vinyl acetate copolymer (EVA), etc.) can be improved particularly excellently.

The alcoholic active hydrogen group-containing compound has a number average molecular weight of, for example, 1000 or more, preferably 2000 or more, and for example, 30000 or less, preferably 2000) or less.

The alcoholic active hydrogen group-containing compound has an average functionality of, for example, 4 or more, preferably 8 or more, and for example, 50 or less, preferably 40 or less.

The alcoholic active hydrogen group-containing compound has a viscosity (measurement device: E-type viscometer TV-30 manufactured by TOKI Sangyo Co., Ltd., rotor: 1° 34'×R24, rotation speed: selected from the range of 0.1 to 10 rpm so that the measurement range is 20 to 80%) at 25° C. of, for example, 500 mPa·s or more, preferably, 1000 mPa·s or more, and fir example, 20000 mPa·s or less, preferably 15000 mPa·s or less.

By blending the above-described curing agent with the above-described base resin by a known method, the solar cell member cover material of the present invention can be obtained as a two-component type coating material.

In blending the curing agent with the base resin, for example, the equivalent ratio (active hydrogen group/isocyanate group) of the active hydrogen group (hydroxy group (OH), mercapto group (SH)) of the base resin relative to the isocyanate group (NCO) of the curing agent is adjusted to be 0.8 to 1.2.

To be specific, the mixing ratio of the curing agent relative to the base resin is, for example, 10 parts by mass or more, preferably 20 parts by mass or more, and for example, 50 parts by mass or less, preferably 40 parts by mass or less of the curing agent relative to 100 parts by mass of the base resin.

The blending conditions include a temperature of, for example, 10 to 120° C., preferably 20 to 80° C.

To the solar cell member cover material, as necessary, urethanizing catalysts such as, for example, amines or organometallic compounds can be added.

Examples of the amine include tertiary amines such as triethylamine, triethylenediamine, bis-(2-dimethylaminoethyl) ether, and N-methylmorpholine; quaternary ammonium salts such as tetraethyl hydroxyl ammonium; and imidazoles such as imidazole and 2-ethyl-4-methylimidazole.

Examples of the organometallic compound include organotin compounds such as tin acetate, tin octylate, tin oleate, tin laurate, dibutyl tin diacetate, dimethyl tin dilaurate, dibutyl tin dilaurate, dibutyl tin dimercaptide, dibutyl tin maleate, dibutyl tin dineodecanoate, dioctyl tin dimercaptide, dioctyl tin dilaurate, and dibutyl tin dichloride; organic lead compounds such as lead octanoate and lead naphthenate; organic nickel compounds such as nickel naphthenate; organic cobalt compounds such as cobalt naphthenate; organocopper compounds such as copper octenate; and organic bismuth compounds such as bismuth octylate and bismuth neodecanoate.

Examples of the urethanizing catalyst also include potassium salts such as potassium carbonate, potassium acetate, and potassium octoate.

These urethanizing catalysts may be used singly or in combination of two or more.

For the urethanizing catalyst, preferably, organometallic compounds, more preferably, organotin compounds are used.

The mixing ratio of the urethanizing catalyst is set suitably in accordance with the purpose and application.

To the solar cell member cover material, as necessary, known additives, for example, weathering stabilizers (light resistant stabilizer), plasticizers, anti-blocking agents, heat resistant stabilizers, antioxidants, ultraviolet ray absorbing agents, releasing agents, pigments, dyes, lubricants, fillers, hydrolysis prevention agents, and fire retardants can be added. These additives may be added to both or one of the base resin and the curing agent, and may be added at the same time with the blending of the base resin with the curing agent, and furthermore, may be added to the solar cell member cover material after blending the base resin and the curing agent.

The mixing ratio of the additive can be set suitably in accordance with the purpose and application.

Furthermore, the solar cell member cover material can be diluted, as necessary, with the above-described organic solvent. In such a case, the solar cell member cover material solid content concentration is, for example, 10 mass % or more, preferably 30 mass % or more, and for example, 90 mass % or less, preferably 70 mass % or less.

The thus obtained solar cell member cover material covers various members of a solar cell, and is used for production of a solar cell member with a cover layer.

FIG. 1 is a schematic diagram illustrating the configuration of a solar cell member with a cover layer in an embodiment of the present invention.

In FIG. 1, a solar cell member with a cover layer 1 includes a solar cell member 2, and a cover layer 3 that covers the member 2.

The member 2 is not particularly limited, as long as it is a solar cell member, and examples thereof include a back sheet (described later), a support layer (described later), a solar battery cell (described later), a sealing layer (described later), a glass plate (described later), and a frame (described later).

The cover layer 3 is a resin layer that covers one side of the member 2, and is formed from the above-described solar cell member cover material.

To produce such a solar cell member 1 with a cover layer, first, the above-described solar cell member curing material is applied on one side of the solar cell member 2.

The application method is not particularly limited, and for example, a known coating method such as brush coating, gravure coating, reverse roll coating, roll coating, bar coating, spray coating, air knife coating, and dipping are used.

The application amount is not particularly limited, but the thickness of the coating after curing is, for example, 2 μm or more, preferably 5 μm or more, and for example, 50 μm or less, preferably 30 μm or less.

Next, in this method, the solar cell member cover material is heated to be cured.

The heating conditions include, a heating temperature of for example, 50° C. or more, preferably 80° C. or more, and for example, 150° C. or less, preferably 130° C. or less. The heating time is, for example, 1 minute or more, preferably 2 minutes or more, and for example, 60 minutes or less, preferably 30 minutes or less.

The solar cell member cover material can be cured at a normal temperature as well.

In this manner, a cover layer 3 composed of a solar cell member cover material is formed on one side of the member 2, and the solar cell member 1 with a cover layer including the member 2 and the cover layer 3 can be obtained.

Although the cover layer 3 is formed only on one side of the member 2 in the description above, for example, as shown by the phantom line in FIG. 1, the cover layer 3 can be formed on both one side and the other side of the member 2. Furthermore, although not shown in detail, the cover layer 3 can be formed only on the other side of the member 2, and the cover layer 3 can cover the entire surface of the member 2.

Such a solar cell member covering material and a solar cell member 1 with a cover layer has excellent antiblocking properties and adherence.

Therefore, the solar cell member with a cover layer 1 of the present invention is suitably used as parts that form the solar cell. In the following, the solar cell is described in detail.

Figure 2:
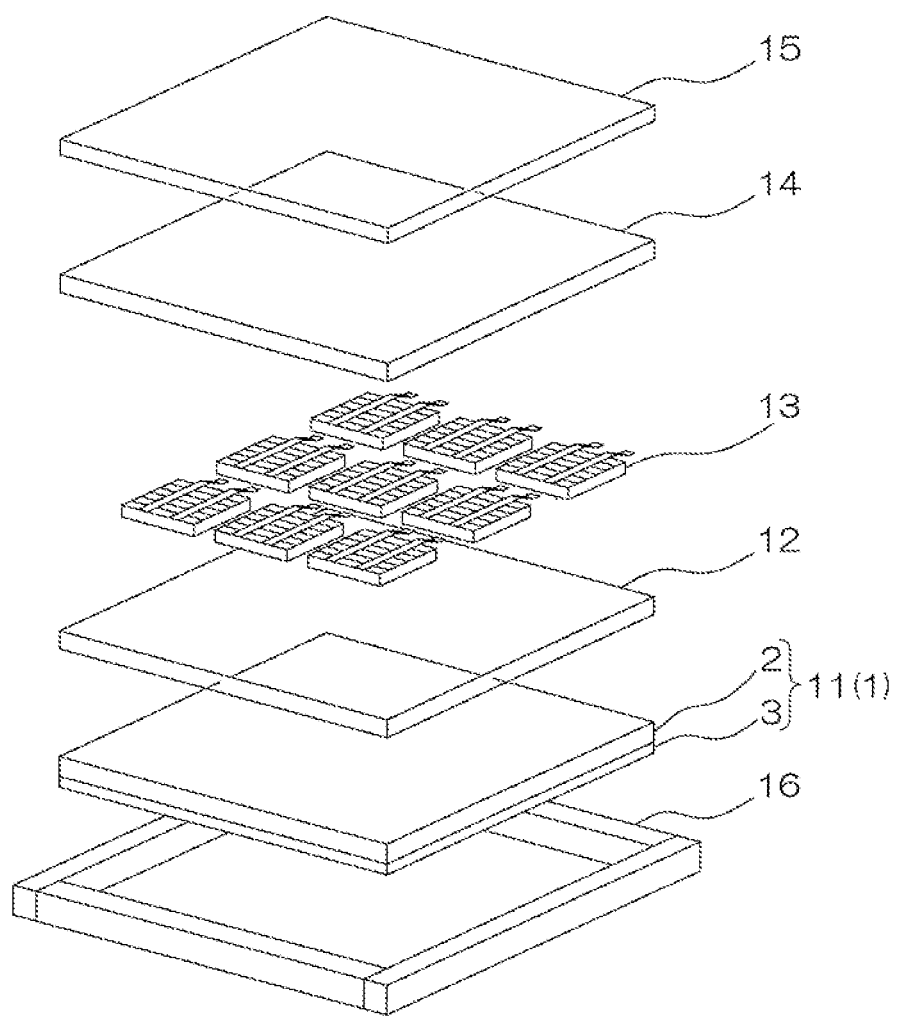
FIG. 2 is a schematic diagram illustrating the configuration of a solar cell in which an embodiment of the solar cell member with a cover layer of the present invention is used.

FIG. 2 is a schematic diagram illustrating the configuration of a solar cell in which an embodiment of the solar cell member with a cover layer of the present invention is used.

In FIG. 2, the solar cell 10 includes a back sheet 11 that protects the back surface of the solar cell 10, a support layer 12 laminated on the back sheet 11, solar battery cells 13 supported on the support layer 12, a sealing layer 14 that seals the solar battery cells 13 on the support layer 12, a glass plate 15 disposed on the sealing layer 14, and a frame 16 that accommodates them.

In such a solar cell 10, for example, the back sheet 11 can be formed as the above-described solar cell member 1 with a cover layer. That is, the back sheet 11 can include a base sheet as the member 2 (ref: FIG. 1), and a cover layer 3 (ref: FIG. 1) that covers the base sheet. In such a case, the cover layer 3 can be disposed on the upper surface side or the lower surface side of the back sheet 11, and furthermore, can be disposed on both surfaces of the upper surface and the lower surface.

The solar cell member 1 with a cover layer is not limited to the above-described back sheet 11, and for example, a cover layer 3 (ref: FIG. 1) can be formed on the surface of members such as the support layer 12, solar battery cell 13, sealing layer 14, and frame 16, to form the solar cell member 1 with a cover layer.

The cover layer 3 in such a solar cell member 1 with a cover layer, that is, a coating obtained by the solar cell member covering material has excellent mechanical properties.

To be specific, the cover layer 3 has a tensile strength at break (tensile speed 5 mm/min) of, for example, 35 MPa or more, preferably 40 MPa or more, and for example, 70 MPa or less, preferably 60 MPa or less. The elongation at break (tensile speed 5 mm/min) is, for example, 2% or more, preferably 4% or more, and for example, 15% or less, preferably 10% or less.

The cover layer 3 also has excellent light resistance, and excellent mechanical properties can be kept even after exposure to light.

To be specific, the cover layer 3 after the light resistance test in Examples to be described later has a tensile strength at break (tensile speed 5 mm/min) of, for example, 30 MPa or more, preferably 40 MPa or more, and for example, 70 MPa or less, preferably 60 MPa or less. The elongation at break (tensile speed 5 mm/min) is, for example, 2% or more, preferably 3% or more, and for example, 15% or less, preferably 10% or less.

To the above-described cover layer, a known surface treatment can be given to improve adherence to the solar cell sealing material (e.g., EVA, etc.). Examples of surface treatment include, for example, plasma discharge treatment, corona discharge treatment, chemical conversion treatment, and surface reforming by UV irradiation.

For the adherence, to be specific, the adhesive strength (tensile speed 200 mm/min) relative to EVA in Examples to be described later is, for example, 60 N/cm or more, preferably 80N/cm or more. When the adhesive strength is low, for example, delamination may occur in, for example, weather resistance test.

Such a covering material can be used, other than the above-described solar cell member covering material, for example, for covering of surfaces of, for example, polyurethane molded products, tubes, films, sheets, and rods. For example, the covering material can be suitably used as a covering material of, for example, optical guide materials for electronic use, robots, and nursing care components; decorative films and chipping film for automobile components; and marine products members, oil seals, rolls, and hoses.

<Microcapsule>

The above-described polyisocyanate composition is used as an ingredient component of a microcapsule of the present invention.

That is, in a microcapsule of the present invention, a core material component to be described later is encapsulated in a film formed by reaction of a polyisocyanate component containing the above-described polyisocyanate composition, and an active hydrogen-containing component to be described later.

Such a microcapsule can be obtained as follows: for example, a core material component and a polyisocyanate component are dispersed and/or dissolved in an organic solvent, and the produced dispersion and/or solution is emulsified and dispersed in a dispersion medium composed of the active hydrogen-containing component.

The core material component is a component encapsulated by the microcapsule, and is suitably selected in accordance with the microcapsule use.

For example, in the case of microcapsule for pressure-sensitive recording sheets (described later), examples of the core material component include a color coupler.

Examples of the color coupler include an electron-donating organic color coupler that undergoes color reaction with coloring agents, to be specific, triallylmethane compounds such as 3,3-bis(p-dimethylaminophenyl)-6-dimethylaminophthalide (also called crystal violet lactone), 3,3-bis(p-dimethylaminophenyl) phthalide, and 3-(p-dimethylaminophenyl)-3-(1,2-dimethylindole-3-yl) phthalide; diphenylmethane compounds such as 4,4'-bis-dimethylaminobenzhydryl benzylether, N-halophenyl-leucoauramine, and N-2,4,5-trichlorophenylleucoauramine; fluoran compounds such as 7-diethylamino-3-chlorofluoran, 7-diethylamino-3-chloro-2-methylfluoran, and 2-phenylamino-3-methyl-6-(N-ethyl-N-p-tolylamino)fluoran; thiazine compounds such as benzoylleucomethylene blue, p-nitrobenzylleucomethylene blue; and spiro compounds such as 3-methyl-spiro-dinaphthopyran, 3-ethyl-spiro-dinaphthopyran, 3-propyl-spiro-dinaphthopyran, and 3-propyl-spiro-dibenzopyran.

Examples of the core material component for other applications include, to be specific, oil-based solvents, high boiling point solvents, low boiling point solvents, coloring agents (e.g., pigment, dye, etc.), water-absorbing polymers, aromatic oils, reactive adhesives, diazo compounds, catalysts (e.g., organic catalysts, metal catalysts, complex catalysts, biocatalysts, zeolite, etc.), fire retardants, plant protectants, plant growth regulators, insect growth regulators, pharmaceutical products, agricultural products, pesticides (e.g., incecticides, herbicides, sterilization agents, tickicides, rodenticides, etc.), insect repellents, fertilizers, enzymes, ultraviolet ray absorbent, light stabilizers, sulfur, vulcanization agents, vulcanization accelerator, vulcanization accelerator-activator, and odor suppressers.

These core material components may be used singly or in combination of two or more.

The polyisocyanate component contains the above-described polyisocyanate composition as an essential component. Preferably, the polyisocyanate component consists of the polyisocyanate composition.

The polyisocyanate component can also contain other polyisocyanates (polyisocyanate other than the above-described polyisocyanate composition) to the extent that does not hinder the excellent effects of the present invention.

Examples of the other polyisocyanates include the above-described polyisocyanate monomer (e.g., aromatic polyisocyanate, aralkyl polyisocyanate, aliphatic polyisocyanate, etc.), and derivatives of these polyisocyanates.

When the polyisocyanate component contains other polyisocyanates, more than 0 mass %, for example, 50 mass % or less, preferably 30 mass % or less of the other polyisocyanate is contained.

The organic solvent is not particularly limited as long as the organic solvent can disperse or dissolve the core material component and the polyisocyanate component, and examples thereof include various aromatic organic solvents and aliphatic organic solvents.

Examples of the aromatic organic solvent include aromatic solvents such as benzene, toluene, xylene, methylnaphthalene, dimethylnaphthalene, isopropylnaphthalene, diisopropylnaphthalene, ethylbiphenyl, and diethylbiphenyl; and aromatic petroleum solvents such as alkylbenzene, alkylnaphthalene, alkylphenol, and phenylxylylethane.

For the aromatic organic solvent, various commercially available products may be used, and examples of the commercially available products include CERTREX 48 (high boiling point aromatic solvent, distillation range 254 to 386° C., manufactured by MOBIL OIL CORPORATION), alkene L (alkylbenzene, distillation range 285 to 309° C., manufactured by JX Nippon Oil & Energy Corporation), Solvesso 100 (alkylbenzene, distillation range 164 to 180° C. manufactured by Exxon Mobil Corporation), Solvesso 150 (alkylbenzene, distillation range 188 to 21° C., manufactured by Exxon Mobil Corporation), Solvesso 200 (alkylbenzene, distillation range 226 to 286° C., manufactured by Exxon Mobil Corporation), KMC-113 (diisopropylnaphthalene, boiling point 300° C., manufactured by KUREHA CORPORATION), SAS296 (phenylxylylethane, distillation range 290 to 305° C., manufactured by JX Nippon Oil & Energy Corporation), and Arocizer 202 (ethylbiphenyl, boiling point 286° C., manufactured by Nippon Steel Chemical Co., Ltd.).

Examples of the aromatic petroleum solvent include commercially available products of, for example, MSP (distillation range (° C.) 90 to 120, specific gravity (15/4° C.) 0.820 or more, mixed aniline point (° C.) 26 or less, aromatic content (vol %) 70 or more), Super sol 100 (distillation range (° C.) 95 to 111, specific gravity (15/4° C.) 0.825, mixed aniline point (° C.) 26.0, aromatic content (vol %) 75 or more), Pegasol ARO-80 (distillation range (° C.) 104 to 123, specific gravity (15/4° C.) 0.832, mixed aniline point ((C) 26, aromatic content (vol %) 75.9), Swasol 100 (distillation range (° C.) 106 to 116, specific gravity (15/4° C.) 0.835, mixed aniline point (° C.) 24.6, aromatic content (vol %) 76.4), Swasol 200 (distillation range (° C.) 132 to 144, specific gravity (15/4° C.) 0.844, mixed aniline point (° C.) 23.8, aromatic content (vol %) 80.9), MHS (distillation range (° C.) 140 to 170, specific gravity (15/4° C.) 0.86 to 0.88, mixed aniline point (° C.) 11 to 12, aromatic content (vol %) 98 or more), Hiarom 25 (distillation range (° C.) 152 to 187, specific gravity (15/4° C.) 0.816, mixed aniline point (° C.) 47 or less, aromatic content (vol %) 45 to 55), Swasol 310 (distillation range (° C.) 153 to 177, specific gravity (15/4° C.) 0.817, mixed aniline point (° C.) 43.6, aromatic content (vol %) 51.0), Super sol 150 (distillation range (° C.) 153 to 197, specific gravity (15/4° C.) 0.815, mixed aniline point (° C.) 21.5, aromatic content (vol %) 50 or more), Shoseki Hisol (distillation range (° C.) 153 to 198, specific gravity (15.6/15.6° C.) 0.818, aromatic content (vol %) 55), HAWS (distillation range ((C) 154 to 190, specific gravity (15/4° C.) 0.822, aromatic content (vol %) 50), Super sol 1500 (distillation range (° C.) 155 to 171, specific gravity (15/4° C.) 0.869, mixed aniline point (° C.) 14.6, aromatic content (vol %) 98 or more), Nisseki Hisol100 (distillation range (° C.) 155 to 180, specific gravity (15/4° C.) 0.870 to 0.880, mixed aniline point (° C.) 15 or less, aromatic content (vol %) 99.0 or more), Pegasol R-100 (distillation range (° C.) 156 to 174, specific gravity (15/4° C.) 0.874, mixed aniline point (° C.) 14, aromatic content (vol %) 96.4), MSS (distillation range (° C.) 158 to 180, specific gravity (15.6/15.6° C.) 0.86 to 0.89, mixed aniline point (° C.) 13 to 14, aromatic content (vol %) 98 or more), SHELLSOL A (distillation range (° C.) 160 to 182, specific gravity (15/4° C.) 0.873, aromatic content (vol %) 98), Swasol 1000 (distillation range (° C.) 162 to 176, specific gravity (15/4° (C) 0.878, mixed aniline point (° C.) 12.7, aromatic content (vol %) 99.7), Idemitsu Ipsol 100 (distillation range (° C.) 162 to 179, specific gravity (15/4° C.) 0.875, mixed aniline point (° C.) 13.5, aromatic content (vol %) 99.5 or more), Shoseki Toku Hisol (distillation range (° C.) 162 to 180, specific gravity (15/4° C.) 0.881, mixed aniline point (° C.) 12.6, aromatic content (vol %) 99.99), Swasol 1500 (distillation range (° C.) 180 to 207 specific gravity (15/4° C.) 0.886, mixed aniline point (° C.) 16.5, aromatic content (vol %) 98.8), Nisseki Hisol150 (distillation range (° C.) 182 to 216, specific gravity (15/4° C.) 0.887 to 0.904, mixed aniline point (° C.) 17 or less, aromatic content (vol %) 99.0 or more), Super sol 1800 (distillation range (° C.) 183 to 208, specific gravity (15/4° C.) 0.889, mixed aniline point (° C.) 15.7, aromatic content (vol %) 99 or more), Idemitsu Ipsol 150 (distillation range (° C.) 186 to 205, specific gravity (15.6/15.6° C.) 0.895, mixed aniline point (° C.) 15.2, aromatic content (vol %) 99.5 or more), SHELLSOL AB (distillation range (° C.) 187 to 213, specific gravity (15/4° C.) 0.894, aromatic content (vol %) 99.5), Pegasol R-150 (distillation range (C) 191 to 212, specific gravity (15/4° C.) 0.890, mixed aniline point (° C.) 18, aromatic content (vol %) 97.2), and Swasol 1800 (distillation range (° C.) 197 to 237, specific gravity (15/4° C.) 0.940, mixed aniline point (° C.) 14.0, aromatic content (vol %) 99.6).

Examples of the aliphatic organic solvent include aliphatic organic solvents such as hexane, cyclohexane, octane, and decane; ester solvents such as ethyl acetate, butyl acetate, isobutyl acetate, 3-methyl-3-methoxybutylacetate, dimethyl adipate, dimethyl glutate, dimethyl succinate, γ-butyrolactone, ethylene glycolmonomethylether acetate, ethylene glycolmonoethylether acetate, and ethylene glycolmonobutylether acetate; ketone solvents such as acetone, methyl ethyl ketone, and methylisobutylketone; ether solvents such as 1,4-dioxane and tetrahydrofuran; alcoholic solvents such as hexanol, octanol, benzylalcohol, and furfur alcohol; glycol solvents such as ethylene glycol, diethylene glycol, polyethylene glycol, propylene glycol, dipropylene glycol, tripropylene glycol, polypropylene glycol, 1,4-butanediol, 1,5-pentanediol, ethylene glycolmonomethylether, ethylene glycolmonoethylether, ethylene glycolmonobutylether, diethylene glycolmonomethylether, diethylene glycolmonoethylether, and tripropylene glycolmonomethylether; halogenated hydrocarbon solvents such as carbon tetrachloride, chloroform, dichloromethane, 1,1,1-trichloroethane, chlorobenzene, and dichlorobenzene; nitrogen-containing compound solvents such as N-methylpyrrolidone, N,N-dimethylaniline, pyridine, acetonitrile, dimethylformamide, dimethyl sulfoxide, and dimethylacetoamide; and aliphatic petroleum solvents such as mineral spirit.

These organic solvents may be used singly or in combination of two or more.

For the organic solvent, preferably, an organic solvent having a boiling point of 100 to 500° C., more preferably 150 to 450° C. is used. For the organic solvent, preferably, an aromatic organic solvent is used.

To disperse and/or dissolve the core material component and the polyisocyanate component in such an organic solvent, a known method can be used; and for example, the polyisocyanate component and the core material component are blended into the organic solvent at normal temperature or while heating.

The mixing ratio of the components are, for example, 0.1 parts by mass or more, preferably, 0.5 parts by mass or more, and for example, 50 parts by mass or less, preferably, 20 parts by mass or less of the polyisocyanate component relative to 100 parts by mass of the organic solvent. The core material component is blended in an amount of, for example, 0.1 parts by mass or more, preferably 1 part by mass or more, and for example, 100 parts by mass or less, preferably 10 parts by mass or less relative to 100 parts by mass of the organic solvent.

In this method, to an extent that does not hinder the excellent effects of the present invention, as necessary, alkylene oxide adduct of amine (hereinafter referred to as alkylene oxide-added amine) can be added.

The alkylene oxide-added amine is a compound in which at least one or more of the hydrogens of the amino group of an amine compound is replaced with alkylene oxide.

Examples of the amine compound include aliphatic amines such as stearylamine, oleylamine, ethylenediamine, 1,3-propylene diamine, diethylenetriamine, triethylenetetramine, and 1,6-hexamethylenediamine; and aromatic amines such as o-phenylenediamine, p-phenylenediamine, and diaminonaphthalene.

These amine compounds may be used singly or in combination of two or more.

For the amine compound, preferably, aliphatic amine is used.

Examples of alkylene oxide include ethylene oxide, propylene oxide, and butylenes oxide.

These alkylene oxides may be used singly or in combination of two or more. That is, the alkylene oxide adduct of amine may be a random and/or block copolymer of a plurality of types of alkylene oxide.

For the alkylene oxide, preferably, propylene oxide is used.

The alkylene oxide-added amine has a number average molecular weight of, for example, 250 to 4000.

When the alkylene oxide-added amine is blended, the mixing ratio of the alkylene oxide-added amine relative to 100 parts by mass of the polyisocyanate component is, for example, 1 part by mass or more, preferably 2 parts by mass or more, and for example, 100 parts by mass or less, preferably 50 parts by mass or less.

By blending the alkylene oxide-added amine, durability such as solvent resistance and pressure resistance of the microcapsule can be improved.

Next, in this method, the dispersion and/or solution produced as described above is blended with the active hydrogen-containing component (dispersion medium), and emulsified and dispersed.

The active hydrogen-containing component is a dispersion medium containing an active hydrogen that undergoes reaction with the isocyanate group of the polyisocyanate component, and examples thereof include water, and amines including aliphatic amines such as ethylenediamine, diethylenetriamine, triethylenetetramine, tetraethylenepentamine, hexamethylenediamine, and hydrazine; alicyclic amines such as isophorone diamine; and aralkylamines such as xylenediamine.

These active hydrogen-containing components may be used singly or in combination of two or more.

In view of effective emulsification and dispersion, preferably, water, or a mixture of water and amines is used.

Usually, the active hydrogen-containing component (dispersion medium) is used as an aqueous solution of a protective colloid and/or a surfactant.

Examples of the protective colloid include natural hydrophilic polymer substances such as gelatin, gum arabic, casein, and starch; semi-synthetic hydrophilic polymer substances such as carboxymethylcellulose and its salt; and synthetic hydrophilic polymer substances such as polyvinyl alcohol.

Examples of the surfactant include anionic surfactants such as sulfonic acid salt, carboxylic acid salt, sulfate salt, and phosphoric acid ester salt; cationic surfactants such as quaternary ammonium salt; and nonionic surfactants such as alkyl and alkylallyl polyoxyethylene ether, polyoxyethylene ether of sorbitan ester, and polyethylene glycol aliphatic ester.

These protective colloids and/or surfactants may be used singly or in combination of two or more.

The mixing ratio of the protective colloid and/or surfactant is 0.1 to 50 parts by mass, preferably 0.5 to 10 parts by mass relative to 100 parts by mass of the active hydrogen-containing component (dispersion medium).

In emulsification dispersion, dispersion and/or solution of the polyisocyanate component and the core material component is blended with the above-described active hydrogen-containing component (dispersion medium) by a known method.

The mixing ratio of the components are as follows: the mixing ratio of the above-described dispersion and/or solution is, for example, 1 to 70 parts by mass, preferably 10 to 50 parts by mass relative to 100 parts by mass of the active hydrogen-containing component (dispersion medium). As necessary, the mixture is stirred, for example, at 20 to 90° C. for 0.1 to 10 hours.

In this manner, the emulsified and dispersed polyisocyanate component is allowed to react with the active hydrogen-containing component (dispersion medium), and a microcapsule is produced by encapsulating the core material component with the film formed by the reaction between the polyisocyanate component and the active hydrogen-containing component.

The particular size of the microcapsule is, for example, 1 to 15 μm.

The thus produced microcapsule of the present invention is produced by using the polyisocyanate composition of the present invention, and therefore have excellent physical properties. To be specific, the microcapsule of the present invention has, for example, excellent durability such as heat resistance, pressure resistance, and solvent resistance, and various effects based on the core material component can be effectively exhibited.

Therefore, the microcapsule of the present invention is suitably used in applications in various recoding materials, display materials, heat-sensitive materials, pressure-sensitive materials, photosensitive materials, paints, adhesives, ink, films, fiber, leather, cosmetics, pharmaceutical products, agricultural products, perfumes, artificial heart, absorbent filler for ink jet sheet, internal filler for papermaking, correction ink, highly concealing pigment for correction ribbon, toner (electrophotography, color copy, etc.), liquid fuel, liquid crystal, and rubber additives, and in particular, suitably used for pressure-sensitive recording sheets.

When the microcapsule is used for pressure-sensitive recording sheets, for example, latex (e.g., carboxy-modified styrenebutadiene rubber latex, etc.) as a binder, and a buffering agent (e.g., starch particles, etc.) are added to the produced emulsion of microcapsules, and the liquid mixture thus produced is applied on stencil paper, thereby producing a pressure-sensitive recording sheet.

<Binder for Ink>

The above-described polyisocyanate composition is used as an ingredient component for a binder for ink of the present invention.

To be specific, a binder for ink of the present invention is prepared from a base resin and a curing agent.

The base resin contains a polyurethane resin having an active hydrogen group (e.g., hydroxyl group, amino group, etc.).

The polyurethane resin having an active hydrogen group in the base resin can be obtained, for example, by allowing the isocyanate component and the active hydrogen group-containing compound component (although to be described later in detail, for example, a polyol component, and a polyamine component, etc.) to react so that the ratio of the active hydrogen group in the active hydrogen group-containing compound component (e.g., hydroxyl group, amino group, etc.) relative to the isocyanate group in the isocyanate component is more than 1.

Examples of the isocyanate component include the above-described polyisocyanate monomer (e.g., aromatic polyisocyanate, aralkyl polyisocyanate, aliphatic polyisocyanate, etc.), and their polyisocyanate derivatives. For the isocyanate component, the polyisocyanate composition of the present invention can also be used.

For the isocyanate component, to the extent that does not damage the excellent effects of the present invention, monoisocyanate can further be used in combination.

Examples of the monoisocyanate include methyl isocyanate, ethyl isocyanate, n-hexyl isocyanate, cyclohexyl isocyanate, 2-ethylhexylisocyanate, phenyl isocyanate, benzyl isocyanate, and p-toluenesulfonyl isocyanate.

These monoisocyanates may be used singly or in combination of two or more.

These isocyanate components may be used singly or in combination of two or more.

For the isocyanate component, preferably, aliphatic polyisocyanates, more preferably, alicyclic polyisocyanates, even more preferably, bis(isocyanatomethyl) cyclohexane is used.

In the isocyanate component, the average functionality of the isocyanate group is, for example, 1.5 to 3.0, preferably 1.9 to 2.5, and particularly preferably 2.

The isocyanate content of the isocyanate component (in conformity with JIS K 1603-1 (2007)) is, for example, 31 to 56 mass %, preferably 36 to 50 mass %, more preferably 40 to 45 mass %. The isocyanate component has an amine equivalent (in conformity with JIS K 1603-1 (2007)) of, for example, 75 to 136, preferably 84 to 117, more preferably 93 to 105.

Examples of the active hydrogen group-containing compound component include polyol components and polyamine components.

Examples of the polyol component include the above-described low-molecular-weight polyol and high-molecular weight polyol. Examples of the polyol component further include naturally derived polyol component, to be specific, saccharides.

Examples of the saccharide include monosaccharides such as dihydroxyacetone, glyceraldehyde, erythrulose, erythrose, threose, ribulose, xylulose, ribose, arabinose, xylose, lyxose, deoxyribose, psicose, fructose, sorbose, tagatose, allose, altrose, glucose, mannose, gulose, idose, galactose, talose, fucose, fuculose, rhamnose, sedoheptulose, and digitoxose; disaccharides such as sucrose, lactose, maltose, trehalose, isotrehalose, isosaccharose, turanose, cellobiose, palatinose, gentiobiose, melibiose, and sophorose; trisaccharides such as raffinose, melezitose, gentianose, planteose, maltotriose, cellotriose, manninotriose, and panose; tetrasaccharides such as acarbose, stachyose, cellotetraose, and scorodose; polysaccharides such as glycogen, starch, amylose, amylopectin, cellulose, dextrin, dextran, glucan, fructose, N-acetylglucosamine, chitin, chitosan, charonin, laminaran, inulin, levan, ivory nut mannan, xylan, actinospectinoic acid, alginic acid, guaran, mannan, heparin, chondroitin sulfuric acid, hyaluronic acid, and pullulan; sugar alcohol such as erythritol, maltitol, and sucrose; and oligosaccharides such as cyclodextrin. Examples of the sugar alcohol include the above-described glycerin, the above-described sorbitol, the above-described xylitol, and the above-described mannitol.

The polyamine component is a compound having two or more amino groups, and examples thereof include aromatic polyamines, aralkyl polyamines, alicyclic polyamines, aliphatic polyamines, alkoxysilyl compounds having a primary amino group, or a primary amino group and a secondary amino group, and polyoxyethylene group-containing polyamines.

Examples of aromatic polyamines include 4,4'-diphenylmethanediamine, and tolylenediamine.

Examples of aralkyl polyamine include 1,3- or 1,4-xylylene diamine and mixtures thereof.

Examples of alicyclic polyamines include 3-aminomethyl-3,5,5-trimethylcyclohexylamine (also called: isophoronediamine), 4,4'-dicyclohexylmethanediamine, 2,5(2,6)-bis(aminomethyl) bicyclo[2.2.1]heptane, 1,4-cyclohexanediamine, 1-amino-3-aminomethyl-3,5,5-trimethylcyclohexane, bis-(4-aminocyclohexyl) methane, diaminocyclohexane, 3,9-bis(3-aminopropyl)-2,4,8,10-tetraoxaspiro[5,5]undecane, 1,3- and 1,4-bis(aminomethyl) cyclohexane and mixtures thereof.

Examples of the aliphatic polyamine include ethylenediamine, propylene diamine, 1,3-propane diamine, 1,4-butanediamine, 1,5-pentanediamine, 1,6-hexamethylenediamine, hydrazine (including hydrate), diethylenetriamine, triethylenetetramine, tetraethylenepentamine, 1,2-diaminoethane, 1,2-diaminopropane, and 1,3-diaminopentane.

Examples of alkoxysilyl compound having a primary amino group, or a primary amino group and a secondary amino group include alkoxysilyl group-containing monoamine such as γ-aminopropyltriethoxysilane, and N-phenyl-γ-aminopropyltrimethoxysilane; N-β(aminoethyl) γ-aminopropyltrimethoxysilane; and N-β(aminoethyl) γ-aminopropylmethyldinethoxysilane.

Examples of polyoxyethylene group-containing polyamines include polyoxyalkylene ether diamine such as polyoxyethylene ether diamine. To be more specific, examples thereof include PEG#1000 diamine manufactured by NOF Corporation, Jeffamine ED-2003, EDR-148, and XTJ-512 manufactured by Huntsman Inc.

These polyamine components may be used singly or in combination of two or more.

Examples of the active hydrogen group-containing compound component further include a hydroxyl-amino groups containing component.

The hydroxyl-amino groups containing component is a compound having one or more hydroxyl group and one or more amino group, and examples thereof include amino alcohols such as monoethanolamine and N-(2-aminoethyl)ethanolamine.

Examples of the hydroxyl-amino groups containing component further include naturally derived hydroxyl-amino groups containing components, to be specific, amino acids.

Examples of amino acids include alanine, arginine, asparagine, aspartic acid, cystein, cystine, methionine, glutamine, glutamic acid, glycin, histidine, isoleucine, leucine, lysine, hydroxylysine, phenylalanine, proline, serine, threonin, tryptophan, oxyproline, hydroxyproline, tyrosine, valine, glucosamine, monatin, taurine, β-alanine, β-aminopropionic acid, γ-aminobutyric acid, anthranilic acid, aminobenzoic acid, thyroxine, phosphoserine, desmosine, ornithine, creatine, and theanine.

These hydroxyl-amino groups containing components may be used singly or in combination of two or more. The hydroxyl-amino groups containing component can also be used, for example, for adjusting the molecular weight of polyurethane resin.

For the active hydrogen group-containing compound, other than the above-described examples, examples also include phenol resins typically represented by novolak and cresol; polyphenols; polylactic acid; polyglycolic acid; lactic acid; and a copolymer of glycol acid.

Examples of the active hydrogen group-containing compound component further include naturally derived active hydrogen compound components, such as, for example, urushiol, curcumine, lignin, cardanol, cardol, 2-methylcardol, 5-hydroxymethylfurfural, resorcinol, catechol, pyrogallol, terpene, laccol, thitsiol, phenol, naphthol, acetyl-CoA (acetyl coenzyme A), acetoacetyl-CoA (acetoacetyl coenzyme A), D-(−)-3-hydroxybutyryl-CoA, succinyl-CoA, (R)-3-hydroxybutyrate, isoeugenol, polybutylenesuccinateadipate, polyhydroxybutyrate, sophorolipid, and emulsan.

Examples of the naturally described active hydrogen group-containing compound component further include acids such as fatty acids.

Examples of the fatty acid include sebacic acid, azelaic acid, fumaric acid, succinic acid, oxalacetic acid, itaconic acid, mesaconic acid, citraconic acid, malic acid, citric acid, isocitric acid, gluconic acid, gallic acid, tartaric acid, undecylenic acid, 11-aminoundecanoic acid, hepthylic acid, 12-hydroxystearic acid, 12-hydroxydodecanoic acid, linolenic acid, linoleic acid, ricinoleic acid, oleic acid, crotonic acid, myristoleic acid, palmitoleic acid, elaidic acid, vaccenic acid, gadoleic acid, eicosene acid, erucic acid, nervonic acid, 3-hydroxybutyric acid, levulinic acid, abietic acid, neoabietic acid, palustric acid, pimaric acid, isopimaric acid, dehydroabietic acid, anacardic acid, palmitic acid, 3-hydroxypropionic acid, 3-hydroxyhexanoic acid, 3-hydroxyvaleric acid, 3-hydroxybutanoic acid, 4-hydroxybutanoic acid, pyruvic acid, phosphoenolpyruvic acid, glyoxalic acid, oxoglutaric acid, dihydroxyacetonephosphoric acid, and spiculisporic acid.

For the active hydrogen group-containing compound component, when the molecular weight of the polyurethane resin is to be adjusted, monol and/or monamine can be used in combination at a suitable ratio.

Examples of the monol include methanol, ethanol, propanol, isopropanol, butanol, 2-ethylhexylalcohol, other alkanols (C 5 to 38), and aliphatic unsaturated alcohols (C 9 to 24), alkenyl alcohol, 2-propene-1-ol, alkadienols (C 6 to 8), and 3,7-dimethyl-1,6-octadiene-3-ol.

These monols may be used singly or in combination of two or more.

Examples of the monoamine include dimethylamine, diethylamine, di-n-propylamine, diisopropylamine, di-n-butylamine, diisobutylamine, di-t-butylamine, dihexylamine, 2-ethylhexylamine, 3-methoxypropylamine, 3-ethoxypropylamine, 3-(2-ethylhexyloxypropylamine), 3-(dodecyloxy)propylamine, and morpholine.

These monoamines may be used singly or in combination of two or more.

These active hydrogen group-containing compound components may be used singly or in combination of two or more.

The production method of the polyurethane resin is not particularly limited, as long as the polyurethane resin can be prepared to introduce the active hydrogen group (e.g., hydroxyl group, amino group, etc.) at its molecular terminal, and a known method is used. For such a method, preferably, a prepolymer method is used.

In the prepolymer method, for example, first, the isocyanate component and a portion of the active hydrogen group-containing compound component are allowed to react, thereby synthesizing an isocyanate group-terminated prepolymer having an isocyanate group at its molecular terminal.

In the synthesis of the isocyanate group-terminated prepolymer, for the isocyanate component, preferably, the above-described alicyclic polyisocyanate, more preferably bis(isocyanatomethyl) cyclohexane (1,3- or 1,4-bis(isocyanatomethyl) cyclohexane or a mixture thereof) ($H_6XDI$) is used.

In the synthesis of the isocyanate group-terminated prepolymer, preferably, a high-molecular weight polyol (and as necessary, a low-molecular-weight polyol) is used as the portion of the active hydrogen group-containing compound component. For the high-molecular weight polyol, preferably, polyester polyol is used, and for the low-molecular-weight polyol blended as necessary, preferably, dihydric alcohol and tertiary amino group-containing diol are used in combination.

When the high-molecular weight polyol and the low-molecular-weight polyol are used in combination for the active hydrogen group-containing compound component, the mixing ratio thereof is as follows: 80 parts by mass or more, preferably, 90 parts by mass or more, and usually below 100 parts by mass of the high-molecular weight polyol, and 20 parts by mass or less, preferably, 10 parts by mass or less, and usually more than 0 parts by mass of the low-molecular-weight polyol relative to 100 parts by mass of the total amount of the high-molecular weight polyol and the low-molecular-weight polyol.

To synthesize the isocyanate group-terminated prepolymer, the isocyanate component and the portion of the active hydrogen group-containing compound component are formulated (mixed) so that the equivalent ratio R (NCO/active hydrogen group) of the isocyanate group in the isocyanate component relative to the active hydrogen group in the portion of the active hydrogen group-containing compound component is, for example, 1.1 to 5.5, preferably 1.3 to 4.5, even more preferably 1.5 to 3.5; and allowed to react in a reaction vessel until reaching a predetermined isocyanate group concentration (described later), at for example, room temperature to 150° C., preferably 50 to 120° C., and for example, 0.5 to 18 hours, preferably 2 to 10 hours.

In this reaction, preferably, a urethanizing catalyst is added.

Examples of the urethanizing catalyst include amines, organometallic compounds, and potassium salts.

Examples of amines include tertiary amines such as triethylamine, triethylenediamine, bis-(2-dimethylaminoethyl) ether, and N-methylmorpholine; quaternary ammonium salts such as tetraethyl hydroxyl ammonium; and imidazoles such as imidazole and 2-ethyl-4-methylimidazole.

Examples of the organometallic compound include organotin compounds such as tin acetate, tin octylate, tin oleate, tin laurate, dibutyl tin diacetate, dimethyl tin dilaurate, dibutyl tin dilaurate, dibutyl tin dimercaptide, dibutyl tin maleate, dibutyl tin dilaurate, dibutyl tin dineodecanoate, dioctyl tin dimercaptide, dioctyl tin dilaurate, and dibutyl tin dichloride; organic lead compounds such as lead octanoate and lead naphthenate; organic nickel compounds such as nickel naphthenate; organic cobalt compounds such as cobalt naphthenate; organocopper compounds such as octenate copper; and organic bismuth compounds such as bismuth octylate and bismuth neodecanoate.

Examples of the potassium salt include potassium carbonate, potassium acetate, and potassium octylate.

These urethanizing catalysts may be used singly or in combination of two or more.

The mixing ratio of the urethanizing catalyst relative to the total amount of the isocyanate component and the active hydrogen group-containing compound component is, for example, 1 to 5000 ppm, preferably 2 to 3000 ppm.

Furthermore, in this method, the isocyanate component and the active hydrogen group-containing compound component can also be allowed to react in the organic solvent.

Examples of organic solvents include ketones such as acetone, methyl ethyl ketone, methyl isobutyl ketone, and cyclohexanone; nitriles such as acetonitrile; alkyl esters such as methyl acetate, ethyl acetate, butyl acetate, and isobutyl acetate; aliphatic hydrocarbons such as n-hexane, n-heptane, and octane; alicyclic hydrocarbons such as cyclohexane and methylcyclohexane; aromatic hydrocarbons such as toluene, xylene, and ethylbenzene; glycol ether esters such as methyl cellosolve acetate, ethyl cellosolve acetate, methyl carbitol acetate, ethyl carbitol acetate, ethylene glycol ethylether acetate, propylene glycol methylether acetate, 3-methyl-3-methoxybutyl acetate, and ethyl-3-ethoxypropionate; ethers such as diethylether, tetrahydrofuran, and dioxane; halogenated aliphatic hydrocarbons such as methyl chloride, methylene chloride, chloroform, carbon tetrachloride, methyl bromide, methylene iodide, and dichloroethane; polar aprotic solvents such as N-methyl pyrrolidone, dimethylformamide, N,N'-dimethylacetamide, dimethyl sulfoxide, and hexamethyl phosphoramide.

Examples of organic solvents also include nonpolar solvents (nonpolar organic solvents), and examples of nonpolar solvents include those nonpolar organic solvents having an aniline point of, for example, 10 to 70° C., preferably 12 to 65° C. and having low toxicity and solvency, such as aliphatic, naphthene hydrocarbon organic solvent; and vegetal oils typically represented by turpentine oil.

These organic solvents may be used singly or in combination of two or more.

The mixing ratio of the organic solvent is not particularly limited, and is set suitably in accordance with the purpose and application.

After the completion of reaction, as necessary, unreacted isocyanate components can be removed, for example, by a known removal method, such as distillation or extraction.

When the organic solvent is further blended, the organic solvent after the reaction of the isocyanate component and the active hydrogen group-containing compound component can be removed by, for example, a known removal method such as distillation or extraction.

The thus obtained isocyanate group-terminated prepolymer has a number average molecular weight (measurement method: GPC method (polystyrene standard calibration)) of, for example, 1000 to 30000, preferably 2000 to 20000, and an isocyanate group equivalent of, for example, 500 to 15000, preferably 1000 to 10000.

The isocyanate group-terminated prepolymer has unreacted (free) isocyanate component content of, for example, 0.01 to 5 mass %, preferably 0.05 to 3 mass %.

The isocyanate group equivalent is the same as the amine equivalent, and can be determined in accordance with method A or method B of JIS K 1603-1 (2007). The unreacted isocyanate component content can be determined, for example, by HPLC measurement.

The isocyanate group-terminated prepolymer has an isocyanate group content (isocyanate group content, NCO %) of, for example, 0.3 to 8 mass %, preferably 0.6 to 4 mass %.

Next, in this method, the produced isocyanate group-terminated prepolymer is allowed to react with the remaining portion of the active hydrogen group-containing compound component. In the prepolymer method, the remaining portion of the active hydrogen group-containing compound component is used as a chain extender.

For the remaining portion of the active hydrogen group-containing compound component (chain extender), preferably, a polyamine component is used, and more preferably alicyclic polyamine is used.

When the polyamine component is used as the remaining portion of the active hydrogen group-containing compound component (chain extender), a polyurethane resin in which an amino group is introduced as a free active hydrogen group at its molecular terminal, that is, a polyurethane resin in which at least a portion of the active hydrogen groups of the free active hydrogen groups at its molecule terminal is an amino group, and preferably, a polyurethane resin in which all of the active hydrogen groups are amino groups can be obtained.

When the free active hydrogen groups of the polyurethane resin molecule terminal contains an amino group, suitable pot life can be obtained after blending the two components of the base resin and the curing agent.

For the remaining portion of the active hydrogen group-containing compound component (chain extender), to adjust the molecular weight of the polyurethane resin, the polyamine component and the hydroxyl-amino groups containing component can be used in combination.

When the polyamine component and the hydroxyl-amino groups containing component are used in combination as the remaining portion of the active hydrogen group-containing compound component (chain extender), their mixing ratios are as follows: for example, 10 parts by mass or more, preferably 60 parts by mass or more, and usually below 100 parts by mass of the polyamine component, and for example, 90 parts by mass or less, preferably, 40 parts by mass or less, and usually more than 0 parts by mass of the hydroxyl-amino groups containing component relative to 100 parts by mass of the polyamine component and the hydroxyl-amino groups containing component in total.

When the mixing ratios of the polyamine component and the hydroxyl-amino groups containing component are in the above-described range, a polyurethane resin in which an amino group is introduced at its molecular terminal as a free active hydrogen group can be obtained.

To allow the isocyanate group-terminated prepolymer and the remaining portion of the active hydrogen group-containing compound component (chain extender) to react with each other, the isocyanate group-terminated prepolymer and the remaining portion of the active hydrogen group-containing compound component (chain extender) are formulated (mixed) so that equivalent ratio R (NCO/active hydrogen group) of the isocyanate group in the isocyanate group-terminated prepolymer relative to the active hydrogen group in the remaining portion of the active hydrogen group-containing compound component (chain extender) is, for example, more than 0.75, preferably more than 0.9, and below 1, and are allowed to react at, for example, room temperature to 250° C., preferably room temperature to 200° C., for, for example, 5 minutes to 72 hours, preferably 1 to 24 hours.

In this manner, the polyurethane resin having an active hydrogen group can be prepared.

The produced polyurethane resin has a number average molecular weight (measurement method: GPC method (polystyrene standard calibration)) of, for example, 3000 to 100000, preferably 5000 to 50000, and the amine value of, for example, 0.1 to 20 mgKOH/g, preferably 0.2 to 15 mgKOH/g, more preferably 2 to 6 mgKOH/g.

When the polyurethane resin has an amine value in the above-described range, physical properties such as surface tackiness, weather resistance, and moisture resistance of an ink cured product produced by curing the ink prepared from the above-described base resin, the curing agent (described later), and a pigment can be improved.

The amine value of the polyurethane resin can be determined based on the amine equivalent.

Although the production method of the polyurethane resin is described using the prepolymer method as an example, the production method of the polyurethane resin is not particularly limited, as long as a polyurethane resin having an active hydrogen group (preferably, amino group) at its molecular terminal can be produced, and for example, a known method such as one shot method can also be used.

The base resin may contain at least the above-described polyurethane resin, and may contain other base resin components.

Examples of the base resin include, to be specific, the above-described active hydrogen group-containing compound component.

When other base resins are contained, the mixing ratio of the polyurethane resin and of the other base resin are as follows: for example, 10 to 95 parts by mass, preferably 30 to 80 parts by mass of the polyurethane resin, and for example, 5 to 90 parts by mass, preferably, 20 to 70 parts by mass of the other base resin relative 100 parts by mass of their total.

The thus obtained base resin can be used as is. That is, the base resin can be used after removing the organic solvent from the polyurethane resin (further as necessary other base resins) produced as described above, and furthermore, can be used as a solution without removing the organic solvent. Furthermore, the polyurethane resin (further as necessary other base resin) produced as described above can be diluted with the above-described organic solvent, and used as a solution.

When the base resin is used as a solution, its solid content concentration is, for example, 20 to 80 mass %, preferably 30 to 70 mass %.

The base resin has a viscosity (25° C.) of, for example, 50 to 20000 mPa·s, preferably 100 to 10000 mPa·s.

The curing agent contains the polyisocyanate composition of the present invention, and preferably, consists of the polyisocyanate composition of the present invention.

The curing agent may contain other curing agent component to the extent that does not hinder excellent effects of the present invention.

Examples of the other curing agent component include the above-described polyisocyanate monomers (e.g., aromatic polyisocyanate, aralkyl polyisocyanate, aliphatic polyisocyanate, etc.), and their polyisocyanate derivatives.

When the polyisocyanate component contains other polyisocyanate, the other polyisocyanate content is more than 0 mass %, and for example, 50 mass % or less, preferably, 30 mass % or less.

The curing agent has an isocyanate group concentration of, for example, 7 to 30 mass %, preferably 8 to 20 mass %, more preferably 8 to 17 mass %, and most preferably 9 to 14 mass %.

When the curing agent has the isocyanate group concentration in the above-described range, physical properties such as surface tackiness, weather resistance, and moisture resistance of an ink cured product produced by curing an ink prepared from the base resin, curing agent, and pigment can be improved.

The isocyanate group concentration of the curing agent can be measured by n-dibutylamine method (in conformity with JIS K-1556 (2006)).

The curing agent can be used as is. That is, the curing agent can be used by removing the organic solvent from the above-described polyisocyanate composition (further as necessary other curing agent component), and furthermore, can be used as a solution without removing the organic solvent. Furthermore, the above-described polyisocyanate composition (further as necessary other curing agent component) is diluted with the above-described organic solvent, and used as a solution.

When the curing agent is used as a solution, its solid content concentration is, for example, 50 to 95 mass %, preferably 75 to 95 mass %.

The curing agent has a viscosity (25° C.) of, for example, 50 to 7000 mPa·s, preferably 100 to 4000 mPa·s.

The binder for ink is prepared from the above-described base resin and the above-described curing agent.

In the binder for ink, the mass ratio of the curing agent to the base resin is, for example, 0.05 to 20 parts by mass, preferably 0.1 to 5 parts by mass of the curing agent (when the curing agent is used as a solution, including the organic solvent) relative to 100 parts by mass of the base resin (when the base resin is used as a solution, including the organic solvent), and the solid content in the curing agent is, for example, 0.1 to 60 parts by mass, preferably 0.2 to 20 parts by mass relative to 100 parts by mass of the solid content in the base resin.

The mixing ratio of the curing agent to the base resin is adjusted so that equivalent ratio R (NCO/active hydrogen group) of the isocyanate group in the curing agent relative to the active hydrogen group in the base resin is, for example, 1.1 to 2.4, preferably 1.2 to 1.9.

To the binder for ink, as necessary, known additives can be blended: for example, heat resistant stabilizers, lubricants, plasticizers, anti-blocking agents, antioxidants, ultraviolet ray absorbers, light resistant stabilizers, releasing agents, fillers, hydrolysis prevention agents, and fire retardants.

The mixing ratio of the additive is set suitably in accordance with the purpose and application.

Such additives can be added in advance to both or one of the base resin and the curing agent, or can be added separately at the time of blending the base resin and the curing agent.

When additives are added to the base resin and/or the curing agent, the additives can be added to each of the reaction ingredients in preparation of the components, to be specific, in preparation of the polyurethane resin in the base resin, and of the polyisocyanate composition in the curing agent, and furthermore, the additives can be added to the polyurethane resin or the polyisocyanate composition after the reaction.

Then, by mixing the above-described binder for ink with the pigment, an ink can be obtained.

The pigment is not particularly limited, and a known pigment may be used. Examples of the pigment include, to be specific, organic pigments of phthalocyanine, azo, condensation azo, anthraquinone, quinacridon, indigo, and perylene types; and inorganic pigments of titanium oxide, carbon black, red iron oxide, and ultramarine types.

These pigments may be used singly or in combination of two or more.

The mixing ratios of the binder for ink and the pigment are as follows: for example, 1 to 500 parts by mass, preferably, 2 to 200 parts by mass of the pigment relative to 100 parts by mass of the base resin (when the base resin is used as a solution, including the organic solvent) in the binder for ink, and for example, 2 to 1500 parts by mass, preferably, 4 to 500 parts by mass of the pigment relative to 100 parts by mass of the solid content in the base resin.

To the ink, as necessary, the above-described organic solvent can be blended, and the ink has a resin solid content of, for example, 2 to 40 mass %, preferably 5 to 20 mass %.

To the ink, as necessary, the above-described known additives can be blended at a suitable proportion. The additives can be added in advance as described above to the binder for ink, and also can be added separately at the time of blending the binder for ink and the pigment.

The produced ink can be applied to a base to which application or printing is conducted (e.g., substrate or support, etc.) by using a known application and printing method, for example, brush painting, roll coating, bar coating, application with a dispenser, and screen printing.

Then, by curing the ink, an ink cured product can be obtained.

The ink can be cured by any method without limitation, and for example, the ink can be applied to a base as described above, and dried at, for example, 25 to 80° C., preferably 30 to 60° C., for 0.5 to 30 minutes, preferably 1 to 10 minutes. Thereafter, as necessary, curing (aging process) is conducted under the conditions of a relative humidity (RH) of, for example, 30 to 80%, preferably 45 to 55%, at, for example, 23 to 60° C., preferably 23 to 40° C., for, for example, 1 to 14 days, preferably 1 to 7 days.

The ink cured product can be obtained in this manner.

The binder for ink of the present invention is produced by using the polyisocyanate composition of the present invention, and therefore has excellent physical properties.

To be specific, with the above-described ink produced by using the binder for ink, an ink cured product with reduced surface tackiness, and excellent durability and adherence can be obtained.

Pentamethylenediamine or its salt obtained by such a method can be suitably used, for example, as a material for production (monomer material for polymerization) of, for example, polyimide, polyamide, and polyamide-imide, and as a curing agent such as polyurethane and epoxy resin.

EXAMPLES

In the following, the present invention will be described in detail with reference to Examples and Comparative Examples. However, the present invention is not limited thereto. The "parts" and "%" are based on mass unless otherwise specified. The measurement methods used in Production Examples are described below.

<Isocyanate Group Concentration (Unit: Mass %)>

The isocyanate group concentration of the polyisocyanate composition is measured by n-dibutylamine method using a potentiometric titrator in conformity with JIS K-1556.

<Viscosity (Unit: mPa·s)>

The viscosity at 25° C. was measured by using E type viscometer TV-30 (rotor: 1° 34'×R24, rotation speed: selected from the range of 0.1 to 10 rpm so that the measurement range is 20 to 80%) manufactured by TOKI Sangyo Co., Ltd.

<Monomolecular Body/Bimolecular Body> a polyisocyanate composition in an amount of 30 mg was dissolved in 10 ml of tetrahydrofuran, and a gel permeation chromatogram (GPC) was made with the following device and conditions. An example of a gel permeation chromatogram of a polyisocyanate composition is shown in FIG. 3.

As shown in FIG. 3, in the produced chromatogram, the peak for the molecular weight (polyethylene oxide standard calibration) of 450 to 800 is assigned as a peak for the trimethylolpropane-monomolecular-body, and the peak for the molecular weight (polyethylene oxide standard calibration) of 950 to 1500 is assigned as a peak for the trimethylolpropane-bimolecular-body. Then, the ratio of the peak area of trimethylolpropane-monomolecular-body relative to the peak area of trimethylolpropane-bimolecular-body is calculated, and based on the formula below, the molar ratio of trimethylolpropane-monomolecular-body relative to trimethylolpropane-bimolecular-body contained was calculated.

$$\text{Monomolecular body/bimolecular body} = \text{area of monomolecular body/area of bimolecular body}$$

Device: HLC-8220GPC (manufactured by Tosoh Corporation)
Column: TSKgelG1000HXL, TSKgelG2000HXL, and TSKgelG3000HXL (manufactured by Tosoh Corporation) are connected in series
Device: Refractive Index Detector
Measurement Conditions
Injection Amount: 100 μL
Eluent: Tetrahydrofuran
Flow Rate: 0.8 mL/min
Temperature: 40° C.
Calibration Curve: Standard polyethylene oxide (manufactured by Tosoh Corporation, trade name: TSK standard polyethylene oxide) in the range of 106 to 22450

<Hydroxyl Number (Unit: mgKOH/g)>

The hydroxyl number of polyol was measured in conformity with method A (acetylation method) of JIS K1557-1.

<Amine Value (Unit: mgKOH/g)>

The amine value of polyurethane resin was obtained as follows: a sample was dissolved in 20 mL of ethanol; titration is performed with 0.2N ethanol-based hydrochloric acid solution; and the amine value of polyurethane resin was calculated based on the following formula.

Amine value=$(A \times f \times 0.2 \times 56.1)/M$

M: Sample weight
f: Titre of 0.2N ethanol-based hydrochloric acid solution
A: Titration Amount
Polyisocyanate Composition
[Production of bis(isocyanatomethyl) cyclohexane]

Production Example 1 (Production of 1,4-bis(isocyanatomethyl) cyclohexane 1 (hereinafter abbreviated as 1,4-BIC1))

A reactor equipped with a stirrer, a gas inlet tube, a thermometer, a gas purge line, and a dehydrator was charged with 286.6 parts by mass of 1,4-cyclohexanedicarboxylic acid, 55.7 parts by mass of N,N'-dimethylimidazolidinone, and 3.6 parts by mass of tin oxide (II); and while stirring, ammonia gas and nitrogen were allowed to mixedly pass through at a speed of 90 mL/min (0.14 mol equivalent/1,4-cyclohexanedicarboxylic acid/hr) and at 10 mL/min, respectively. After the temperature was increased to 280° C., the temperature was kept constant to allow the mixture to react. The reaction was terminated after 48 hours at that temperature, and cooling was performed to 90° C.

Then, 520 parts by mass of 1-butanol was added to the reaction product and stirred; the mixture was subjected to hot filtration, thereby removing the catalyst. The filtrate was analyzed by gas chromatography, and it was found that the yield of 1,4-dicyanocyclohexane was 86%.

Then, the filtrate produced in the above-described operation was cooled while stirring to room temperature: this caused precipitation. The suspension liquid was filtered to produce residue. To the residue, 230 parts by mass of 1-butanol was added and the mixture was stirred at 90° C. for 1 hour. After the stirring, the mixture was cooled to room temperature while stirring: this caused precipitation again. The suspension liquid was filtered, and washed with 1-butanol twice. Thereafter, residue was dried, thereby producing 100 parts by mass of while solid (yield 45%).

Gas chromatography analysis showed that the solid was 1,4-dicyanocyclohexane with purity of 99.5% or more, and the result of $^{13}$C-NMR analysis showed that the trans isomer/cis isomer ratio was 99/1.

Then, a pressure reactor equipped with a stirrer was charged with 550 parts by mass of the above-described 1,4-dicyanocyclohexane having a trans isomer/cis isomer ratio of 99/1, 30 parts by mass of catalyst (Raney nickel manufactured by Kawaken Fine Chemicals Co., Ltd.), 560 parts by mass of 28 wt % ammonia water, and 1200 parts by mass of 1-butanol; and nitrogen was introduced at 5 MPa from the nozzle port of the reactor for conducting replacement three times, and while stirring at 400 rpm under normal pressure, the temperature was increased to 80° C.

When the temperature reached 80° C., hydrogen supply was started so that the pressure was 4 MPa, and reaction was conducted until no hydrogen absorption was observed. The reaction time was 4 hours.

After completion of reaction, the temperature was reduced to room temperature, and after discharging the reaction product liquid, the reaction product liquid was filtered to remove the catalyst.

The filtrate was subjected to gas chromatography analysis, and the result showed that the conversion rate of 1,4-dicyanocyclohexane was 100%, the yield of 1,4-bis (aminomethyl) cyclohexane was 98%, and the trans isomer/cis isomer ratio analyzed with $^{13}$C-NMR was 97/3.

The reaction solution was subjected to reduced-pressure distillation at 10 mmHg, and 1,4-bis(aminomethyl) cyclohexane having a purity of 99.5% or more and a trans/cis ratio of 97/3 was produced with a 92% yield. Using the 1,4-bis (aminomethyl) cyclohexane as an ingredient, cold/hot two-stage phosgenation process was conducted under pressure.

That is, a pressurized reactor with jacket equipped with an electromagnetic induction stirrer, an automatic pressure regulating valve, a thermometer, a nitrogen inlet line, a phosgene inlet line, a condenser, and an ingredient feed pump was charged with 6000 parts by mass of o-dichlorobenzene. Then, 3420 parts by mass of phosgene was added from the phosgene inlet line, and stirring was started. Cold water was allowed to go through the reactor jacket so that the internal temperature was kept to about 10° C. Then, a solution of 960 parts by mass of 1,4-bis(aminomethyl) cyclohexane dissolved in 6000 parts by mass of o-dichlorobenzene was fed through the feed pump taking 60 minutes, and cold phosgenation was started at 30° C. or less and under normal pressure. After the completion of the feed, a light-brown white slurry was formed in the flask.

Then, while the temperature of the internal liquid of the reactor was increased to 140° C. in 60 minutes, the pressure was increased to 0.25 MPa, and further hot phosgenation was performed under a pressure of 0.25 MPa, and at a reaction temperature of 140° C. for two hours. During the hot phosgenation, 960 parts by mass of phosgene was further added. In the process of the hot phosgenation, the internal liquid of the flask became light-brown clear solution. After completion of hot phosgenation, at 100 to 140° C., nitrogen gas was allowed to pass through at 100 L/hour, and degassing was performed.

Next, the o-dichlorobenzene solvent was distilled off under reduced pressure, and thereafter, using a rectifying column, the remainder was further rectified with refluxing under the conditions of 138 to 143° C. and 0.7 to 1 KPa, to produce 900 parts by mass of 1,4-BIC1: the rectifying column was provided with a glass flask equipped with a distillation tube filled with four elements of packing (manufactured by Sumitomo Heavy Industries Ltd., trade name: Sumitomo/Sulzer Labo Packing EX), a distillation column equipped with a reflux ratio control timer (manufactured by Sibata Scientific Technology Ltd., trade name: distillation column K type), and a condenser.

The thus produced 1,4-BIC1 had a purity based on gas chromatography measurement of 99.9/% a color based on APHA measurement of 5, and a trans/cis ratio based on $^{13}$C-NMR measurement of 97/3.

Production Example 2 (Production of 1,4-bis(isocyanatomethyl) cyclohexane 2 (hereinafter referred to as 1,4-BIC2))

Using 1,4-bis(aminomethyl) cyclohexane (manufactured by Tokyo Chemical Industry Co., Ltd.) having a trans/cis ratio of 41/59 based on $^{13}$C-NMR measurement as an ingredient, 388 parts by mass of 1,4-BIC2 was produced in the same manner as in Production Example 1. The thus produced 1,4-BIC 2 had a purity based on gas chromatography measurement of 99.9%, a color based on APHA measurement of 5, and a trans/cis ratio based on $^{13}$C-NMR measurement of 41/59.

Production Example 3 (Production of 1,4-bis(isocyanatomethyl) cyclohexane 3 (hereinafter referred to as 1,4-BIC3))

A four-neck flask equipped with a mixer, a thermometer, a reflux pipe, and a nitrogen inlet tube was charged with 185.7 parts by mass of 1,4-BIC1 of Production Example 1 and 14.3 parts by mass of 1,4-BIC2 of Production Example 2, and the mixture was stirred in a nitrogen atmosphere, at room temperature for 1 hour. The thus produced 1,4-BIC 3 had a purity based on gas chromatography measurement of 99.9%, a color based on APHA measurement of 5, and a trans/cis ratio based on $^{13}$C-NMR measurement of 93/7.

Production Example 4 (Production of 1,4-bis(isocyanatomethyl) cyclohexane 4 (hereinafter referred to as 1,4-BIC4))

1,4-BIC4 was produced in the same manner as in Production Example 3, except that 160.7 parts by mass of 1,4-BIC1 of Production Example 1, 39.3 parts by mass of 1,4-BIC2 of Production Example 2 were used. The thus produced 1,4-BIC4 had a purity based on gas chromatography measurement of 99.9%, a color based on APHA measurement of 5, and a trans/cis ratio based on $^{13}$C-NMR measurement of 86/14.

Production Example 5 (Production of 1,4-bis(isocyanatomethyl) cyclohexane 5 (hereinafter referred to as 1,4-BIC5))

1,4-BIC5 was produced in the same manner as in Production Example 3, except that 146.4 parts by mass of 1,4-BIC1 of Production Example 1 and 53.6 parts by mass of 1,4-BIC2 of Production Example 2 were used. The thus produced 1,4-BIC5 had a purity based on gas chromatography measurement of 99.9%, a color based on APHA measurement of 5, and a trans/cis ratio based on $^{13}$C-NMR measurement of 82/18.

Production Example 6 (Production of 1,4-bis(isocyanatomethyl) cyclohexane 6 (hereinafter referred to as 1,4-BIC6))

1,4-BIC6 was produced in the same manner as in Production Example 3, except that 121.4 parts by mass of 1,4-BIC1 of Production Example 1 and 78.6 parts by mass of 1,4-BIC2 of Production Example 2 were used. The thus produced 1,4-BIC6 had a purity based on gas chromatography measurement of 99.9%, a color based on APHA MEASUREMENT OF 5, and a trans/cis ratio based on $^{13}$C-NMR measurement of 75/25.

Example 1 (Production of Polyisocyanate Composition (a))

Urethane-forming reaction was conducted setting the equivalent ratio (NCO/OH) of the isocyanate group in the 1,3-bis(isocyanatomethyl) cyclohexane (TAKENATE 600 manufactured by Mitsui Chemicals, hereinafter referred to as 1,3-BIC) relative to the hydroxyl group in the trimethylolpropane (hereinafter referred to as TMP) to 5.4, and the reaction molar ratio of bis(isocyanatomethyl) cyclohexane relative to trimethylolpropane (bis(isocyanatomethyl) cyclohexane/trimethylolpropane)(hereinafter referred to as BIC/TMP) to 8.1.

That is, a dropping funnel was charged with 17.1 parts by mass of TMP, and heated with a ribbon heater, thereby dissolving TMP. Then, a four-neck flask equipped with a mixer, a thermometer, a reflux pipe, and a nitrogen inlet tube was charged with 200 parts by mass of 1,3-BIC, and the temperature was increased to 75° C. in a nitrogen atmosphere while stirring. Next, the dissolved TMP was dropped taking about 60 minutes, and after finishing the dropping, the temperature was increased to 80° C. Thereafter, the reaction was continued until the isocyanate group concentration reached the calculated value. The produced reaction liquid was allowed to pass through a thin film distillation device (degree of vacuum 50 Pa, temperature 150° C.) to remove the unreacted 1,3-BIC, and then ethyl acetate was further added so that the solid content concentration (hereinafter referred to as NV) was 75 mass %, thereby producing polyisocyanate composition (a).

The produced polyisocyanate composition (a) had an isocyanate group concentration of 11.2%, a viscosity of 2120 mPa·s/25° C., and NV of 75.2%.

The mole ratio (hereinafter referred to as monomolecular body/bimolecular body) of a polyisocyanate (trimethylolpropane-monomolecular-body (hereinafter referred to as monomolecular body)) produced by reaction of one molecule of TMP and three molecules of bis(isocyanatomethyl) cyclohexane relative to a polyisocyanate (trimethylolpropane-bimolecular-body (hereinafter referred to as bimolecular body)) produced by reaction of two molecules of TMP and five molecules of bis(isocyanatomethyl) cyclohexane contained was 2.0, and the average number of the isocyanate groups was 3.6.

Examples 2 and 3 (Production of Polyisocyanate Compositions (b) and (c))

Polyisocyanate compositions (b) and (c) were produced in the same manner as in Example 1, except that the equivalent ratio was changed as shown in Table 1. Table 1 shows the equivalent ratio (NCO/OH), reaction molar ratio (BIC/TMP), isocyanate group concentration, viscosity, NV, monomolecular body/bimolecular body, and average number of the isocyanate groups.

Example 4 (Production of Polyisocyanate Composition (d))

Polyisocyanate composition (d) was produced in the same manner as in Example 1, except that 1,4-BIC4 was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and the average number of the isocyanate groups.

Example 5 (Production of Polyisocyanate Composition (e))

Polyisocyanate composition (e) was produced by mixing polyisocyanate composition (c) and polyisocyanate composition (d) so that the polyisocyanate composition (e) had a solid content: 5 mass % of the solid content was derived from polyisocyanate composition (c) and 95 mass % of the solid content was derived from polyisocyanate composition (d). Table 1 shows the equivalent ratio (NCO/OH), reaction molar ratio (BIC/TMP), isocyanate group concentration, viscosity, NV, monomolecular body/bimolecular body, and average number of the isocyanate groups.

Example 6 (Production of Polyisocyanate Composition (f))

Polyisocyanate composition ($f_0$) was produced in the same manner as in Example 1, except that 1,4-BIC4 was used instead of 1,3-BIC, and the equivalent ratio was set to 14.

Then, polyisocyanate composition (f) was produced by mixing polyisocyanate composition (b) and polyisocyanate composition ($f_0$) so that polyisocyanate composition (f) had a solid content: 95 mass % of the solid content was derived from polyisocyanate composition (b) and 5 mass % of the solid content was derived from polyisocyanate composition ($f_0$). Table 1 shows the equivalent ratio (NCO/OH), reaction molar ratio (BIC/TMP), isocyanate group concentration, viscosity, NV, monomolecular boxy/bimolecular body, and average number of the isocyanate groups.

Example 7 (Production of Polyisocyanate Composition (g))

Polyisocyanate composition (g) was produced by mixing polyisocyanate composition (b) and polyisocyanate composition (f) so that polyisocyanate composition (g) had a solid content: 98 mass % of the solid content was derived from polyisocyanate composition (b) and 2 mass % of the solid content was derived from polyisocyanate composition (f). Table 1 shows the equivalent ratio (NCO/OH), reaction molar ratio (BIC/TMP), isocyanate group concentration, viscosity, NV, monomolecular body/bimolecular body, and average number of the isocyanate groups.

Example 8 (Production of Polyisocyanate Composition (h))

Polyisocyanate composition (h) was produced in the same manner as in Example 1, except that 1,4-BIC6 was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and average number of the isocyanate groups.

Example 9 (Production of Polyisocyanate Composition (i))

Polyisocyanate composition (i) was produced in the same manner as in Example 1, except that 1,4-BIC5 was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and average number of the isocyanate groups.

Example 10 (Production of Polyisocyanate Composition (j))

Polyisocyanate composition (j) was produced in the same manner as in Example 1, except that 1,4-BIC3 was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and average number of the isocyanate groups.

Example 11 (Production of Polyisocyanate Composition (k))

Polyisocyanate composition (k) was produced in the same manner as in Example 1, except that 1,4-BIC1 was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and average number of the isocyanate groups.

Example 12 (Production of Polyisocyanate Composition (l))

Polyisocyanate composition (l) was produced in the same manner as in Example 1, except that a polyisocyanate mixture in which 5 mass % of 1,3-BIC and 95 mass % of 1,4-BIC4 were mixed was used instead of 1,3-BIC, and the equivalent ratio was set to 2.9. Table 1 shows the equivalent ratio (NCO/OH), reaction molar ratio (BIC/TMP), isocyanate group concentration, viscosity, NV, monomolecular body/bimolecular body, and average number of the isocyanate groups.

Comparative Examples 1 and 2 (Production of Polyisocyanate Compositions (m) and (n))

Polyisocyanate compositions (m) and (n) were produced in the same manner as in Example 1, except that the equivalent ratio was changed as shown in Table 1. Table 1 shows the equivalent ratio (NCO/OH), reaction molar ratio (BIC/TMP), isocyanate group concentration, viscosity, NV, monomolecular body/bimolecular body, and average number of the isocyanate groups.

TABLE 1

| | | | Example No. | | | | | |
|---|---|---|---|---|---|---|---|---|
| | | | Example 1 | Example 2 | Example 3 | Example 4 | Example 5 | Example 6 |
| Curing agent | | | (a) | (b) | (c) | (d) | (e) | (f) |
| Percentage of | 1,3-BIC | % | 100 | 100 | 100 | 0 | 5 | 95 |
| 1,3-BIC and 1,4-BIC | 1,4-BIC | % | 0 | 0 | 0 | 100 | 95 | 5 |
| Percentage of trans isomer in 1,4-BIC | | % | — | — | — | 86 | 86 | 86 |
| Equivalent ratio (NCO/OH) | | | 5.4 | 14 | 2.9 | 2.9 | 2.9 | 14 |
| Reaction molar ratio (BIC/TMP) | | | 8.1 | 21 | 4.35 | 4.35 | 4.35 | 21 |

TABLE 1-continued

| | | | | | | | |
|---|---|---|---|---|---|---|---|
| Monomolecular-body/Bimolecular-body | | 2.0 | 4.3 | 1.8 | 1.7 | 1.7 | 4.5 |
| Isocyanate group concentration | % | 11.2 | 12.5 | 10.3 | 10.0 | 10.2 | 12.3 |
| Viscosity | mPa·s | 2120 | 1100 | 3510 | 4100 | 3850 | 1270 |
| Solid content concentration | % | 75.2 | 75.3 | 74.8 | 75.4 | 75.1 | 74.9 |
| Average number of isocyanate group | | 3.6 | 3.2 | 4.0 | 4.0 | 4.0 | 3.2 |

| | | Example No. | | | | | |
|---|---|---|---|---|---|---|---|
| | | Example 7 | Example 8 | Example 9 | Example 10 | Example 11 | Example 12 |
| Curing agent | | (g) | (h) | (i) | (j) | (k) | (l) |
| Percentage of 1,3-BIC | % | 98 | 0 | 0 | 0 | 0 | 5 |
| 1,3-BIC and 1,4-BIC | % | 2 | 100 | 100 | 100 | 100 | 95 |
| 1,4-BIC | | | | | | | |
| Percentage of trans isomer in 1,4-BIC | % | 86 | 75 | 82 | 93 | 97 | 86 |
| Equivalent ratio (NCO/OH) | | 14 | 2.9 | 2.9 | 2.9 | 2.9 | 2.9 |
| Reaction molar ratio (BIC/TMP) | | 21 | 4.35 | 4.35 | 4.35 | 4.35 | 4.35 |
| Monomolecular-body/Bimolecular-body | | 4.4 | 1.8 | 1.7 | 1.7 | 1.5 | 1.7 |
| Isocyanate group concentration | % | 12.4 | 10.3 | 10.2 | 10.0 | 9.8 | 10.2 |
| Viscosity | mPa·s | 1150 | 3710 | 4020 | 4280 | 4690 | 3990 |
| Solid content concentration | % | 75.2 | 75.1 | 75.3 | 74.9 | 75.3 | 75.1 |
| Average number of isocyanate group | | 3.2 | 4.0 | 4.0 | 4.0 | 4.0 | 4.0 |

| | | Comparative Example No. | |
|---|---|---|---|
| | | Comparative Example 1 | Comparative Example 2 |
| Curing agent | | (m) | (n) |
| Percentage of 1,3-BIC | % | 100 | 100 |
| 1,3-BIC and 1,4-BIC | % | 0 | 0 |
| 1,4-BIC | | | |
| Percentage of trans isomer in 1,4-BIC | % | — | — |
| Equivalent ratio (NCO/OH) | | 18 | 2.3 |
| Reaction molar ratio (BIC/TMP) | | 27 | 3.45 |
| Monomolecular-body/Bimolecular-body | | 4.8 | 1.3 |
| Isocyanate group concentration | % | 13.0 | 9.2 |
| Viscosity | mPa·s | 650 | 6220 |
| Solid content concentration | % | 75.1 | 75.2 |
| Average number of isocyanate group | | 3.1 | 4.7 |

Production of Solar Cell Member Covering Material, and Sample with a Cover Layer Example 13 (Production of Sample with a Cover Layer (A))

Fluorine polyol (manufactured by DAIKIN INDUSTRIES, LTD., trade name: ZEFFLE GK-570, hydroxyl number (solid content): 64 mgKOH/g, hereinafter referred to as GK-570) as a base resin, and polyisocyanate composition (a) produced in Example 1 as curing agent (a) were used, and blended so that the equivalent ratio (NCO/OH) of the isocyanate group in the curing agent relative to the hydroxyl group in the fluorine polyol was 1.0; 300 ppm of dibutyl tin dilaurate relative to the solid content of the curing agent was added as a catalyst, and butyl acetate was added so that the solid content thereof derived from the total of the polyol and the curing agent was 50%, and the mixture was stirred at 23° C. for 180 seconds, thereby producing solar cell member covering material (A) as a reaction mixture liquid.

Then, the reaction mixture liquid was applied to a polyethylene terephthalate film (hereinafter referred to as PET film)(manufactured by Toray Industries, INC, trade name: Lumirror), and a polypropylene (hereinafter referred to as PP plate) plate, and thereafter, subjected to heating and curing at 120° C. for 2 minutes, thereby producing sample with a cover layer (A) having a cover layer thickness of about 10 μm.

A sample in which a cover layer is formed on a PET film was subjected to adherence and blocking properties tests to be described later, and a sample in which a cover layer was formed on a PP plate was subjected to tests for tensile strength at break and elongation at break to be described later.

Examples 14 to 24 (Production of Samples with a Cover Layer (B) to (L))

Samples having a cover layer (B) to (L) were produced in the same manner as in Example 13, except that the curing agent as shown in Table 2 was used.

Comparative Examples 3 and 4 (Production of Samples with a Cover Layer (M) and (N))

Samples with a cover layer (M) and (N) were produced in the same manner as in Example 13, except that the curing agent as shown in Table 2 was used.

Comparative Example 5 (Production of Sample with a Cover Layer (O))

Sample with a cover layer (O) was produced in the same manner as in Example 13, except that TAKENATE D-170N (isocyanurate-modified product of hexamethylenediisocyanate, manufactured by Mitsui Chemicals, in the following, referred to as D-170N) was used as the curing agent instead of curing agent (a).

Synthesis Example 1 (Production of Polyol A)

A four-neck flask equipped with a mixer, a thermometer, a reflux condenser, and a nitrogen inlet tube was charged with 50 parts by mass of xylene and 50 parts by mass of methylisobutylketone as an organic solvent, and while conducting nitrogen replacement, the mixture was heated so that its temperature increased to 95° C. Thereafter, in the mixture, 56 parts by mass of methyl methacrylate, 12 parts by mass of butyl acrylate, 13.9 parts of 2-hydroxyethylacrylate, 8 parts by mass of n-butyl methaacrylate, 5.1 parts by mass of styrene, 2 parts by mass of pentamethylpiperidylmethaacrylate (manufactured by Hitachi Chemical Co., Ltd., trade name: FA-711MM), and 2 parts by muss of 2-[2'-hydroxy-5'-(methacryloyloxyethyl)phenyl]-2H-benzotriazole (RUVA-93, manufactured by Otsuka Chemical Co., Ltd.) as a polymerizable monomer, and 0.4 parts by mass of tert-butylperoxy-2-ethylhexanoate (hereinafter abbreviated as PBO) as a polymerization initiator were fed, taking four hours. After 1 hour and 2 hours from the completion of feed, 0.2 parts by mass of PBO was added. After the addition of PBO, reaction was performed for 2 hours, thereby producing polyol A. Polyol A had a hydroxyl number of 30 mgKOH/g.

Example 25 (Production of Sample with a Cover Layer (P))

Sample with a cover layer (P) was produced in the same manner as in Example 13, except that polyol A was used instead of fluorine polyol, and the curing agent as shown in Table 3 was used.

Example 26 (Production of Sample with a Cover Layer (Q))

Sample with a cover layer (Q) was produced in the same manner as in Example 13, except that a polyol mixture was used instead of fluorine polyol, and the curing agent shown in Table 3 was used: the polyol mixture was produced by mixing polyol A and polycarbonatediol (manufactured by Ube Industries, Ltd., trade name: UH-200, hydroxyl number (solid content): 56 mgKOH/g) so that the polyol mixture had a solid content: 50 mass % of the solid content was derived from polyol A and 50 mass % of the solid content was derived from polycarbonatediol.

Example 27 (Production of Sample with a Cover Layer (R))

Sample with a cover layer (R) was produced in the same manner as in Example 13, except that a polyol mixture was used instead of fluorine polyol, and the curing agent shown in Table 2 was used: the polyol mixture was produced by mixing polyol A and polycaprolactonediol (manufactured by Daicel Corporation, lactone-based polyester polyol, trade name: PLACCELL 220AL, hydroxyl number (solid content): 56 mgKOH/g) so that the polyol mixture had a solid content: 50 mass % of the solid content was derived from polyol A and 50 mass % of the solid content was derived from polycaprolactonediol.

Comparative Example 6 (Production of Sample with a Cover Layer (S))

Sample with a cover layer (S) was produced in the same manner as in Comparative Example 5, except that polyol A was used instead of fluorine polyol.

Synthesis Example 2 (Production of Polyol B)

A four-neck flask equipped with a mixer, a thermometer, a reflux condenser, and a nitrogen inlet tube was charged with 93.6 parts by mass of butyl acetate as an organic solvent, and while conducting nitrogen replacement, the solvent was heated so that its temperature was increased to 98° C. Thereafter, in the solvent, as a polymerizable monomer (monomer component), 33.6 parts by mass of methylmethaacrylate, 30.4 parts by mass of butylacrylate, 16 parts of 2-hydroxyethylmethaacrylate, and 20 parts by mass of styrene, and 1.0 part by mass of azobisisobutyronitrile as a polymerization initiator were fed, taking four hours. After the completion of the feeding, polymerization was conducted for one hour, and thereafter, 0.2 parts by mass of PBO was added at 110° C. after one hour, two hours, and three hours. Furthermore, 2.7 parts by mass of TINUVIN479 (manufactured by BASF Japan) and 2.7 parts by mass of TINUVIN5100 (manufactured by BASF Japan) were added as a weather resistance stabilizer, thereby producing polyol B. Polyol B had a hydroxyl number of 34 mgKOH/g.

Synthesis Example 3 (Production of Polyol C)

Polyol C was prepared in the same manner as in the production of polyol B, except that 13.9 parts by mass of methylmethaacrylate, 30.1 parts by mass of butylacrylate, 16 parts of 2-hydroxyethylmethaacrylate, and 40 parts by mass of styrene were used as a polymerizable monomer.

Synthesis Example 4 (Production of Polyol D)

Polyol 1) was prepared in the same manner as in the production of polyol B, except that 38.6 parts by mass of methylmethaacrylate, 30.4 parts by mass of butylacrylate, 16 parts of 2-hydroxyethylmethaacrylate, and 15 parts by mass of styrene were used as a polymerizable monomer.

Synthesis Example 5 (Production of Polyol E)

Polyol E was prepared in the same manner as in the production of polyol B, except that 29.9 parts by mass of methylmethaacrylate, 29.1 parts by mass of butylacrylate, 16 parts of 2-hydroxyethylmethaacrylate, 20 parts by mass of styrene, and 5 parts by mass of glycidylmethaacrylate were used as a polymerizable monomer.

Synthesis Examples 6 to 21 (Production of Polyols F to U)

Production was conducted in the same manner as the method for producing polyol B, using styrene, 2-hydroxyethyl (meth)acrylate, and (meth)acrylate, C2-8 (meth)acrylate at a proportion shown in Tables 5 to 6 as a polymerizable monomer.

Example 28 (Production of Sample with a Cover Layer (T))

Polyol B as a base resin, and curing agent (a) produced in Example 1 were blended so that the equivalent ratio (NCO/OH) of the isocyanate group in the curing agent relative to the hydroxyl group in polyol was 1.0; furthermore, 300 ppm of dibutyltin dilaurate relative to the solid content of the curing agent was added as a catalyst, and butyl acetate was added so that the solid content of the polyol and the curing agent was 50%, and the mixture was stirred at 23° C. for 180 seconds, thereby producing solar cell member covering material (T) as a reaction mixture liquid.

Then, the reaction mixture liquid was applied to a polyethyleneterephthalate film (hereinafter referred to as PET film) (manufactured by Toray Industries, INC, trade name: Lumirror), and to a polypropylene (hereinafter referred to as PP plate) plate, and thereafter, subjected to heating and curing at 120° C. for 2 minutes, thereby producing sample with a cover layer (A) having a cover layer thickness of about 10 µm.

A sample in which a cover layer is formed on a PET film was subjected to adherence and blocking properties tests to be described later, and a sample in which a cover layer was formed on a PP plate was subjected to tests for tensile strength at break and elongation at break to be described later.

Examples 29 to 39 (Production of Samples with a Cover Layer (U) to (AE))

Samples with a cover layer (U) to (AE) were produced in the same manner as in Example 28, except that the curing agent shown in Table 4 was used.

Examples 40 and 41 (Production of Samples with a Cover Layer (AF) and (AG))

Samples with a cover layer (AF) and (AG) were produced in the same manner as in Example 28, using base resin polyols C and D, and curing agent (d) shown in Table 4.

Comparative Examples 7 and 8 (Production of Samples with a Cover Layer (AH) and (AI))

Samples with a cover layer (AH) and (AI) were produced in the same manner as in Example 28, except that the curing agent shown in Table 4 was used.

Comparative Example 9 (Production of Sample with a Cover Layer (AJ))

Sample with a cover layer (AJ) was produced in the same manner as in Example 28, except that TAKENATE D-170N was used us the curing agent instead of curing agent (a).

Example 45 (Production of Sample with a Cover Layer (AN))

32.3 parts by mass of polyol B (hydroxyl number 34 mgKOH/g, solid content 56%, solvent butyl acetate), 60 parts by mass of titanium oxide (manufactured by SAKAI CHEMICAL INDUSTRY CO., LTD. D918), and 57.7 parts by mass of butyl acetate were introduced, and 110 parts by mass of glass beads having a diameter of 2 mm were added. The mixture was stirred with a paint shaker for two hours, and thereafter the glass beads were filtered; and polyol B, and a solvent were added so that the solid content was 48%, thereby producing a white paint. The percentage of titanium oxide in the solid in the white paint was 45%. The white paint and curing agent (d) produced in Example 4 were blended so that the equivalent ratio (NCO/OH) of the isocyanate group in the curing agent relative to the hydroxyl group was 1.0, and further 300 ppm of dibutyltin dilaurate relative to the solid content of the curing material was added as a catalyst, thereby producing solar cell member covering material (AN) as a reaction mixture liquid.

Then, the reaction mixture liquid was applied to a PET film (manufactured by Toray Industries, INC, trade name: Lumirror) with a bar coater, and subjected to heating and curing at 120° C. for 2 minutes, thereby producing sample with a cover layer (AN) having a cover layer thickness of about 10 µm. The same operation was conducted so that the coating was applied to both sides of the PET film.

Examples 42 to 44 and 46 to 62 (Production of Samples with a Cover Layer (AK to BE))

Using polyols shown in Tables 5 to 6, the while paint-forming was conducted in the same manner as in Example 45, thereby producing a white paint. Curing agent (d) was blended at an equivalent ratio of 1.0 in the same manner as in Example 45, and the reaction mixture liquid was applied to a PET base, thereby producing samples with a cover layer (AK to BE).

Examples 63 to 69 (Production of Samples with a Cover Layer (BF) to (BL))

Using polyols shown in Tables 5 to 6, the white paint-forming was conducted in the same manner as in Example 45, thereby producing a white paint. Curing agent (a) was blended at an equivalent ratio of 1.0, and the reaction mixture liquid was applied to a PET base, thereby producing samples with a cover layer (BF) to (BL).

Comparative Examples 10 to 13 (Production of Samples with a Cover Layer (BM) to (BP))

As shown in Tables 5 to 6, using polyol B or fluorine polyol GK570 as the base resin, white paint was formed in the same manner as in Example 42, and TAKENATE D-170N, or TAKENATE D-110N (trimethylolpropane adduct of xylylene diisocyanate, solid content 75 mass %, manufactured by Mitsui Chemicals, hereinafter referred to as D-110N) was blended as the curing agent at an equivalent ratio of 1.0, and the reaction mixture liquid was applied to a PET base, thereby producing samples with a cover layer (BM) to (BP).

Physical Properties Evaluation

Pot life, blocking properties, adherence, tensile strength at break, and elongation at break were measured by the following method for Examples and Comparative Examples. The results are shown in Tables 2 to 5.

<Pot Life (PL)(Unit: Min)>

The base resin, curing agent, dibutyltin dilaurate, and butyl acetate were blended, and setting the time immediately after stirring for 180 seconds to 0 min, initial viscosity was measured. Thereafter, the viscosity was measured every 1 hour. Plotting time (horizontal axis) versus viscosity (vertical axis), and based on an approximation curve, the time when the viscosity became twice the initial viscosity was regarded as pot life (PL).

<Adherence>

The samples with a cover layer (layer-covered PET film after heating at 120° C. and curing) of Examples and Comparative Examples were further heated at 40° C. for 48 hours, and adherence was evaluated in conformity with ASTM D3359.

In Tables, 5B indicates that the percentage of detachment of the coating was 0%, and 3B indicates that the percentage of detachment of the coating was 5 to 15%, and 1B shows that the percentage of detachment of the coating was 35 to 65%.

<EVA Adherence>

The layer-covered PET film was aged at 600° C. for 48 hours, and the surface treatment was conducted on the cover layer. Thereafter, placing an EVA resin sheet (SOLAR EVA™ fast cure type RC02B manufactured by Mitsui Chemicals Tohcello, Inc.) on the coating, and glass on the EVA resin sheet, thermocompression bonding was conducted under vacuum at 150° C. for 10 minutes, thereby producing a three-layered PET sample of glass/EVA/cover layer. Cuts were formed in the samples with a width of 10 mm to determine adherence, and a peel test was performed at 200 mm/min and 180° using a tensile/compressive testing machine (manufactured by INTESCO co., Ltd. Model 205N).

<Blocking Properties>

The samples with a cover layer (layer-covered PET film after heating at 120° C. and curing) of Examples and Comparative Examples were cut to produce two sheets having a size of 5 cm×10 cm. Then, on the cover layer of the first sample, the reverse side of the second sample was placed so that an area of 5 cm×5 cm of each of the sheets overlapped with each other, and while applying a load of 200 g/cm$^2$, the samples were heated at 40° C. for 48 hours.

After the heating at 40° C. for 48 hours, the two samples were freed from the load, and evaluated based on the following criteria.

10: The two samples were detached naturally, and no damage is observed on the coating.
9: The two samples were immediately detached when pulled in parallel, and no damage is found on the coating.
8: The two samples were detached when pulled in parallel, and no damage is observed on the coating.
7: The two samples were detached immediately when pulled vertically, and no damage is observed on the coating.
6: The two samples were detached when pulled vertically, and no damage is observed on the coating.
5: The two samples were detached when pulled vertically, and damage observed on the coating was 10% or less.
4: The two samples were detached when pulled vertically, and damage observed on the coating was 10 to 30% or less.
3: The two samples were detached when pulled vertically, and damage observed on the coating was 30 to 60% or less.
2: The two samples were detached when pulled vertically, and damage observed on the coating was 60% or more.
1: The two samples were not detached even when pulled vertically.

<Tensile Strength at Break (Unit: MPa), Elongation at Break (Unit: %), Weather Resistance>

The samples with a cover layer (layer-covered PP plate after heating at 120° C. and curing) of Examples 13 to 41 and Comparative Examples 3 to 9 were further heated at 40° C. for 24 hours.

Then, the cover layer was removed from the PP plate, and the produced cover layer was punched out with a dumbbell to a size of a width of 1 cm and a length of 10 cm, thereby producing a test sample. Then, the test sample was subjected to a tensile test using a tensile/compressive testing machine (manufactured by INTESCO co., Ltd., Model 205N) with the following conditions: at 23° C., a tensile speed of 5 mm/min, and a distance between chucks of 50 mm. The tensile strength at break and elongation at break of the cover layer were measured in this manner.

The samples with a cover layer (layer-covered PP plate after heating at 120° C. and curing) of Examples 13 to 41 and Comparative Examples 3 to 9 were subjected to light resistance test using a super xenon weather meter (manufactured by Suga Test Instruments Co., Ltd., model: SX75-AP) and exposed to light irradiation for 1000 hours with the following conditions: black panel temperature 65° C., relative humidity 50%, xenon lamp irradiance 60 W/m$^2$ (irradiation wavelength 300 to 400 nm). Thereafter, in the same manner as described above, the tensile strength at break and elongation at break of the cover layer were measured.

<Pressure Cooker Test (PCT)>

Using a unsaturated highly accelerated stress test device (manufactured by Hirayama Manufacturing Corporation, Model PC-304/422R8), adherence (in conformity with ASTM D3359) was evaluated for the samples before and after the test at 105° C., 100% RH, and for 128 hours.

<Color Difference Δb*>

Color difference was evaluated before and after 2000 hours using a color meter (SM-T by Suga Test Instruments Co., Ltd., in conformity with JIS Z8722 condition d reflection conditions) at 85° C. and 85% RH. Below Δb*3 was evaluated as EXCELLENT, 3 to 4 as GOOD, and 4 or more as BAD.

TABLE 2

| | | | Example No. | | | | | |
|---|---|---|---|---|---|---|---|---|
| | | | Example 13 | Example 14 | Example 15 | Example 16 | Example 17 | Example 18 |
| Sample having a cover layer | | | (A) | (B) | (C) | (D) | (E) | (F) |
| Solar cell member covering material | Base Resin | | GK-570 | GK-570 | GK-570 | GK-570 | GK-570 | GK-570 |
| | Curing agent | | (a) | (b) | (c) | (d) | (e) | (f) |
| Physical properties before light resistance test | PL | min | 340 | 390 | 300 | 280 | 290 | 370 |
| | Blocking properties | | 8 | 8 | 8 | 10 | 9 | 9 |
| | Adherence | | 5B | 5B | 5B | 5B | 5B | 5B |
| | Tensile strength at break | MPa | 45.4 | 40.2 | 47.2 | 52.9 | 49.1 | 42.5 |
| | Elongation at break | % | 5.4 | 7.8 | 4.3 | 3.9 | 4.0 | 7.2 |
| Physical properties after light resistance test | Tensile strength at break | MPa | 43.0 | 37.7 | 44.9 | 51.9 | 47.2 | 40.6 |
| | Elongation at break | % | 4.6 | 6.5 | 3.7 | 3.4 | 3.4 | 6.2 |

| | | | Example No. | | | | | |
|---|---|---|---|---|---|---|---|---|
| | | | Example 19 | Example 20 | Example 21 | Example 22 | Example 23 | Example 24 |
| Sample having a cover layer | | | (G) | (H) | (I) | (J) | (K) | (L) |
| Solar cell member covering material | Base Resin | | GK-570 | GK-570 | GK-570 | GK-570 | GK-570 | GK-570 |
| | Curing agent | | (g) | (h) | (i) | (j) | (k) | (l) |

TABLE 2-continued

| | | | | | | | | |
|---|---|---|---|---|---|---|---|---|
| Physical properties before light resistance test | PL | min | 380 | 290 | 280 | 280 | 210 | 290 |
| | Blocking properties | | 8 | 8 | 10 | 10 | 10 | 9 |
| | Adherence | | 5B | 5B | 5B | 5B | 3B | 5B |
| | Tensile strength at break | MPa | 40.9 | 48.3 | 52.1 | 54.1 | 56.2 | 51.9 |
| | Elongation at break | % | 7.5 | 4.2 | 3.7 | 3.5 | 2.7 | 4.2 |
| Physical properties after light resistance test | Tensile strength at break | MPa | 38.4 | 46.3 | 51.0 | 53.2 | 54.9 | 50.7 |
| | Elongation at break | % | 6.3 | 3.6 | 3.2 | 3.1 | 2.4 | 3.7 |

| | | | Comparative Example No. | | |
|---|---|---|---|---|---|
| | | | Comparative Example 3 | Comparative Example 4 | Comparative Example 5 |
| Sample having a cover layer | | | (M) | (N) | (O) |
| Solar cell member Covering material | Base Resin | | GK-570 | GK-570 | GK-570 |
| | Curing agent | | (m) | (n) | D-170N |
| Physical properties before light resistance test | PL | min | 430 | 140 | 160 |
| | Blocking properties | | 5 | 10 | 5 |
| | Adherence | | 5B | 1B | 5B |
| | Tensile strength at break | MPa | 34.4 | 50.1 | 30.2 |
| | Elongation at break | % | 11.3 | 2.0 | 9.8 |
| Physical properties after light resistance test | Tensile strength at break | MPa | 29.2 | 48.2 | 25.4 |
| | Elongation at break | % | 8.5 | 1.7 | 7.3 |

TABLE 3

| | | Example No.-Comparative Example No. | | | |
|---|---|---|---|---|---|
| | | Example 25 | Example 26 | Example 27 | Comparative Example 6 |
| Sample having a cover layer | | (P) | (Q) | (R) | (S) |
| Solar cell member covering material | Base resin | Polyol A | Polyol A UH-200 | Polyol A L 200AL | Polyol A |
| | Curing agent | (d) | (d) | (d) | D-170N |
| Physical properties | PL min | 310 | 270 | 280 | 120 |
| | Blocking properties | 8 | 8 | 8 | 4 |
| | Adherence | 5B | 5B | 5B | 5B |

TABLE 4

| | | | Example No. | | | | | |
|---|---|---|---|---|---|---|---|---|
| | | | Example 28 | Example 29 | Example 30 | Example 31 | Example 32 | Example 33 |
| Sample having a cover layer | | | (T) | (U) | (V) | (W) | (X) | (Y) |
| Solar cell member covering material | Base resin | | Polyol B | Polyol B | Polyol B | Polyol B | Polyol B | Polyol B |
| | Curing agent | | (a) | (b) | (c) | (d) | (e) | (f) |
| Physical properties before light resistance test | PL | min | 360 | 380 | 290 | 280 | 300 | 380 |
| | Blocking properties | | 8 | 8 | 8 | 10 | 9 | 9 |
| | Adherence | | 5B | 5B | 5B | 5B | 5B | 5B |
| | Tensile strength at break | MPa | 43.2 | 40.8 | 45.9 | 53.6 | 48.5 | 42.1 |
| | Elongation at break | % | 5.2 | 8.1 | 4.2 | 3.8 | 4.1 | 6.8 |
| Physical properties after light resistance test | Tensile strength at break | MPa | 41.5 | 39.1 | 42.5 | 50.9 | 46.1 | 40.0 |
| | Elongation at break | % | 4.8 | 7.5 | 3.9 | 3.5 | 3.3 | 5.8 |

TABLE 4-continued

|  |  |  | Example No. | | | | | |
| --- | --- | --- | --- | --- | --- | --- | --- | --- |
|  |  |  | Example 34 | Example 35 | Example 36 | Example 37 | Example 38 | Example 39 |
| Sample having a cover layer |  |  | (Z) | (AA) | (AB) | (AC) | (AD) | (AE) |
| Solar cell member covering material | Base resin |  | Polyol B | Polyol B | Polyol B | Polyol B | Polyol B | Polyol B |
|  | Curing agent |  | (g) | (h) | (i) | (j) | (k) | (l) |
| Physical properties before light resistance test | PL | min | 360 | 280 | 260 | 280 | 240 | 300 |
|  | Blocking properties |  | 8 | 9 | 10 | 10 | 10 | 9 |
|  | Adherence |  | 5B | 5B | 5B | 5B | 3B | 5B |
|  | Tensile strength at break | MPa | 41.2 | 49.6 | 53.2 | 52.4 | 56.1 | 52.9 |
|  | Elongation at break | % | 7.5 | 4.1 | 3.5 | 3.2 | 2.8 | 4.8 |
| Physical properties after light resistance test | Tensile strength at break | MPa | 38.5 | 46.8 | 50.2 | 49.7 | 53.5 | 49.7 |
|  | Elongation at break | % | 6.1 | 3.5 | 2.8 | 2.4 | 2.1 | 3.7 |

|  |  |  |  | | Comparative Example No. | | |
| --- | --- | --- | --- | --- | --- | --- | --- |
|  |  |  | Example 40 | Example 41 | Comparative Example 7 | Comparative Example 8 | Comparative Example 9 |
| Sample having a cover layer |  |  | (AF) | (AG) | (AH) | (AI) | (AJ) |
| Solar cell member covering material | Base resin |  | Polyol C | Polyol D | Polyol B | Polyol B | Polyol B |
|  | Curing agent |  | (d) | (d) | (m) | (n) | D-170N |
| Physical properties before light resistance test | PL | min | 300 | 290 | 430 | 140 | 160 |
|  | Blocking properties |  | 10 | 9 | 6 | 9 | 5 |
|  | Adherence |  | 5B | 5B | 4B | 1B | 4B |
|  | Tensile strength at break | MPa | 42.1 | 42.9 | 30.2 | 51.8 | 31.5 |
|  | Elongation at break | % | 4.8 | 5.1 | 10.5 | 2.1 | 8.9 |
| Physical properties after light resistance test | Tensile strength at break | MPa | 40.5 | 41.5 | 26.1 | 47.5 | 26.9 |
|  | Elongation at break | % | 4.5 | 4.1 | 8.1 | 1.8 | 6.8 |

TABLE 5

|  |  | Example No.-Comparative Example No. | | | | | |
| --- | --- | --- | --- | --- | --- | --- | --- |
|  |  | Example 42 | Example 43 | Example 44 | Example 45 | Example 46 | Example 47 |
| Sample having a cover layer |  | (AK) | (AL) | (AM) | (AN) | (AO) | (AP) |
| Solar cell member covering material | Base resin (formed into white paint) | Polyol F | Polyol G | Polyol D | Polyol B | Polyol H | Polyol C |
|  | ST mass %(in 100 parts of monomer) | 0 | 10 | 15 | 20 | 30 | 40 |
|  | Mass % of C 2-8(meth) acrylate in (meth)acrylate | 36.4 | 41.2 | 44.1 | 47.5 | 55.9 | 68.4 |
|  | Curing agent | (d) | (d) | (d) | (d) | (d) | (d) |
| Physical properties | Blocking properties | 6 | 8 | 9 | 10 | 10 | 10 |
|  | Adherence | 3B | 4B | 4B | 5B | 5B | 5B |
|  | PCT105° C. 100% RH Adherence after 128 hours | 3B | 4B | 4B | 5B | 5B | 5B |
|  | 85° C. 85% RH Δb* after 2000 hours | Excellent | Excellent | Excellent | Excellent | Excellent | Excellent |
|  | EVA Adherence (N/10 mm) · Evaluation | 35Good | 60Good | 90Excellent | 133Excellent | — | 140Excellent |

TABLE 5-continued

|  |  | Example 48 | Example 49 | Example 50 | Example 51 | Example 52 | Example 53 |
|---|---|---|---|---|---|---|---|
| Sample having a cover layer | | (AQ) | (AR) | (AS) | (AT) | (AU) | (AV) |
| Solar cell member covering material | Base resin (formed into white paint) | Polyol I | GK 570 | Polyol J | Polyol K | Polyol L | Polyol M |
|  | ST mass % (in 100 parts of monomer) | 50 | — | 20 | 20 | 40 | 40 |
|  | Mass % of C 2-8(meth) acrylate in (meth)acrylate | 78.9 | — | 56.4 | 23.9 | 95 | 81.4 |
|  | Curing agent | (d) | (d) | (d) | (d) | (d) | (d) |
| Physical properties | Blocking properties | 10 | 9 | 9 | 10 | 9 | 9 |
|  | Adherence | 5B | 5B | 5B | 5B | 5B | 5B |
|  | PCT105° C. 100% RH Adherence after 128 hours | 5B | 4B | 5B | 4B | 3B | 5B |
|  | 85° C. 85% RH Δb* after 2000 hours | Good | Excellent | Excellent | Excellent | Excellent | Excellent |
|  | EVA Adherence (N/10 mm) · Evaluation | 145Excellent | 76Good | 120Excellent | 100Excellent | — | 146Excellent |

|  |  | Example 54 | Example 55 | Example 56 | Example 57 | Example 58 | Example 59 |
|---|---|---|---|---|---|---|---|
| Sample having a cover layer | | (AW) | (AX) | (AY) | (AZ) | (BA) | (BB) |
| Solar cell member covering material | Base resin (formed into white paint) | Polyol N | Polyol O | Polyol P | Polyol Q | Polyol R | Polyol S |
|  | ST mass % (in 100 parts of monomer) | 40 | 40 | 15 | 15 | 15 | 10 |
|  | Mass % of C 2-8(meth) acrylate in (meth)acrylate | 45.4 | 34.3 | 61.2 | 52.3 | 22.3 | 57.2 |
|  | Curing agent | (d) | (d) | (d) | (d) | (d) | (d) |
| Physical properties | Blocking properties | 10 | 10 | 9 | 9 | 8 | 8 |
|  | Adherence | 5B | 5B | 5B | 4B | 4B | 3B |
|  | PCT105° C. 100% RH Adherence after 128 hours | 5B | 5B | 4B | 4B | 4B | 3B |
|  | 85° C. 85% RH Δb* after 2000 hours | Excellent | Excellent | Excellent | Excellent | Excellent | Excellent |
|  | EVA Adherence (N/10 mm) · Evaluation | — | — | — | 95Excellent | — | — |

TABLE 6

|  |  | Example 60 | Example 61 | Example 62 | Example 63 | Example 64 | Example 65 |
|---|---|---|---|---|---|---|---|
| Sample having a cover layer | | (BC) | (BD) | (BE) | (BF) | (BG) | (BH) |
| Solar cell member covering material | Base resin (Formed into white paint) | Polyol T | Polyol U | Polyol E | Polyol U | Polyol D | Polyol B |
|  | ST mass % (in 100 parts of monomer | 10 | 10 | 20 | 10 | 15 | 20 |
|  | Added component | — | — | GMA | — | — | — |
|  | Mass % of C 2-8(meth) acrylate in (meth) acrylate | 48.9 | 20.9 | 49.3 | 20.9 | 44.1 | 47.5 |
|  | Curing agent | (d) | (d) | (d) | (a) | (a) | (a) |
| Physical properties | Blocking properties | 8 | 9 | 9 | 8 | 8 | 8 |
|  | Adherence | 3B | 4B | 5B | 4B | 4B | 5B |
|  | PCT105° C. 100% RH Adherence after 128 hours | 3B | 3B | 4B | 3B | 4B | 4B |
|  | 85° C. 85% RH Δb* after 2000 hours | Excellent | Excellent | Excellent | Excellent | Excellent | Excellent |
|  | EVA Adherence (N/10 mm) · Evaluation | 60Good | — | 130Excellent | 65Good | 80Excellent | 105Excellent |

|  |  | Example 66 | Example 67 | Example 68 | Example 69 | Comparative Example 10 | Comparative Example 11 |
|---|---|---|---|---|---|---|---|
| Sample having a cover layer | | (BI) | (BJ) | (BK) | (BL) | (BM) | (BN) |
| Solar cell member covering material | Base resin (Formed into white paint) | Polyol C | Polyol I | GK 570 | Polyol B | Polyol B | GK 570 |
|  | ST mass % (in 100 parts of monomer) | 40 | 50 | — | 20 | 20 | — |

TABLE 6-continued

|  |  |  |  |  | GMA |  |  |
|---|---|---|---|---|---|---|---|
|  | Added component | — | — | — | GMA | — | — |
|  | Mass % of C 2-8(meth) acrylate in (meth) acrylate | 68.4 | 87.9 | — | 49.3 | 47.5 | — |
| Physical properties | Curing agent | (a) | (a) | (a) | (a) | D-170N | D-170N |
|  | Blocking properties | 8 | 9 | 8 | 9 | 5 | 5 |
|  | Adherence | 5B | 5B | 5B | 5B | 4B | 4B |
|  | PCT105° C. 100% RH Adherence after 128 hours | 5B | 4B | 4B | 4B | 4B | 4B |
|  | 85° C. 85% RH Δb* after 2000 hours | Excellent | Good | Excellent | Excellent | Excellent | Good |
|  | EVA Adherence (N/10 mm) · Evaluation | 124Excellent | 130Excellent | 70Good | 120Excellent | 58Good | 40Good |

|  |  | Example No.-Comparative Example No. | |
|---|---|---|---|
|  |  | Comparative Example 12 | Comparative Example 13 |
| Sample having a cover layer | | (BO) | (BP) |
| Solar cell member covering material | Base resin (Formed into white paint) | Polyol B | GK 570 |
|  | ST mass %(in 100 parts of monomer) | 20 | — |
|  | Mass % of C 2-8(meth) acrylate in (meth) acrylate | 47.5 | — |
|  | Curing agent | D-110N | D-110N |
| Physical properties | Blocking properties | 9 | 9 |
|  | Adherence | 5B | 5B |
|  | PCT 105° C. 100% RH Adherence after 128 hours | 4B | 4B |
|  | 85° C. 85% RH Δb* after 2000 hours | Good | Good |
|  | EVA Adherence (N/10 mm) · Evaluation | 100 Excellent | 68 Good |

Abbreviations in Tables are described below.
BIC: bis(isocyanatomethyl) cyclohexane
TMP: trimethylolpropane
GK-570: fluorine polyol, trade name: ZEFFLE GK-570, hydroxyl number (solid content): 64 mgKOH/g, manufactured by DAIKIN INDUSTRIES, LTD.
UH-200: polycarbonatediol, trade name: UH-200, hydroxyl number (solid content): 56 mgKOH/g, manufactured by Ube Industries, Ltd.
L220AL: polycaprolactonediol, lactone-based polyester polyol, trade name: PLACCEL L220AL, hydroxyl number (solid content): 56 mgKOH/g, manufactured by Daicel Corporation.
D-170N: TAKENATE D-170N, isocyanurate-modified product of hexamethylene diisocyanate, manufactured by Mitsui Chemicals
D-110N: TAKENATE D-110N, trimethylolpropane adduct of xylylene diisocyanate, solid content 75 mass %, manufactured by Mitsui Chemicals
GMA: Glycidylmethaacrylate
ST mass %: Mass percentage of styrene in acrylic polyol ingredient monomer component
PCT: Pressure Cooker Test
Microcapsule Example 70

5 parts by mass of crystal violet lactone and 1 part by mass of benzoylleucomethylene blue as a color coupler were dissolved in 100 parts by mass of diisopropylnaphthalene. To this oily liquid, 18.9 parts by mass of polyisocyanate composition (a) produced in Example 1 and 1.2 parts by mass of propylene oxide adduct of ethylenediamine (manufactured by Mitsui Chemicals, trade name "ACTCOL™ GR-07") were dissolved, thereby producing solution (1).

Meanwhile, to 200 parts by mass of water, 8 parts by mass of polyvinyl alcohol, and 2 parts by mass of sodium carboxymethyl cellulose were added, thereby producing solution (2).

Thereafter, while stirring the above-described solution (2) violently, solution (1) was added, thereby causing emulsification and dispersion. Thereafter, the temperature of the dispersion was increased to 80° C., and the temperature was kept for 5 hours to complete polymerization reaction, thereby producing a microcapsule emulsion.

The produced microcapsules had an average particle size of 7.9 μm. The average particle size was measured by using Coulter counter multisizer II (manufactured by Beckman Coulter, Inc.).

Examples 71 to 81 and Comparative Examples 14 to 15

A microcapsule emulsion was produced in the same manner as in Example 70, except that the mixing formulation shown in Table 7 was used. The average particle size of the microcapsule produced is shown in Table 7.

Comparative Example 16

A microcapsule emulsion was produced in the same manner as in Example 70, except that 10.2 parts by mass of TAKENATE D-170N (isocyanurate-modified product of hexamethylene diisocyanate, manufactured by Mitsui Chemicals) was used. The average particle size of the microcapsule produced is shown in Table 7.

Evaluation

A microcapsule sheet and a developer sheet were produced to serve for Evaluation Test as follows.

<Production of Microcapsule Sheet>

To the microcapsule emulsion produced in the above-described Examples and Comparative Examples, 10 parts by mass (solid content) of carboxy-modified SBR latex (manufactured by NIPPON A&L INC., trade name "SN-307R") and 60 parts by mass of starch particles were added, and then the solid content concentration was adjusted to 20% with water, thereby producing an application liquid. The application liquid was applied on a stencil on a paper support so that its dry weight was 4.0 g/m², thereby producing a microcapsule sheet.

<Production of Developer Sheet>

Using 15 parts by mass of 3,5-bis(α-methylbenzyl) zinc salicylate, 120 parts by mass of calcium carbonate, 10 parts by mass of activated clay, 20 parts by mass of zinc oxide, 1 part by mass of sodium hexametaphosphate, and 200 parts by mass of water, a dispersion was produced: the dispersion was subjected to microparticle treatment with a sand mill. To 300 parts by mass of dispersion, 100 parts by mass of a 10% PVA-117 aqueous solution (manufactured by Kuraray Co., Ltd.) and 7 parts by mass (solid content) of carboxy-modified SBR latex were added, and water was used to adjust its solid content concentration to 20%, thereby producing an application liquid. The application liquid was applied with an air knife coater to a stencil of 50 g/m² so that a solid content therein was 5.0 g/m², and dried, thereby producing a developer sheet.

Then, using the microcapsules produced in Examples and Comparative Examples, and the microcapsule sheets produced therefrom, Evaluations were conducted based on the following methods. The results are shown in Table 7.

<Coloring on Capsule Surface>

The b-value of the microcapsule emulsion was measured using Σ80-type color difference meter (manufactured by Nippon Denshoku Industries). A higher absolute value of b-value indicates more coloring. EXCELLENT indicates that no coloring is observed and that the b-value was in the positive side.

<Color Development>

The microcapsule sheet and developer sheet were placed on top of each other, and continuously subjected to pressure application printing with a NECPC-PR201/45 type printer (manufactured by NEC) in a space of 3 cm×3 cm to develop colors. After an elapse of one day after the color development, measurement was conducted with Macbeth densitometer (manufactured by GretagMacbeth), setting color development properties to $D_0$. A higher value indicates better color developing properties.

<Heat Resistance>

The microcapsule sheet and developer sheet were placed on top of each other, and allowed to stand under an atmosphere of 120° C. for 2 hours, and thereafter degree of coloration of the developer sheet was observed. EXCELLENT indicates almost no coloration. BAD indicates that coloration was observed.

<Pressure Resistance>

The microcapsule sheet and developer sheet were placed on top of each other, and a load of 10 kg/cm² was applied. The degree of pressure fog on the developer sheet surface was observed. EXCELLENT indicates that almost no coloration occurred, and BAD indicates coloration occurred.

<Solvent Resistance (Unit: %)>

The microcapsule sheet was immersed in ethyl acetate for about 1 second, and naturally dried. Thereafter, the developer sheet was placed thereon, and allowed to develop color in the same manner as in the evaluation for color development. After an elapse of one day, measurement was conducted with Macbeth densitometer (manufactured by GretagMacbeth), setting color development properties to $D_1$. The value obtained based on the following formula is regarded as solvent resistance, and a higher value indicates more excellent solvent resistance.

Solvent resistance (%)=$D_1/D_0 \times 100$

TABLE 7

| | | | Example 70 | Example 71 | Example 72 | Example 73 | Example 74 | Example 75 |
|---|---|---|---|---|---|---|---|---|
| Microcapsule | | | (A) | (B) | (C) | (D) | (E) | (F) |
| Polyisocyanate composition | | | (a) | (b) | (c) | (d) | (e) | (f) |
| Polyisocyanate composition mass | | parts by mass | 18.9 | 16.9 | 20.5 | 21.1 | 20.7 | 17.2 |
| Polyol mass | | parts by mass | 1.2 | 1.2 | 1.2 | 1.2 | 1.2 | 1.2 |
| Evaluation | Average particle size | μm | 7.9 | 7.3 | 8.1 | 8.7 | 8.4 | 7.6 |
| | Coloring on caspule surface | | Excellent | Excellent | Excellent | Excellent | Excellent | Excellent |
| | Color development | | 0.93 | 0.93 | 0.93 | 0.91 | 0.92 | 0.93 |
| | Heat resistance | | Excellent | Excellent | Excellent | Excellent | Excellent | Excellent |
| | Pressure resistance | | Excellent | Excellent | Excellent | Excellent | Excellent | Excellent |
| | Solvent resistance | % | 89 | 87 | 89 | 98 | 97 | 96 |

| | | | Example 76 | Example 77 | Example 78 | Example 79 | Example 80 | Example 81 |
|---|---|---|---|---|---|---|---|---|
| Microcapsule | | | (G) | (H) | (I) | (J) | (K) | (L) |
| Polyisocyanate composition | | | (g) | (h) | (i) | (j) | (k) | (l) |
| Polyisocyanate composition mass | | parts by mass | 17.0 | 20.5 | 20.7 | 21.1 | 21.6 | 20.7 |
| Polyol mass | | parts by mass | 1.2 | 1.2 | 1.2 | 1.2 | 1.2 | 1.2 |
| Evaluation | Average particle size | μm | 7.5 | 8.2 | 8.6 | 8.9 | 9.8 | 8.4 |
| | Coloring on caspule surface | | Excellent | Excellent | Excellent | Excellent | Excellent | Excellent |
| | Color development | | 0.93 | 0.92 | 0.91 | 0.91 | 0.87 | 0.91 |

TABLE 7-continued

|  |  |  |  | Excellent | Excellent | Excellent | Excellent | Excellent | Excellent |
|---|---|---|---|---|---|---|---|---|---|
| Heat resistance |  |  |  | Excellent | Excellent | Excellent | Excellent | Excellent | Excellent |
| Pressure resistance |  |  |  | Excellent | Excellent | Excellent | Excellent | Excellent | Excellent |
| Solvent resistance |  | % | | 90 | 92 | 98 | 97 | 95 | 97 |

|  |  |  | Comparative Example No. | | |
|---|---|---|---|---|---|
|  |  |  | Comparative Example 14 | Comparative Example 15 | Comparative Example 16 |
| Microcapsule |  |  | (M) | (N) | (O) |
| Polyisocyanate composition |  |  | (m) | (n) | D-170 |
| Polyisocyanate composition mass |  | parts by mass | 16.3 | 23.0 | 10.2 |
| Polyol mass |  | parts by mass | 1.2 | 1.2 | 1.2 |
| Evaluation | Average particle size | μm | 6.1 | 12.4 | 6.9 |
|  | Coloring on caspule surface |  | Excellent | Excellent | Excellent |
|  | Color development |  | 0.92 | 0.78 | 0.91 |
|  | Heat resistance |  | Bad | Bad | Bad |
|  | Pressure resistance |  | Bad | Bad | Bad |
|  | Solvent resistance | % | 65 | 72 | 58 |

Binder for Ink

Preparation Example 1 (Preparation of Polyol AB)

289.3 parts by mass of terephthalic acid, 254.5 parts by mass of adipic acid, 139.5 parts by mass of neopentyl glycol, 316.6 parts by mass of 3-methyl-1,5-pentanediol, and 0.1 parts by mass of zinc acetate were charged, and esterification reaction was performed under nitrogen atmosphere at 200 to 220° C. for 6 hours. Thereafter, the pressure was gradually reduced, and esterification reaction was performed under 133 to 266 Pa and at 200 to 230° C. for 4 hours, thereby producing polyester polyol (hereinafter polyol AB) having a number average molecular weight of 2000.

Preparation Example 2 (Production of Polyol AC)

553.6 parts by mass of adipic acid, 193.1 parts by mass of 1,4-butanediol, 253.3 parts by mass of 3-methyl-1,5-pentanediol, and 0.1 parts by mass of zinc acetate were charged, and esterification reaction was performed under nitrogen atmosphere at 200 to 220° C. for 6 hours. Thereafter, the pressure was reduced gradually, and esterification reaction was performed under 133 to 266 Pa, and at 200 to 230° C. for 4 hours, thereby producing a polyester polyol (hereinafter polyol AC) having a number average molecular weight of 2000.

Preparation Example 3 (Production of Polyurethane Resin A)

A four-neck flask equipped with a mixer, a thermometer, a reflux pipe, and a nitrogen inlet tube was charged with 87.2 parts by mass of polyol AB, 130.8 parts by mass of polyol AC, 7.8 parts by mass of neopentyl glycol (hereinafter may be referred to as NPG), 3.5 parts by mass of N-methyldiethanolamine (hereinafter may be referred to as MDEA) and 300 parts by mass of methyl ethyl ketone (hereinafter may be referred to as MEK), and homogenously mixed. Then, 53.7 parts by mass of 1,3-BIC was added thereto, and the mixture was heated to 70° C., and 0.002 parts by mass of dibutyltin (IV) dilaurate (manufactured by Wako Pure Chemical Industries, Ltd.) was added thereto. After reaching a predetermined isocyanate group concentration (0.98 mass %), the temperature was reduced to 25° C. Then, 197 parts by mass of MEK was added, and furthermore, an amine solution in which 203.2 parts by mass of isopropanol (hereinafter may be referred to as IPA) and 16.8 parts by mass of isophoronediamine (manufactured by Evonik Degussa Japan Co., Ltd., trade name: VESTANAT IPD, hereinafter may be referred to as IPDA) were mixed was added. Reaction was performed until the peak of the isocyanate group was not detected by FT-IR, thereby producing polyurethane resin A. Polyurethane resin A had a solid content of 30%, a viscosity at 25° C. of 780 mPa·s, and an amine value of 4 mgKOH/g.

Preparation Example 4 (Production of Polyurethane Resin B)

Polyurethane resin B was produced in the same manner as in Synthesis Example 30, except that 1,4-BIC4 of Production Example 4 was used instead of 1,3-BIC.

Polyurethane resin B had a solid content of 30%, a viscosity at 25° C. of 810 mPa·s, and an amine value of 4 mgKOH/g.

Example 82

A dispersion solution was produced by stirring and mixing the following with a paint shaker along with glass beads: 100 parts by mass of polyurethane resin A as a base resin, 100 parts by mass of titanium dioxide ($TiO_2$, manufactured by Wako Pure Chemical Industries, Ltd.) as a pigment, 0.5 parts by mass of an antioxidant, Irganox 245 (manufactured by BASF Japan), 0.5 parts by mass of IA-62 (manufactured by ADEKA), and 0.5 parts by mass of Tinuvin 213 (manufactured by BASF Japan) as a light stabilizer, and 50 parts by mass of MEK as an organic solvent.

Furthermore, after 4.1 parts by mass of polyisocyanate composition (a) was added as the curing agent, the mixture was stirred and mixed, thereby producing a binder for ink, and an ink containing the binder for ink.

Thereafter, the produced ink was applied to a corona discharge-treated surface of a stretched polyethylene terephthalate film having a thickness of 15 μm with a bar coater, so that the thickness after drying was 1 μm, and dried at 60° C. for 1 minute, and thereafter, aged in a room of 23° C. and a relative humidity of 50% for 24 hours. The ink cured product (coating) was obtained in this manner.

Examples 83 to 95, and Comparative Examples 17 and 18

An ink cured product was produced in the same manner as in Example 82, except that the polyisocyanate composition of the type and the blending amount shown in Table 8 was used.

Comparative Example 19

An ink cured product was produced in the same manner as in Example 82, except that TAKENATE D-170N (isocyanurate-modified product of hexamethylenediisocyanate, manufactured by Mitsui Chemicals) was used instead of polyisocyanate composition (a), and blended as shown in Table 8.

Evaluation

The ink cured product produced in Examples and Comparative Examples were evaluated by the following methods. The results are shown in Table 8.

<Surface Tackiness (Antiblocking Properties)>

Two sheets of samples (polyethylene terephthalate film on the front surface of which an ink cured product was formed) produced in Examples and Comparative Examples were prepared, and the reverse surface (where the ink cured product was not formed) of one sample polyethylene terephthalate film was bonded to the ink cured product of the other sample, thereby producing a laminate film.

Then, the produced laminate film was sandwiched between glass plates, and with a 5 kg weight placed thereon, they were allowed to stand in a constant temperature bath of 60° C. and 90% RH for 24 hours. After en elapse of the specified time, they were taken out from the constant temperature bath, and the films were removed from the glass plates. The films were allowed to stand in a room of 23° C. and 50% RH for 1 hour. After removing the samples carefully, the peeling state of the ink cured product was evaluated based on the following criteria.

Excellent No peeling of ink cured product observed.
Good Peeling of ink cured product partially observed.
Bad Peeling of ink cured product extensively observed.

<Adhesion>

Adhesion test was conducted by the cross-cut method in conformity with JIS K5600-5-6 (1999) (cut interval 1 mm), and evaluation was conducted based on the following criteria.

0 No removal of ink cured product at all.
1 Below 5% of the ink cured product was removed.
2 5% or more and below 15% of the ink cured product was removed.
3 15% or more and below 35% of the ink cured product was removed.
4 35% or more and below 65% of the ink cured product was removed.
5 65% or more and 100% or less of the ink cured product was removed.

<Weather Resistance>

Light irradiation of 500 hours was conducted as a light resistance test using a super xenon weather meter (manufactured by Suga Test Instruments Co., Ltd., model: SX75-AP) with the following conditions: black panel temperature 65° C., relative humidity 50%, xenon lamp irradiation illuminance 60 W/m$^2$ (irradiation wavelength 300 to 400 nm). Then, adhesion test was conducted by the cross-cut method in conformity with JIS K5600-5-6 (1999) (cut interval 1 mm), and evaluation was conducted based on the criteria for the adhesion test above.

<Moisture Resistance (Warm Water Resistance)>

The samples were immersed in warm water of 80° C. for one week, and thereafter, allowed to stand in a room of 23° C. and 50% RH for 1 hour. Then, adhesion test was conducted by the cross-cut method in conformity with JIS K5600-5-6 (1999) (cut interval 1 mm), and evaluation was conducted based on the criteria for the adhesion test above.

TABLE 8

| | | Example No. | | | | | | |
|---|---|---|---|---|---|---|---|---|
| | | Example 82 | Example 83 | Example 84 | Example 85 | Example 86 | Example 87 | Example 88 |
| Ink cured product | | (A) | (B) | (C) | (D) | (E) | (F) | (G) |
| Base resin | Type | Polyurethane Resin A | Polyurethane Resin A | Polyurethane Resin A | Polyurethane Resin A | Polyurethane Resin A | Polyurethane Resin A | Polyurethane Resin A |
| | Blended amount (parts by mass) | 100 | 100 | 100 | 100 | 100 | 100 | 100 |
| Pigment (TiO$_2$) | Blended amount (parts by mass) | 100 | 100 | 100 | 100 | 100 | 100 | 100 |
| Solvent | Blended amount (parts by mass) | 50 | 50 | 50 | 50 | 50 | 50 | 50 |
| Polyisocyanate composition | Type | (a) | (b) | (c) | (d) | (e) | (f) | (g) |
| | Blended amount (parts by mass) | 4.1 | 3.6 | 4.4 | 4.6 | 4.5 | 3.7 | 3.7 |
| Evluation | Surface tackiness | Excellent | Excellent | Excellent | Excellent | Excellent | Excellent | Excellent |
| | Adherence | 0 | 0 | 0 | 0 | 0 | 0 | 0 |
| | Weather resistance | 1 | 1 | 1 | 0 | 0 | 0 | 1 |
| | Moisture resistance | 1 | 1 | 1 | 0 | 0 | 0 | 1 |

| | | Example No. | | | | | | |
|---|---|---|---|---|---|---|---|---|
| | | Example 89 | Example 90 | Example 91 | Example 92 | Example 93 | Example 94 | Example 95 |
| Ink cured product | | (H) | (I) | (J) | (K) | (L) | (M) | (N) |
| Base resin | Type | Polyurethane Resin A | Polyurethane Resin A | Polyurethane Resin A | Polyurethane Resin A | Polyurethane Resin A | Polyurethane Resin B | Polyurethane Resin B |
| | Blended amount (parts by mass) | 100 | 100 | 100 | 100 | 100 | 100 | 100 |
| Pigment (TiO$_2$) | Blended amount (parts by mass) | 100 | 100 | 100 | 100 | 100 | 100 | 100 |

TABLE 8-continued

| Solvent | Blended amount (parts by mass) | 50 | 50 | 50 | 50 | 50 | 50 | 50 |
|---|---|---|---|---|---|---|---|---|
| Polyisocyanate composition | Type | (h) | (i) | (j) | (k) | (l) | (a) | (d) |
| | Blended amount (parts by mass) | 4.4 | 4.5 | 4.6 | 4.7 | 4.5 | 4.1 | 4.6 |
| Evlauation | Surface tackiness | Excellent | Excellent | Excellent | Excellent | Excellent | Excellent | Excellent |
| | Adherence | 0 | 0 | 0 | 0 | 0 | 0 | 0 |
| | Weather resistance | 1 | 0 | 0 | 1 | 0 | 1 | 0 |
| | Moisture resistance | 0 | 0 | 0 | 0 | 0 | 0 | 0 |

| | | Comparative Example No. | | |
|---|---|---|---|---|
| | | Comparative Example 17 | Comparative Example 18 | Comparative Example 19 |
| Ink cured product | | (O) | (P) | (Q) |
| Base resin | Type | Polyurethane Resin A | Polyurethane Resin A | Polyurethane Resin A |
| | Blended amount (parts by mass) | 100 | 100 | 100 |
| Pigment (TiO$_2$) | Blended amount (parts by mass) | 100 | 100 | 100 |
| Solvent | Blended amount (parts by mass) | 50 | 50 | 50 |
| Polyisocyanate composition | Type | (m) | (n) | D-170 |
| | Blended amount (parts by mass) | 3.5 | 5.0 | 2.2 |
| Evlauation | Surface tackiness | Good | Excellent | Good |
| | Adherence | 0 | 0 | 0 |
| | Weather resistance | 3 | 2 | 3 |
| | Moisture resistance | 2 | 2 | 3 |

While the illustrative embodiments of the present invention are provided in the above description, such is for illustrative purpose only and it is not to be construed as limiting in any manner. Modification and variation of the present invention that will be obvious to those skilled in the art is to be covered by the following claims.

INDUSTRIAL APPLICABILITY

A polyisocyanate composition of the present invention can be used for a material of polyurethane resins and polyurea resins, which are used in a wide variety of applications, including covering materials (e.g., solar cell member covering materials, etc.), microcapsules, binders (e.g., binder for inks, etc.), furthermore, elastomers (solvent-based resins, aqueous resins, powders, thermosetting elastomers, thermoplastic elastomers, spray molding resins, elastic fiber, films, sheets, etc.), lens (lens for glasses), artificial and synthetic leather, slush powders, elastic molds (spandex), RIM products, paints, adhesives, sealing materials, and foams.

DESCRIPTION OF REFERENCE NUMERALS

1 Layer-covered solar cell member
2 Member
3 Cover layer

The invention claimed is:

1. A polyisocyanate composition produced by reaction of bis(isocyanatomethyl) cyclohexane with trimethylolpropane, and having an isocyanate croup at its molecular terminal,
wherein the polyisocyanate composition comprises a trimethylolpropane-monomolecular-body obtained by reaction of three molecules of bis(isocyanatomethyl) cyclohexane with one molecule of trimethylolpropane, and
a trimethylolpropane-bimolecular-body obtained by reaction of five molecules of bis(isocyanatomethyl) cyclohexane with two molecules of trimethylolpropane;
the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less, and
wherein, in reaction of bis(isocyanatomethyl) cyclohexane with trimethylolpropane, a molar ratio of bis(isocyanatomethyl) cyclohexane relative to trimethylolpropane (bis(isocyanatomethyl) cyclohexane/trimethylolpropane) in total is 4 or more and 23 or less.

2. The polyisocyanate composition according to claim 1, wherein the bis(isocyanatomethyl) cyclohexane has a 1,4-bis(isocyanatomethyl) cyclohexane content of 5 mol % or more.

3. The polyisocyanate composition according to claim 2, wherein the 1,4-bis(isocyanatomethyl) cyclohexane contains 80 mol % or more and 93 mol % or less of trans 1,4-bis(isocyanatomethyl) cyclohexane.

4. The polyisocyanate composition according to claim 1, wherein an average number of the isocyanate groups is 3 or more and 4.5 or less.

5. The polyisocyanate composition according to claim 1, used as a curing agent for a covering material of a solar cell member.

6. A polyisocyanate composition produced by reaction of bis(isocyanatomethyl) cyclohexane with trimethylolpropane, and having an isocyanate group at its molecular terminal,
wherein the polyisocyanate composition comprises a trimethylolpropane-monomolecular-body obtained by reaction of three molecules of bis(isocyanatomethyl) cyclohexane with one molecule of trimethylolpropane, and
a trimethylolpropane-bimolecular-body obtained by reaction of five molecules of bis(isocyanatomethyl) cyclohexane with two molecules of trimethylolpropane;

the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less, and a molar ratio of the bis(isocyanatomethyl) cyclohexane relative to the trimethylolpropane (bis(isocyanatomethyl) cyclohexane/trimethylolpropane) is 4 or more and 23 or less.

7. A polyisocyanate composition produced by reaction of bis(isocyanatomethyl) cyclohexane with trimethylolpropane, and having an isocyanate group at its molecular terminal, wherein the polyisocyanate composition comprises a trimethylolpropane-monomolecular-body obtained by reaction of three molecules of bis(isocyanatomethyl) cyclohexane with one molecule of trimethylolpropane, and a trimethylolpropane-bimolecular-body obtained by reaction of five molecules of bis(isocyanatomethyl) cyclohexane with two molecules of trimethylolpropane;

the molar ratio of trimethylolpropane-monomolecular-body relative to trimethylolpropane-bimolecular-body (trimethylolpropane-monomolecular-body/trimethylolpropane-bimolecular-body) contained in the polyisocyanate composition is 1.5 or more and 4.5 or less, wherein the polyisocyanate composition comprises bis(isocyanatomethyl) cyclohexane unit and trimethylolpropane unit, and a molar ratio of the bis(isocyanatomethyl) cyclohexane unit relative to the trimethylolpropane unit is 4 or more and 23 or less.

\* \* \* \* \*